US008339445B2

(12) United States Patent
Yoro et al.

(10) Patent No.: US 8,339,445 B2
(45) Date of Patent: Dec. 25, 2012

(54) COMPONENT PLACING APPARATUS

(75) Inventors: Shinya Yoro, Shizuoka (JP); Kazuhiro Kobayashi, Shizuoka (JP); Yasuhiro Suzuki, Shizuoka (JP); Yasunori Naitoh, Shizuoka (JP); Yasuyoshi Hongashi, Shizuoka (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 466 days.

(21) Appl. No.: 12/666,853

(22) PCT Filed: May 15, 2008

(86) PCT No.: PCT/JP2008/058957
§ 371 (c)(1),
(2), (4) Date: Dec. 28, 2009

(87) PCT Pub. No.: WO2009/001627
PCT Pub. Date: Dec. 31, 2008

(65) Prior Publication Data
US 2010/0220183 A1 Sep. 2, 2010

(30) Foreign Application Priority Data

Jun. 28, 2007 (JP) ................................. 2007-170175
Jun. 28, 2007 (JP) ................................. 2007-170363
Jun. 28, 2007 (JP) ................................. 2007-170364

(51) Int. Cl.
H01L 21/68 (2006.01)
H01L 21/00 (2006.01)
(52) U.S. Cl. ............................. 348/77; 348/79; 414/806
(58) Field of Classification Search .................... 348/77, 348/79; 414/806
See application file for complete search history.

(56) References Cited

U.S. PATENT DOCUMENTS 6,792,676 B2 * 9/2004 Haji et al. ........................ 29/832
(Continued)

FOREIGN PATENT DOCUMENTS

JP 07-263517 A 10/1995
JP 2003-059955 A 2/2003
(Continued)

OTHER PUBLICATIONS

International Search Report; PCT/JP2008/058957; Aug. 5, 2008.

Primary Examiner — Khanh Dinh
(74) Attorney, Agent, or Firm — Studebaker & Brackett PC; Donald R. Studebaker

(57) ABSTRACT

[Problems]
To provide a component placing apparatus capable of effectively preventing the occurrence of a suction error by appropriately adjusting a displacement between respective coordinate systems of a placing head and imaging device while efficiently performing suction position recognition using the imaging device that is movable independently of the placing head.
[Means for Solving the Problems]
A component mounting apparatus (1) includes a placing head (4) that transports a chip component (6) supplied from a component supply portion (5) by sucking the chip component (6), and a suction position recognition camera (32) that is provided to be movable independently of the placing head (4) and takes an image of the chip component (6) before the placing head (4) sucks the chip component (6) from the component supply portion (5). A control unit (40) that controls an operation of the component mounting apparatus (1) checks a correlation of the respective coordinate systems of the placing head (4) and the suction position recognition camera (32) at predetermined timing and corrects an amount of movement when the placing head (4) accesses the chip component (6) in the component supply portion (5) on the basis of this correlation.

15 Claims, 32 Drawing Sheets

| U.S. PATENT DOCUMENTS | | | |
|---|---|---|---|
| 6,910,262 B2 * | 6/2005 | Shimizu | 29/743 |
| 6,941,646 B2 * | 9/2005 | Suhara | 29/740 |
| 2002/0031279 A1 * | 3/2002 | Shimizu | 382/291 |
| 2002/0083579 A1 * | 7/2002 | Suhara et al. | 29/739 |
| 2003/0029032 A1 | 2/2003 | Haji et al. | |

| FOREIGN PATENT DOCUMENTS | | |
|---|---|---|
| JP | 2003-109979 A | 4/2003 |
| JP | 2005-277273 A | 10/2005 |
| JP | 2007-012914 A | 1/2007 |

* cited by examiner

FIG.13A
FIG.13B
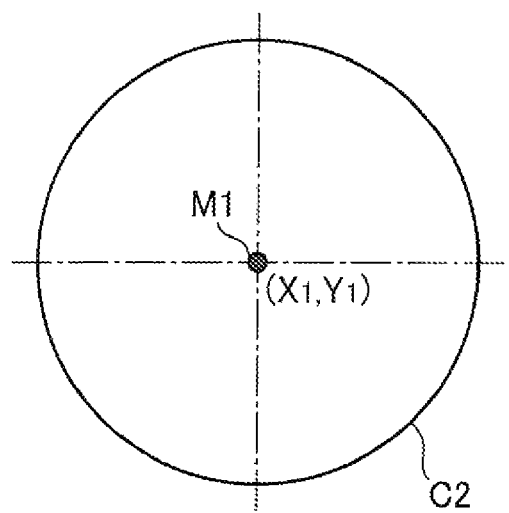
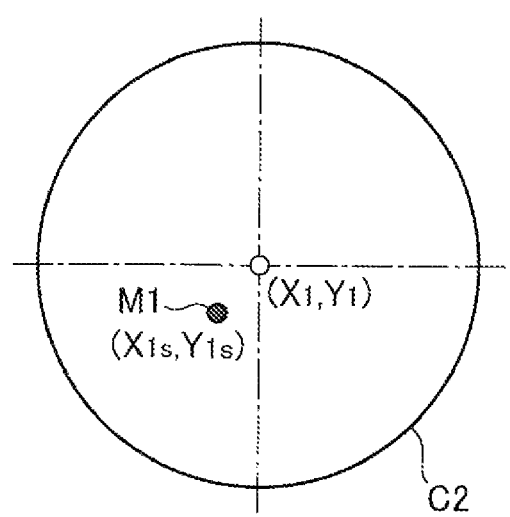

COMPONENT PLACING APPARATUS

TECHNICAL FIELD

The present invention relates to a component placing apparatus that transports a component, supplied from a component supply portion, by sucking the component using a movable placing head and places the component onto a placement portion spaced apart by a predetermined distance.

BACKGROUND ART

Conventionally, as is described, for example, in JP-A-2003-59955, a component mounting apparatus that extracts a chip component from a semiconductor wafer held by a wafer holding portion and transports the chip component using a movable placing head furnished with a plurality of suction nozzles so as to mount the chip component on a substrate spaced apart by a predetermined distance is provided with imaging device that is movable independently of the placing head and an image of a chip component to be extracted next by the placing head is taken by using the imaging device.

According to the component mounting apparatus described in the patent document cited above, by providing the imaging device that is movable independently of the placing head used for component transportation, it becomes possible to recognize a chip component to be sucked next in parallel with an operation to transport a chip component by the placing head. The production efficiency of substrates can be thus enhanced by making a takt time shorter.

Incidentally, in a case where the position of a component to be sucked is recognized by the imaging device that is movable independently of the placing head as described in the patent document cited above, a relative displacement may possibly occur between the coordinate systems of the placing head and the imaging device. When such a displacement occurs between the coordinate systems, because the position of a chip component in the wafer holding portion is recognized by the imaging device, it becomes impossible to understand the exact relative position of the chip component with respect to the placing head, which gives rise a problem in an operation to suck components by the placing head. With the technique in the patent document cited above, however, no countermeasure is taken against such a problem. It is therefore impossible to effectively prevent the occurrence of a component suction error resulting from a displacement between the coordinate systems as described above.

The same can be said for a component placing apparatus of other types, such as a component testing apparatus that transports a component supplied from the component supply portion and attaches the component to an inspection socket for examination using the placing head.

The invention was devised in view of the foregoing, and has an object to provide a component placing apparatus capable of effectively preventing the occurrence of a component suction error by appropriately adjusting a displacement between the respective coordinate systems of a placing head and a imaging device while efficiently performing suction position recognition using the imaging device that is movable independently of the placing head.

DISCLOSURE OF THE INVENTION

The technical problems described above can be solved by a component placing apparatus of the invention having the following configurations.

More specifically, the invention provides a component placing apparatus configured to transport a component, supplied from a component supply portion, by sucking the component using a movable placing head and to place the component onto a placement portion spaced apart by a predetermined distance, characterized by including: a suction position imaging device provided to be movable independently of the placing head for taking an image of the component before the placing head sucks the component from the component supply portion; and a controller for systematically controlling operations of the placing head and the suction position imaging device and for moving the placing head to a position of the component during the component suction on the basis of imaging data of the component obtained in advance through imaging by the suction position imaging device, wherein the controller checks a correlation of respective coordinate systems of the placing head and the suction position imaging device at predetermined timing and corrects an amount of movement when the placing head accesses the component in the component supply portion on the basis of the correlation.

BRIEF DESCRIPTION OF THE DRAWINGS

FIG. 13 is a view used to describe a case where one position recognition mark is recognized by the suction position recognition camera, FIG. 13A showing a state at the reference temperature and FIG. 13B showing a state during the warm time.

BEST MODE FOR CARRYING OUT THE INVENTION

First Embodiment

Figure 1:
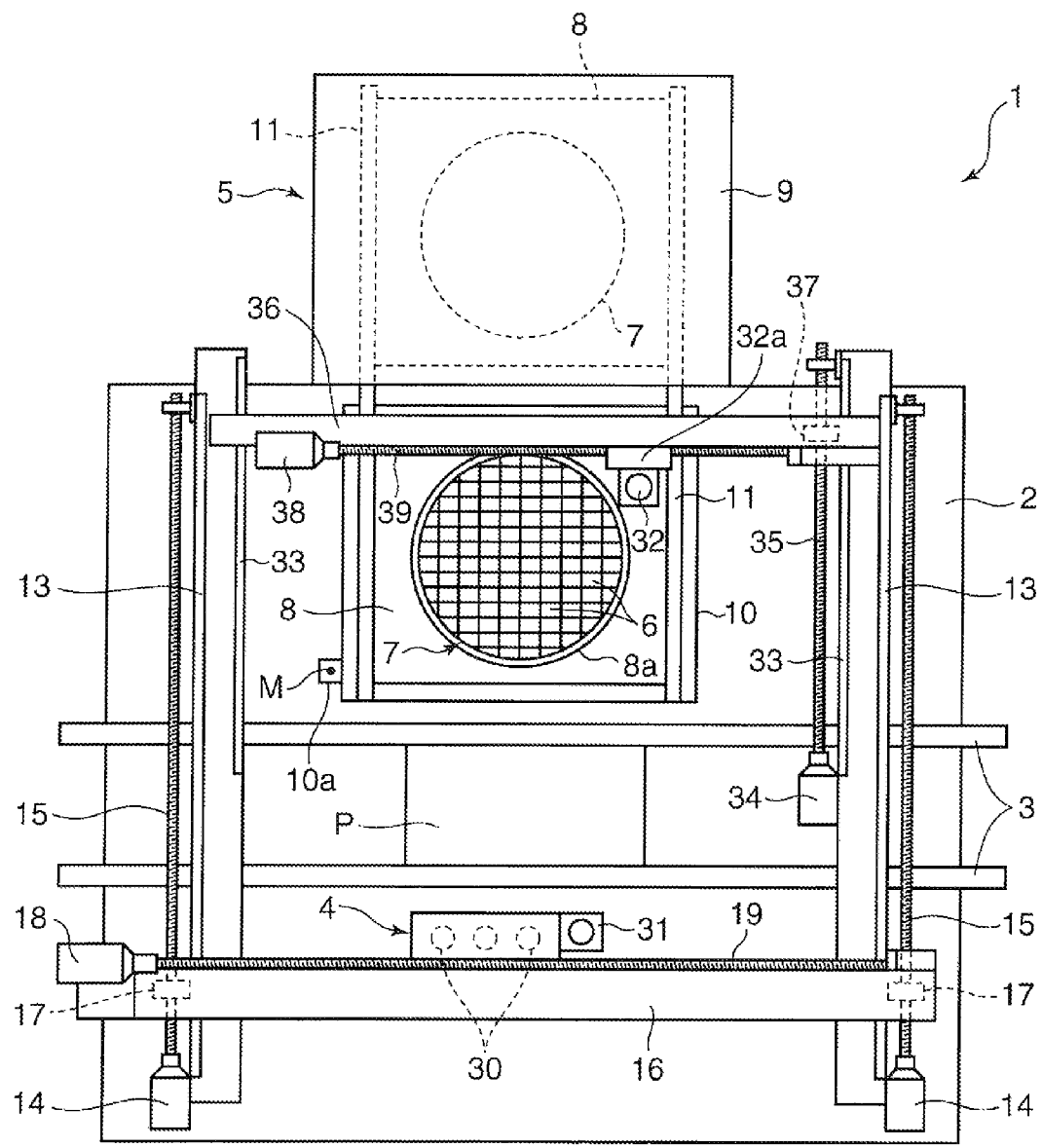
FIG. 1 is a plan view schematically showing a component mounting apparatus according to a first embodiment of the invention.
Figure 1:
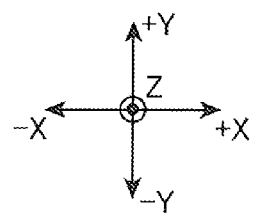

FIG. 1 is a plan view schematically showing a component mounting apparatus 1 according to a first embodiment of the invention. The component mounting apparatus 1 shown in the drawing includes a base stand 2, a conveyor 3 that is provided on the base stand 2 and forms a transportation line for a substrate P, a component supply portion 5 that supplies a wafer 7 as an aggregate of many chip components 6, 6, and so on, and a placing head 4 that sucks and transports the chip components 6 supplied from the component supply portion 5 to mount the chip components 6 on the substrate P.

The conveyor 3 is provided to extend in the X axis direction (the transportation direction of the substrate P) on the base stand 2 and it is configured in such a manner that the conveyor 3 transports the substrate P from upstream (−X side) and holds the substrate P at a predetermined mounting work position (the position shown in the drawing) until the mounting work for the substrate P ends, after which it carries out the substrate P downstream (+X side) of the mounting work position. It should be noted that the conveyor 3 is provided with an unillustrated clamp mechanism or the like to hold the substrate P at the mounting work position. In this embodiment, the substrate P placed at the mounting work position corresponds to the placement portion of the invention (that is, the transportation destination of the chip components 6 extracted from the component supply portion 5).

The component supply portion 5 is formed as a wafer feeder that supplies the wafer 7 formed of a disk-shaped silicon wafer in a state where a wafer holding frame 8 (corresponding to the wafer holding device of the invention) holds an aggregate of many chip components 6, 6, and so on (bare chips) formed by dicing the wafer 7 in a grid. To be more concrete, the component supply portion 5 includes a wafer accommodation elevator 9 that accommodates the wafer 7 in vertical multiple stages in a state where it is held by the wafer holding frame 8, a wafer stage 10 that is positioned in front (−Y side) of the wafer accommodation elevator 9 and provided on the base stand 2, and a pull-out unit formed of a conveyor 11 or the like that pulls out the wafer holding frame 8 onto the wafer stage 10 from the wafer accommodation elevator 9. The wafer holding frame 8 is provided with a circular opening portion and the wafer 7 is laminated and held on the top surface of a sheet-like wafer sheet 8a provided so as to cover this opening portion.

The placing head 4 is supported in a movable manner in the X axis direction and the Y axis direction and it is configured in such a manner that the placing head 4 is allowed to move freely above the wafer 7 placed in position on the wafer stage 10 of the component supply portion 5 and above the substrate P held at the mounting work position.

More specifically, on the base stand 2 are provided a pair of fixed rails 13 extending in the Y axis direction and ball screw shafts 15 driven to rotate by first Y axis servo motors 14. A supporting frame 16 that supports the placing head 4 is supported along the fixed rails 13 in a movable manner in the Y axis direction and nut portions 17 provided inside the supporting frame 16 is threaded into the corresponding ball screw shafts 15. The supporting frame 16 is provided with an unillustrated guide member extending in the X axis direction and a ball screw shaft 19 driven to rotate by a first X axis servo motor 18. The placing head 4 is supported along the guide member in a movable manner in the X axis direction and an unillustrated nut portion provided inside the placing head 4 is threaded into the ball screw shaft 19. It is configured in such a manner that the supporting frame 16 together with the placing head 4 moves in the Y axis direction when the ball screw shafts 15 are driven to rotate by actuating the first Y axis servo motors 14 and the placing head 4 moves in the X axis direction with respect to the supporting frame 16 when the ball screw shaft 19 is driven to rotate by actuating the first X axis servo motor 18.

Figure 2:
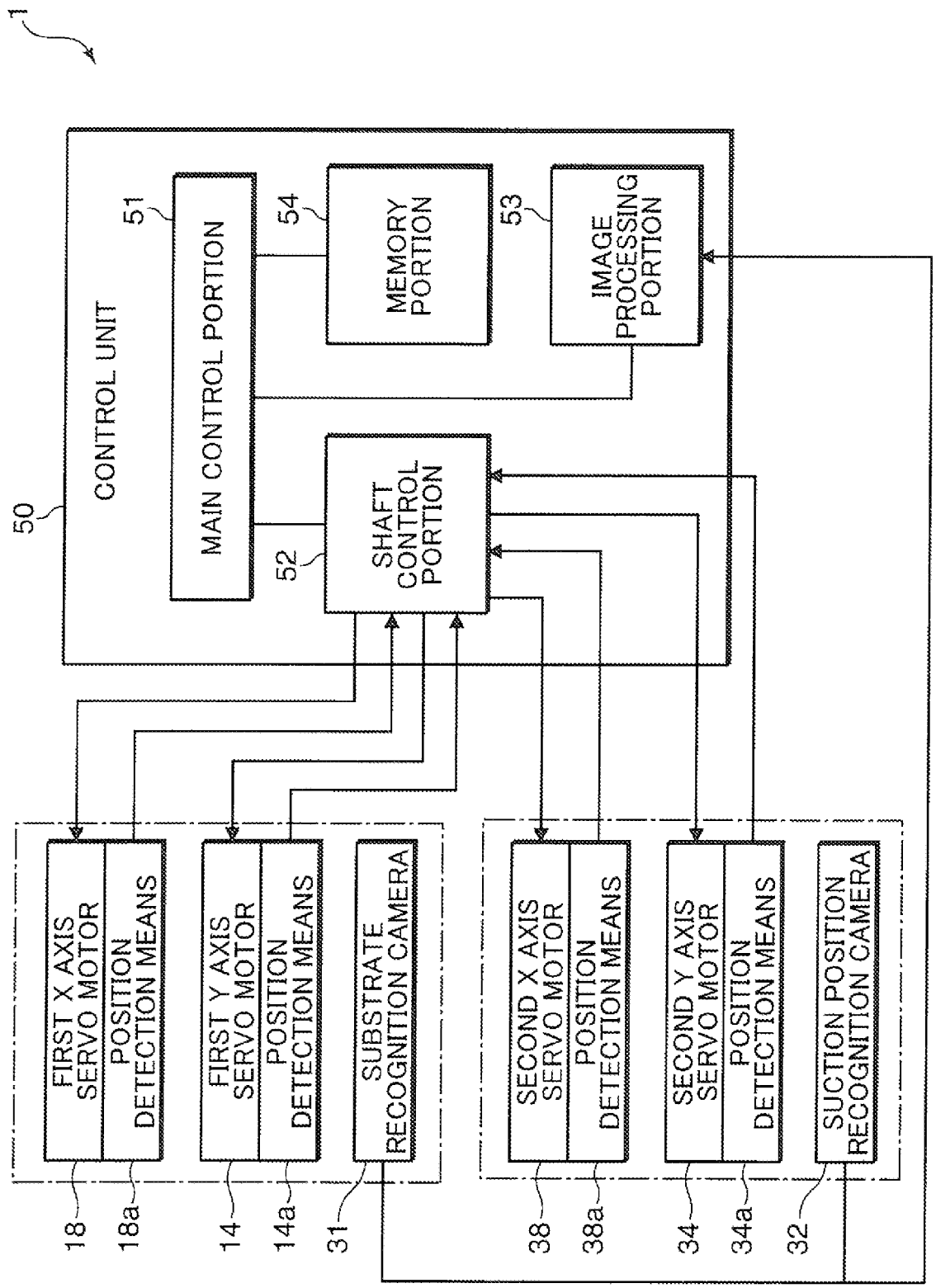
FIG. 2 is a block diagram showing a control system of the component mounting apparatus.

As is shown in the block diagram of FIG. 2, position detection means 18a and 14a formed of an encoder or the like are provided to the first X axis servo motor 18 and the first Y axis servo motors 14, respectively. The logical position of the placing head 4 is recognized on the basis of the detection values of the respective means 18a and 14a.

As is shown in FIG. 1, the placing head 4 has a plurality of nozzle units 30 (three in the example shown in the drawing) that suck individual chip components 6 from the wafer 7 on the wafer stage 10. Each nozzle unit 30 has a hollow nozzle member (not shown) at the lower end. A negative pressure is supplied to the tip end of each nozzle member from unillustrated negative pressure supply means formed of a vacuum pump or the like during component suction, so that the chip components 6 are sucked to the nozzle members by a suction force induced by the negative pressure.

Also, each nozzle unit 30 is attached to the main body portion of the placing head 4 in a movable manner in the top-bottom direction (Z axis direction) and in a rotatable manner about the nozzle center shaft (R axis). It is configured in such a manner that the nozzle unit 30 is driven in the respective directions by unillustrated Z axis servo motor and R axis servo motor.

To the placing head 4 configured as above is attached a substrate recognition camera 31 (corresponding to the head-side imaging device of the invention) that recognizes a fiducial mark (not shown) for position recognition put on the top surface of the substrate P. To be more concrete, it is configured in such a manner that the exact position of the substrate P is specified by moving the substrate recognition camera 31 together with the placing head 4 above the fiducial mark at predetermined timing after the substrate P is transported to the mounting work position by the conveyor 3 and by taking an image of the fiducial mark.

Meanwhile, a suction position recognition camera 32 (corresponding to the suction position imaging device of the invention) that specifies the exact position of the respective chip components 6 of the wafer 7 placed in position on the wafer stage 10 is provided above the component supply portion 5. The suction position recognition camera 32 is supported by the same mechanism as the placing head 4 in a movable manner in the respective directions of the X and Y axes.

More specifically, the suction position recognition camera 32 is supported on a supporting frame 36 movable along a pair of guide rails 33 extending in the Y axis direction via a camera attachment portion 32a. It is configured in such a manner that the suction position recognition camera 32 moves integrally with the supporting frame 36 in the Y axis direction when a ball screw shaft 35 threaded into a nut portion 37 provided inside the supporting frame 36 is driven to rotate by a second Y axis servomotor 34. Also, the supporting frame 36 is provided with a ball screw shaft 39 threaded into an unillustrated nut portion provided inside the camera attachment portion 32a. It is configured in such a manner that the suction position recognition camera 32 moves in the X axis direction when the ball screw shaft 39 is driven to rotate by a second X axis servomotor 38.

As is shown in the block diagram of FIG. 2, position detection means 38a and 34a formed of an encoder or the like are provided to the second X axis servo motor 38 and the second Y axis servo motor 34, respectively, as with the servo motors 18 and 14 for driving the placing head 4. The logical position of the suction position recognition camera 32 is recognized on the basis of the detection values of the respective means 38a and 34a.

As has been described, according to the component mounting apparatus 1 of this embodiment, the placing head 4 and the substrate recognition camera 31 attached integrally with the placing head 4 are driven on the X-Y plane by the drive mechanism formed of the first X axis servomotor 18, the first Y axis servo motors 14, the ball screw shafts 19 and 15, and so forth, while the suction position recognition camera 32 that takes an image of the chip components 6 in the component supply portion 5 is driven on the X-Y plane by the drive mechanism independent of the drive mechanism of the placing head 4 and formed of the second X axis servo motor 38, the second Y axis servo motor 34, the ball screw shafts 39 and 35, and so forth. The positions of the placing head 4 and the suction position recognition camera 32 on the X-Y plane are detected by the position detection means 18a, 14a, 38a, and 34a provided to the respective drive mechanisms.

It should be appreciated, however, that when the placing head 4 and the suction position recognition camera 32 are movable independently of each other, a relative displacement may possibly occur between the respective coordinate systems of the placing head 4 and the suction position recognition camera 32, that is, between the coordinate system on the basis of the detection values of the position detection means 18a and 14a provided to the drive mechanism for the placing head 4 and the coordinate system on the basis of the detection values of the position detection means 38a and 34a provided to the drive mechanism for the suction position recognition camera 32.

More specifically, even when an operation is made so as to bring the placing head 4 to the same coordinate position recognized by the suction position recognition camera 32, the logical coordinate of the placing head 4 on the basis of the detection values of the position detection means 14a and 18a and the logical coordinate of the suction position recognition camera 32 on the basis of the detection values of the position detection means 34a and 38a do not necessarily coincide with each other because of a detection error between the respective position detection means or for other reasons. This may possibly give rise to a displacement between the coordinate systems of the placing head 4 and the suction position recognition camera 32. When such a displacement occurs, it becomes impossible to understand the exact relative positions of the chip components 6 in the component supply portion 5 with respect to the placing head 4. Accordingly, there is a risk that a trouble occurs in an operating to suck the chip components 6 by the placing head 4.

Under these circumstances, the component mounting apparatus 1 of this embodiment is configured in such a manner that a displacement between the respective coordinate systems of the placing head 4 and the suction position recognition camera 32 is checked at predetermined timing set in advance and an amount of movement when the placing head 4 accesses the chip components 6 in the component supply portion 5 is corrected on the basis of the displacement between the coordinate systems. A position recognition mark M is put on the wafer stage 10 of the component supply portion 5 as the reference mark with which to check a displacement between the coordinate systems as described above. To be more concrete, a protrusion piece 10a is provided on the side edge portion of the wafer stage 10 and the position recognition mark M is put on the top surface of the protrusion piece 10a. Also, in this embodiment, assume that the position recognition mark M is put at the coordinate ($X_0$, $Y_0$) on the X-Y plane.

The control system of the component mounting apparatus 1 configured as above will now be described using the block diagram of FIG. 2.

The component mounting apparatus 1 incorporates a control unit 50 (corresponding to the controller of the invention) formed of a CPU, various memories, an HDD, and so forth. It is configured in such a manner that the respective servomotors 14, 18, 34, and 38, the substrate recognition camera 31, the suction position recognition camera 32, and so forth are electrically connected to the control unit 50, so that operations of the respective components are controlled systematically by the control unit 50.

The control unit 50 includes, as functional elements, a shaft control portion 52 that not only controls the driving of the respective servo motors 14, 18, 34, and 38 but also accepts detection signals transmitted from the position detection means 14a, 18a, 34a, and 38a attached to the respective motors, an image processing portion 53 that accepts imaging data transmitted from the substrate recognition camera 31 and the suction position recognition camera 32 and applies predetermined imaging processing on the imaging data, a memory portion 54 that stores various programs, such as a mounting program, and various types of data, and a main control portion 51 that not only systematically controls the respective portions 52 through 54 but also executes various types of arithmetic processing.

It is configured in such a manner that the control unit 50 controls the placing head 4 to execute a series of operations, such as suction and transportation of the chip components 6, and controls the substrate recognition camera 31 to take an image of the substrate P and the suction position recognition camera 32 to take an image of the chip component 6 before or during a series of the operations by controlling the driving of the respective servomotors 14, 18, 34, and 38 and imaging operations by the substrate recognition camera 31 and the suction position recognition camera 32 according to the pre-determined mounting program.

In order to check a displacement between the respective coordinate systems of the placing head 4 and the suction position recognition camera 32 at predetermined timing, for example, at the start-up of the component mounting apparatus 1 or when the number of produced substrates P has reached a predetermined number, it is configured in such a manner that the control unit 50 moves the substrate recognition camera 31 and the suction position recognition camera 32 above the position recognition mark M put on the wafer stage 10 of the component supply portion 5 for the respective cameras 31 and 32 to take images of the position recognition mark M. It is also configured in such a manner that an amount of movement when the placing head 4 accesses the chip components 6 in the component supply portion 5 is corrected on the basis of a displacement between the respective coordinate systems of the placing head 4 and the suction position recognition camera 32 obtained from the imaging data of the position recognition mark M.

A concrete content of the mounting operation performed by the component mounting apparatus 1 under the control of the control unit 50 as above will now be described with reference to the flowcharts of FIG. 3 and FIG. 4.

Figure 3:
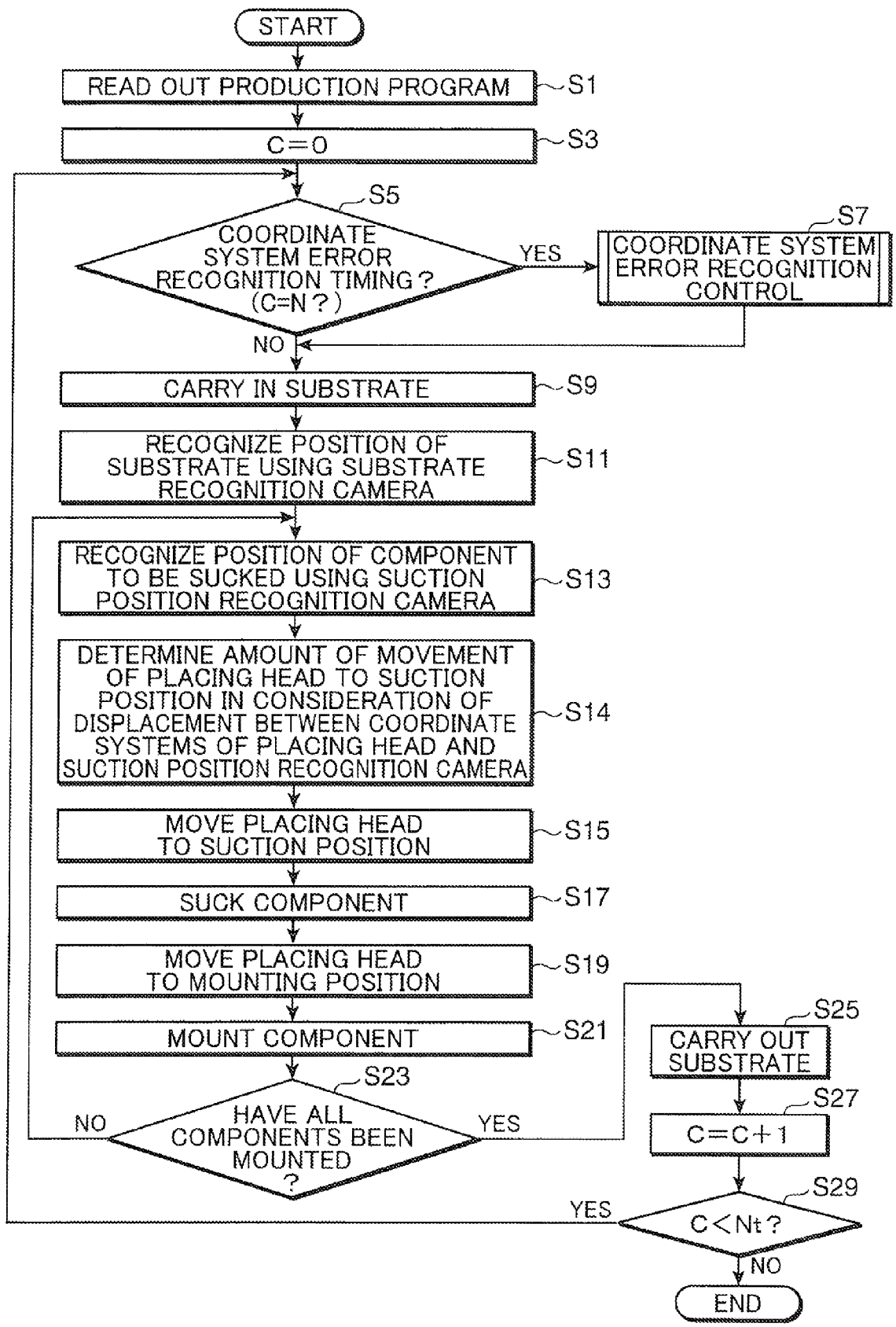
FIG. 3 is a flowchart depicting a content of a control operation performed in the component mounting apparatus.

As is shown in FIG. 3, when the mounting on the substrate P is started, the control unit 50 executes control to read out an appropriate production program from the memory portion 54 (Step S1) and to reset the count value C (C=0) of a counter that stores the number of produced substrates P (Step S3).

Subsequently, the control unit 50 determines whether the current time point is the timing (coordinate system error recognition timing) at which coordinate system error recognition control executed in Step S7 described below should be executed (Step S5). To be more concrete, in the flowchart of FIG. 3, when the number of produced substrates P has reached the predetermined number N, it is determined that the current time point falls on the coordinate system error recognition timing. It is preferable that a plurality of values at intervals of a certain number are set as the predetermined number N, for example, N=n×100 (n=1, 2, and so on). It should be appreciated, however, that the coordinate system error recognition timing is not necessarily set according to the number of produced substrates P as above. For example, other suitable timings, such as the start-up of the component mounting apparatus 1, can be set as the coordinate system error recognition timing.

In a case where the determination result in Step S5 is YES and it is confirmed that the current time point falls on the coordinate system error recognition timing, the control unit 50 proceeds to following Step S7 and executes the coordinate system error recognition control by which a displacement between the respective coordinate systems of the placing head 4 and the suction position recognition camera 32 is recognized.

Figure 4:
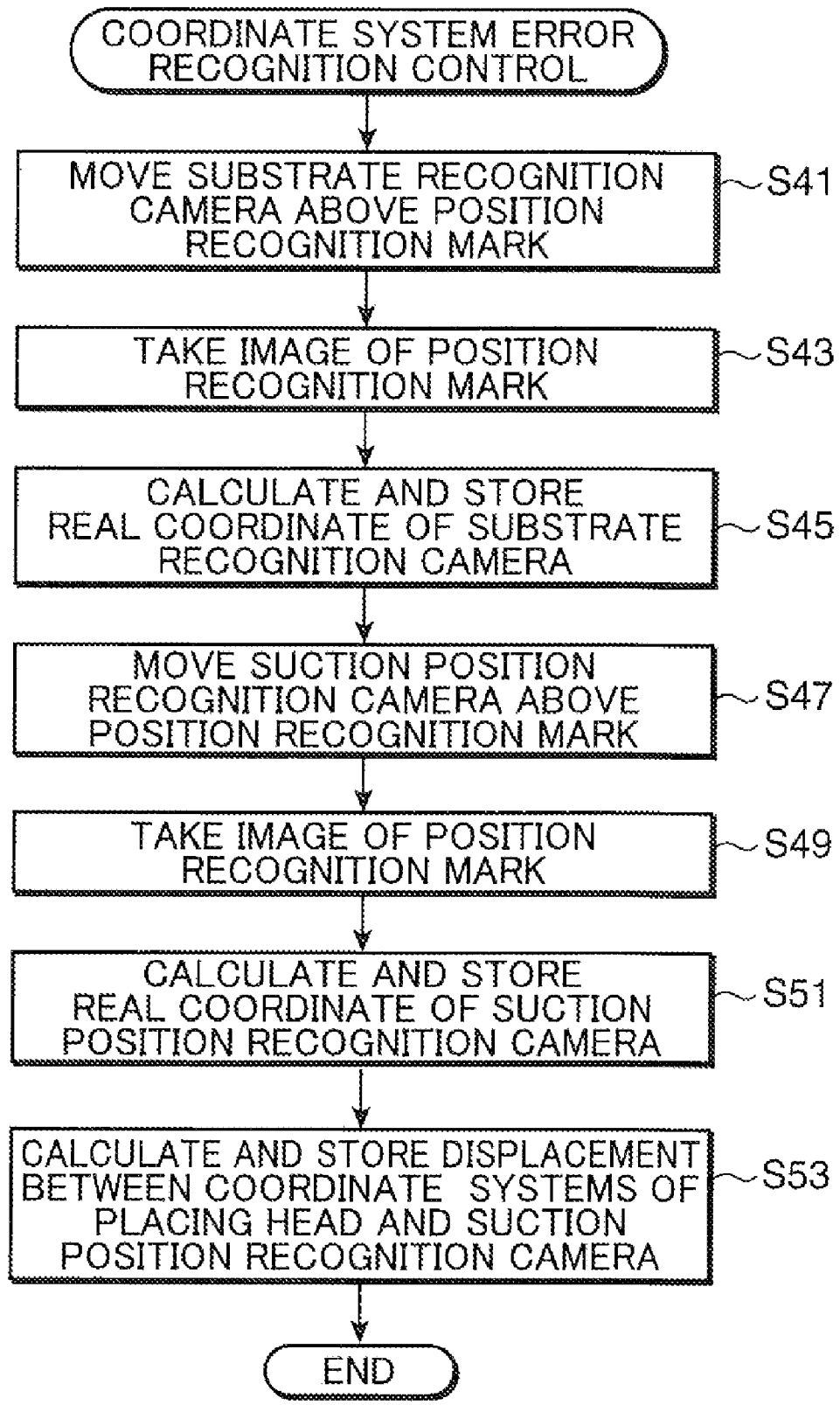
FIG. 4 is a sub-routine depicting a concrete content of coordinate system error recognition control performed in the flowchart of FIG. 3.

FIG. 4 is a sub-routine showing the concrete content of the coordinate system error recognition control. When this sub-routine is started, the control unit 50 initially executes control to move the substrate recognition camera 31 above the position recognition mark M put on the wafer stage 10 of the component supply portion 5 (Step S41). To be more concrete, the control unit 50 drives the substrate recognition camera 31 together with the placing head 4 in the respective directions of the X and Y axes by actuating the first X axis servo motor 18 and the first Y axis servo motors 14 and also moves the substrate recognition camera 31 in such a manner that an amount of movement of the substrate recognition camera 31 detected by the position detection means 18a and 14a provided to the servo motors 18 and 14, respectively, coincides with the target amount of movement according to the pre-stored position data of the position recognition mark M.

Figure 5:
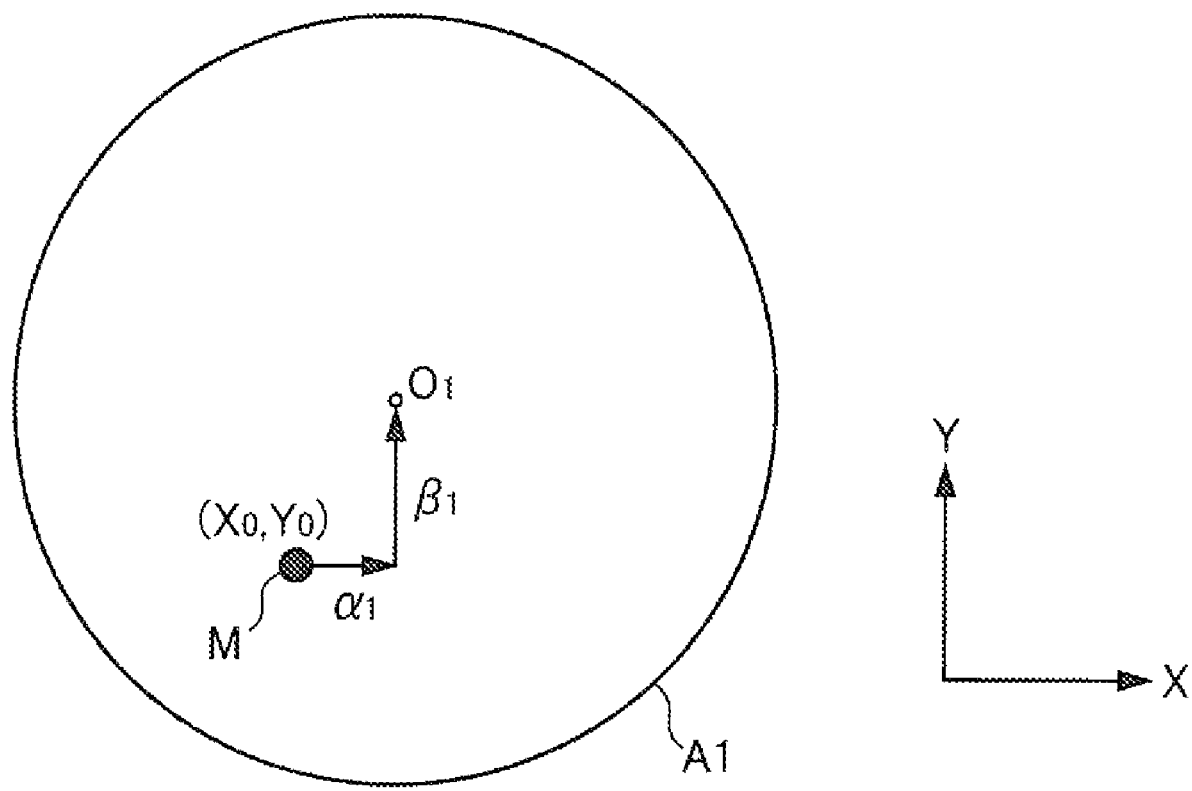
FIG. 5 is a view used to describe the procedure to find a real coordinate of a substrate recognition camera.

Subsequently, the control unit 50 executes control to make the substrate recognition camera 31 take an image of the position recognition mark M (Step S43) and to calculate the actual coordinate (real coordinate) of the substrate camera 31 from the imaging data of the position recognition mark M so as to store the calculated actual coordinate into the memory portion 54 (Step S45). For example, as is shown in FIG. 5, given that A1 is the imaging field of view of the substrate recognition camera 31, $O_1$ is the center point of the imaging field of view A1 (in this embodiment, assume that the center point $O_1$ coincides with the real coordinate of the substrate recognition camera 31), and $(X_0, Y_0)$ is the coordinate (known) of the position recognition mark M on the X-Y plane, then, as is shown in the drawing, $(+\alpha_1, +\beta_1)$ is a coordinate error from the position recognition mark M to the center point $O_1$ in the X and Y directions. Hence, the real coordinate of the substrate recognition camera 31 is calculated by adding the error to the coordinate of the position recognition mark M, $(X_0+\alpha_1, Y_0+\beta_1)$.

When the processing to check the real coordinate of the substrate recognition camera 31 in reference to the position recognition mark M is completed in this manner, the control unit 50 subsequently executes control to move the suction position recognition camera 32 above the position recognition mark M in the same manner as above in order to perform the same processing as above with the suction position recognition camera 32 (Step S47). To be more concrete, the control unit 50 drives the suction position recognition camera 32 in the respective directions of the X and Y axes by actuating the second X axis servo motor 38 and the second Y axis servo motor 34 and moves the suction position recognition camera 32 in such a manner that an amount of movement of the suction position recognition camera 32 detected by the position detection means 38a and 34a provided to the servo motor 38 and 34, respectively, coincides with the target amount of movement according to the pre-stored position data of the position recognition mark M. In order to prevent the suction position recognition camera 32 from interfering with the substrate recognition camera 31 that has moved to the position recognition mark M earlier, the control unit 50 evacuates the substrate recognition camera 31 together with the placing head 4 to a site spaced apart from the mark M by a predetermined distance.

Figure 6:
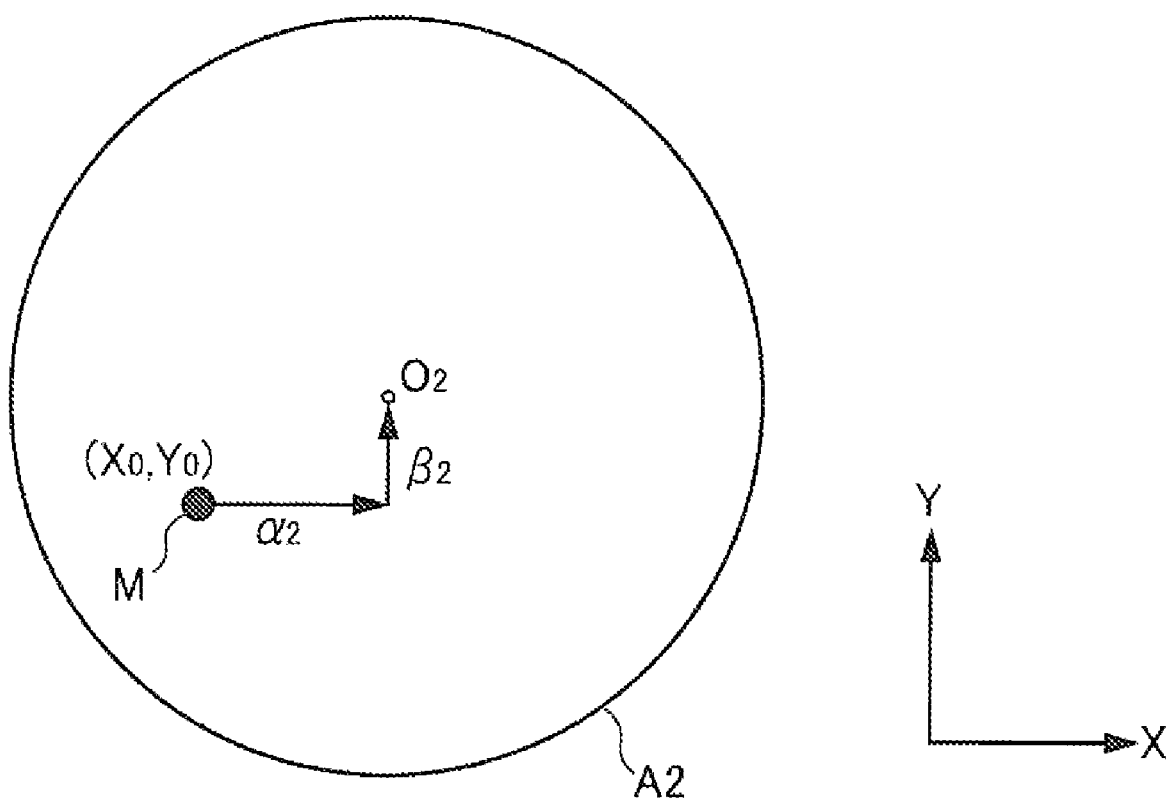
FIG. 6 is a view used to describe the procedure to find a real coordinate of a suction position recognition camera.

Subsequently, the control unit 50 executes control to make the suction position recognition camera 32 take an image of the position recognition mark M (Step S49) and to calculate the real coordinate of the suction position recognition camera 32 from the imaging data of the position recognition mark M so as to store the calculated real coordinate into the memory portion 54 (Step S51). For example, as is shown in FIG. 6, given that A2 is the imaging field of view of the suction position recognition camera 32, $O_2$ is the center point of the imaging field of view A2 (herein, assume that the center point $O_2$ coincides with the real coordinate of the suction position recognition camera 32), and $(X_0, Y_0)$ is the coordinate (known) of the position recognition mark M on the X-Y plane, then, as is shown in the drawing, $(+\alpha_2, +\beta_2)$ is the coordinate error from the position recognition mark M to the center point $O_2$ in the X and Y directions. Hence, the real coordinate of the suction position recognition camera 32 is calculated by adding the error to the coordinate of the position recognition mark M, $(X_0+\alpha_2, Y_0+\beta_2)$.

Figure 7:
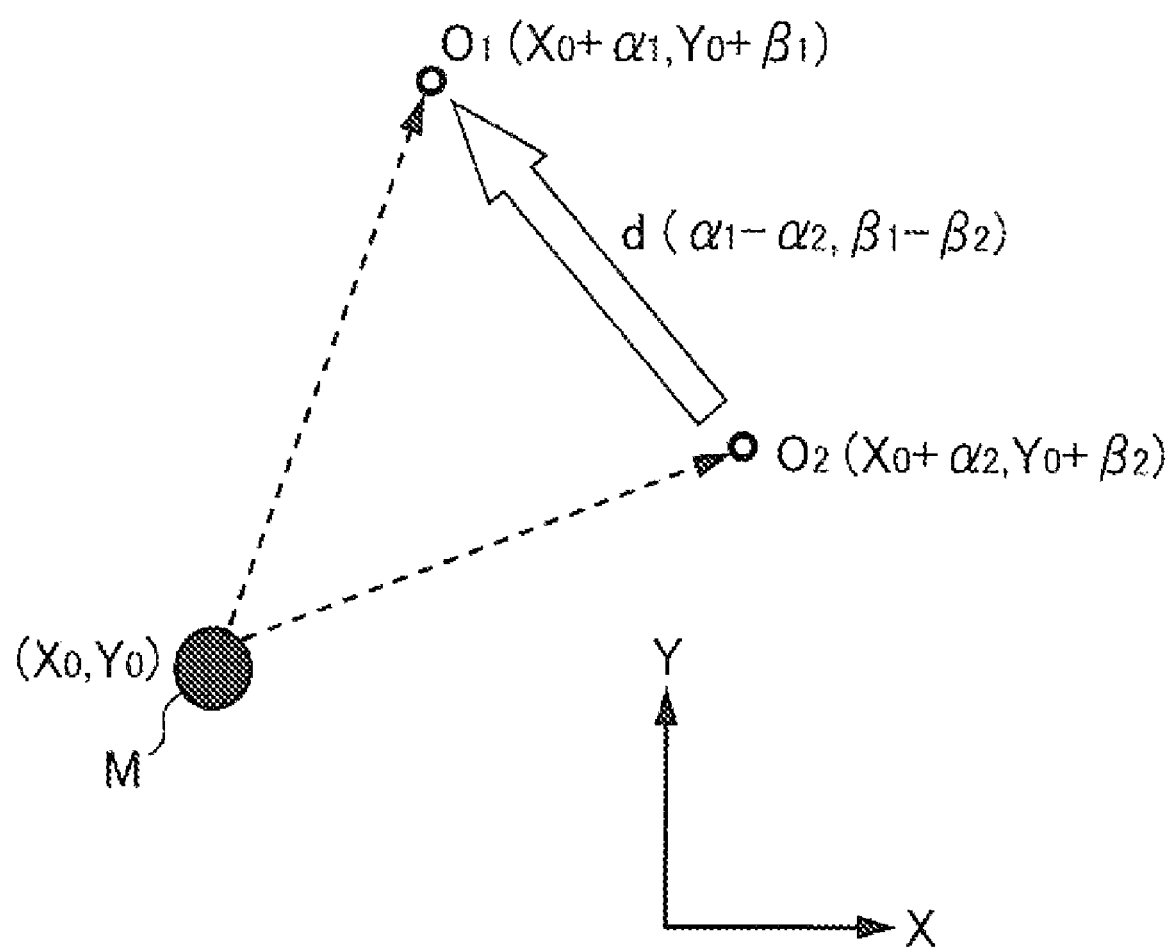
FIG. 7 is a view used to describe the procedure to find a displacement between respective coordinate systems of a placing head and the suction position recognition camera.

When the processing to check the real coordinate of each of the substrate recognition camera 31 and the suction position recognition camera 32 is completed as above, the control unit 50 executes control to calculate a displacement between the respective coordinate systems of the placing head 4 and the suction position recognition camera 32 and to store the calculated displacement into the memory portion 54 (Step S53). To be more concrete, as is shown in FIG. 7, the control unit 50 calculates a displacement vector $d(\alpha_1-\alpha_2, \beta_1-\beta_2)$ from the real coordinate $O_2$ $(X_0+\alpha_2, Y_0+\beta_2)$ of the suction position recognition camera 32 found in Step S51 to the real coordinate $O_1(X_0+\alpha_1, Y_0+\beta_1)$ of the substrate recognition camera 31 found in Step S45 and stores this displacement vector d as the displacement between the respective coordinate systems of the placing head 4 and the suction position recognition camera 32. In other words, when the displacement vector d from the real coordinate $O_2$ of the suction position recognition camera 32 to the real coordinate $O_1$ of the substrate recognition camera 31 is found, the displacement between the coordinate systems of the respective cameras 31 and 32 is calculated directly. However, because the displacement between the coordinate systems of the respective cameras 31 and 32 is the same as the displacement between the coordinate systems of the placing head 4 that moves integrally with the substrate recognition camera 31 and the suction position recognition camera 32, it is possible to calculate the displacement between the respective coordinate systems of the placing head 4 and the suction position recognition camera 32 by finding the displacement vector d.

Descriptions will continue with reference to the main flow of FIG. 3 again. In a case where the determination result in Step S5 is NO and it is confirmed that the current time point is not the coordinate system error recognition timing or in a case where the determination result in Step S5 is YES and the coordinate system error confirmation control in following Step S7 is completed, the control unit 50 execute control to carry in the substrate P to the mounting work position shown in FIG. 1 by actuating the conveyor 3 (Step S9).

Subsequently, the control unit 50 executes control to recognize the position of the substrate P placed in position at the mounting work position by moving the substrate recognition camera 31 together with the placing head 4 above the substrate P and then taking an image of the fiducial mark for position recognition put on the top surface of the substrate P using the substrate recognition camera 31 (Step S11).

Subsequently, the control unit 50 executes control to recognize the position of a chip component 6 to be sucked among many chip components 6, 6, and so on contained in the wafer 7 on the wafer stage 10 by moving the suction position recognition camera 32 above the wafer stage 10 of the component supply portion 5 and taking an image of this chip component 6 using the suction position confirmation camera 32 (Step S13). In other words, in Step S13, an image of the chip component 6 to be sucked is taken by the suction position recognition camera 32 and the position of the chip component 6 specified on the basis of the imaging data is recognized as the movement target point of the placing head 4 that will suck this chip component 6.

When the position of the chip component 6 to be sucked is recognized in this manner, the control unit 50 executes control to determine an amount of movement necessary for the placing head 4 to move above the chip component 6 in consideration of the displacement between the respective coordinate systems of the placing head 4 and the suction position recognition camera 32 calculated in Step S53 (Step S14) and then to move the placing head 4 above the chip component 6 according to the determined amount of movement (Step S15).

More specifically, according to the component mounting apparatus 1 of this embodiment, the position of the chip component 6 is recognized by the suction position recognition camera 32 that is movable independently of the placing head 4 (and the substrate recognition camera 31). Accordingly, the nozzle units 30 of the placing head 4 may fail to reach exactly above the chip components 6 unless the placing head 4 is moved in consideration of the displacement between the respective coordinate systems of the placing head 4 and the suction position recognition camera 32. To avoid this inconvenience, when the placing head 4 is moved above the chip component 6, an amount of movement is determined in consideration of a displacement between the coordinate systems as above. To be more concrete, the coordinate of the chip component 6 recognized by the suction position recognition camera 32 is corrected to a coordinate that is offset correspondingly to the displacement vector d found in FIG. 7 and the target point of the placing head 4 is set to the corrected coordinate. An amount of movement of the placing head 4 is then determined so that the placing head 4 reaches the corrected target point. Owing to this configuration, the nozzle units 30 of the placing head 4 reach exactly above the chip components 6 to be sucked regardless of the displacement between the coordinate systems described above.

When the placing head 4 has moved to the suction position as described above, the control unit 50 executes control to let the chip components 6 be sucked by the nozzle units 30 by moving down the nozzle units 30 from the main body portion of the placing head 4 (Step S17). In this embodiment, because three nozzle units 30 are provided to the placing head 4, the placing head 4 is capable of sucking up to three chip components 6 by letting the chip components 6 be sucked by the respective nozzle units 30.

Subsequently, the control unit 50 executes control to move the placing head 4 above the mounting point on the substrate P (Step S19) and then to mount the chip component 6 sucked at the lower end portion of each nozzle unit 30 on the substrate P by moving down the nozzle unit 30 of the placing head 4 or in any other appropriate manner (Step S21). In this instance, in a case where the chip components 6 are sucked by all the three nozzle units 30 of the placing head 4, the placing head 4 mounts the chip components 6 by moving the respective nozzle units 30 sequentially from one mounting point to another on the substrate P. Also, in this instance, in a case where an unillustrated component recognition camera capable of taking an image of the chip component 6 sucked by the nozzle unit 30 from below is provided on the base stand 2, it becomes possible to recognize a displacement of the suction position (suction displacement) of the chip component 6 with respect to each nozzle unit 30 by the component recognition camera before the chip component 6 is mounted on the substrate P. Accordingly, in a case where there is a suction displacement, an amount of movement of each nozzle unit 30 with respect to the substrate P is corrected correspondingly to the displacement.

In a case where the chip component 6 is to be mounted on the substrate P as above, the exact position of the mounting point is determined on the basis of the position of the substrate P recognized by the substrate recognition camera 31 in Step S11. In this instance, even in a case where the real coordinate of the substrate recognition camera 31 contains the coordinate error as shown in FIG. 5, because the mounting operation of the chip component 6 on the substrate P is carried out by the placing head 4 that moves integrally with the substrate recognition camera 31, that is, by the placing head 4 having the coordinate system displaced by the same amount as the substrate recognition camera 31, the error as above poses no trouble during component mounting. The chip component 6 can be thus mounted appropriately.

When the mounting operation of the chip component 6 by the placing head 4 in Step S21 is completed, the control unit 50 determines whether all the chip components 6 to be mounted on the substrate P have been mounted (Step S23). In a case where the determination result is NO and the presence of a chip component 6 to be mounted is confirmed, the control unit 50 returns to Step S13 and repeats the processing thereafter in the same manner in order to mount this chip component 6 on the substrate P.

Meanwhile, in a case where the determination result in Step S23 is YES and it is confirmed that all the chip components 6 to be mounted on the substrate P have been mounted, the control unit 50 executes processing to carry out the substrate P to the outside of the apparatus by actuating the conveyor 3 (Step S25) and to increment the count value C (C=C+1) of the counter that stores the number of produced substrates P (Step S27). The control unit 50 further determines whether the incremented value is smaller than the production scheduled number Nt (Step S29). In a case where the determination result is YES and it is confirmed that the current accumulated production number has not reached the production scheduled number Nt, the control unit 50 returns to the processing in Step S5 and the following steps to execute the mounting processing for a new substrate P in the same manner as above. Meanwhile, in a case where the determination result in Step S29 is NO and it is confirmed that the current accumulated production number has reached the production scheduled number Nt, the production is ended.

As has been described, the component mounting apparatus 1 of the first embodiment transports a chip component 6, supplied from the component supply portion 5, by sucking the chip component 6 using the movable placing head 4 and mounts (places) the component 6 on the substrate P spaced apart by a predetermined distance. The component mounting apparatus 1 includes, as the component elements, the suction position recognition camera 32 that is movable independently of the placing head 4 and takes an image of the chip component 6 before the placing head 4 sucks the chip component 6 from the component supply portion 5, and the control unit 50 that systematically controls operations of the placing head 4, the suction position recognition camera 32, and so forth and moves the placing head 4 to the position of the chip component 6 on the basis of the imaging data of the chip component 6 obtained in advance through imaging by the suction position recognition camera 32 during component suction. It is configured in such a manner that a displacement between the respective coordinate systems of the placing head 4 and the suction position recognition camera 32 is checked at the predetermined timing and an amount of movement when the placing head 4 accesses the chip component 6 in the component supply portion 5 is corrected on the basis of the displacement between the coordinate systems under the control of the control unit 50. The configuration as above has an advantage that the occurrence of a suction error of the chip component 6 can be effectively prevented by appropriately adjusting a displacement between the respective coordinate systems of the placing head 4 and the suction position recognition camera 32 while efficiently performing the suction position recognition using the suction position recognition camera 32 that is movable independently of the placing head 4.

More specifically, according to the configuration above, an image of a chip component 6 that the placing head 4 is to suck from the component supply portion 5 is taken by the suction position recognition camera 32 that is movable independently of the placing head 4. It thus becomes possible to efficiently perform an operation to take an image of this chip component 6 (component to be sucked) and to recognize the position thereof while another chip component 6 sucked earlier is transported and mounted on the substrate P by the placing head 4. The production efficiency of the substrate P can be therefore enhanced effectively by shortening the takt time.

Moreover, it is configured in such a manner that a displacement between the respective coordinate systems of the placing head 4 and the suction position recognition camera 32 is checked at predetermined timing and an amount of movement when the placing head 4 accesses the chip component 6 in the component supply portion 5 is corrected on the basis of the displacement between the coordinate systems. Hence, even in a case where there is a mutual displacement between the respective coordinate systems of the placing head 4 and the suction position recognition camera 32, it becomes possible to precisely understand the relative position of the chip component 6 with respect to the placing head 4 and to move the placing head 4 exactly to the position of the chip component 6. Hence, the placing head 4 is enabled to perform an operation to suck the chip component 6 appropriately in a reliable manner. Accordingly, there is an advantage that the occurrence of a suction error of the chip component 6 can be prevented effectively by appropriately adjusting a displacement between the respective coordinate systems of the placing head 4 and the suction position recognition camera 32 while efficiently performing the suction position recognition using the suction position recognition camera 32 that is independent of the placing head 4.

In particular, according to the first embodiment, the substrate recognition camera 31 that recognizes the position of the substrate P is provided integrally with the placing head 4, and it is configured in such a manner that the substrate recognition camera 31 and the suction position recognition camera 32 are moved above the common position recognition mark M put on the component supply portion 5 at predetermined timing to take images of the same mark M and an amount of movement when the placing head 4 accesses the chip component 6 in the component supply portion 5 is corrected on the basis of a displacement between the respective coordinate systems of the placing head 4 and the suction position recognition camera 32 specified from a difference between the two types of the captured images. Hence, there is an advantage that a suction error of the chip component 6 can be prevented effectively by checking a displacement between the respective coordinate systems efficiently using a configuration as simple as taking images of the common position recognition mark M by the respective cameras 31 and 32.

As with the first embodiment, in a case where the component supply portion 5 is formed as a wafer feeder that supplies a plurality of chip components 6, 6, and so on cut out from the wafer 7 in a state where they are held by the wafer holding frame 8, high suction accuracy is required to extract a desired chip component 6 among a plurality of closely-spaced chip components 6, 6, and so on. However, according to this embodiment configured in such a manner that the chip component 6 is sucked in consideration of a displacement between the respective coordinate systems of the placing head 4 and the suction position recognition camera 32, there is an advantage that it is possible to suck a desired chip component 6 appropriately under the circumstances where high suction accuracy is required as described above.

The first embodiment is configured in such a manner that a displacement (displacement vector d) between the respective coordinate systems of the placing head 4 and the suction position recognition camera 32 is calculated in reference to the single position recognition mark M, and when the placing head 4 is moved to the chip component 6 in the component supply portion 5, the placing head 4 is enabled to move exactly to the position of the chip component 6 to be sucked by uniformly correcting an amount of movement of the placing head 4 correspondingly to the displacement between the coordinate systems. However, it may be configured in such a manner that a plurality of position recognition marks M are put on the wafer stage 10 of the component supply portion 5 to calculate displacements between the respective coordinate systems of the placing head 4 and the suction position recognition camera 32 in reference to a plurality of the position recognition marks M, so that an amount of movement when the placing head 4 accesses the component supply portion 5 is corrected on the basis of data of a plurality of coordinate displacements.

Figure 9:
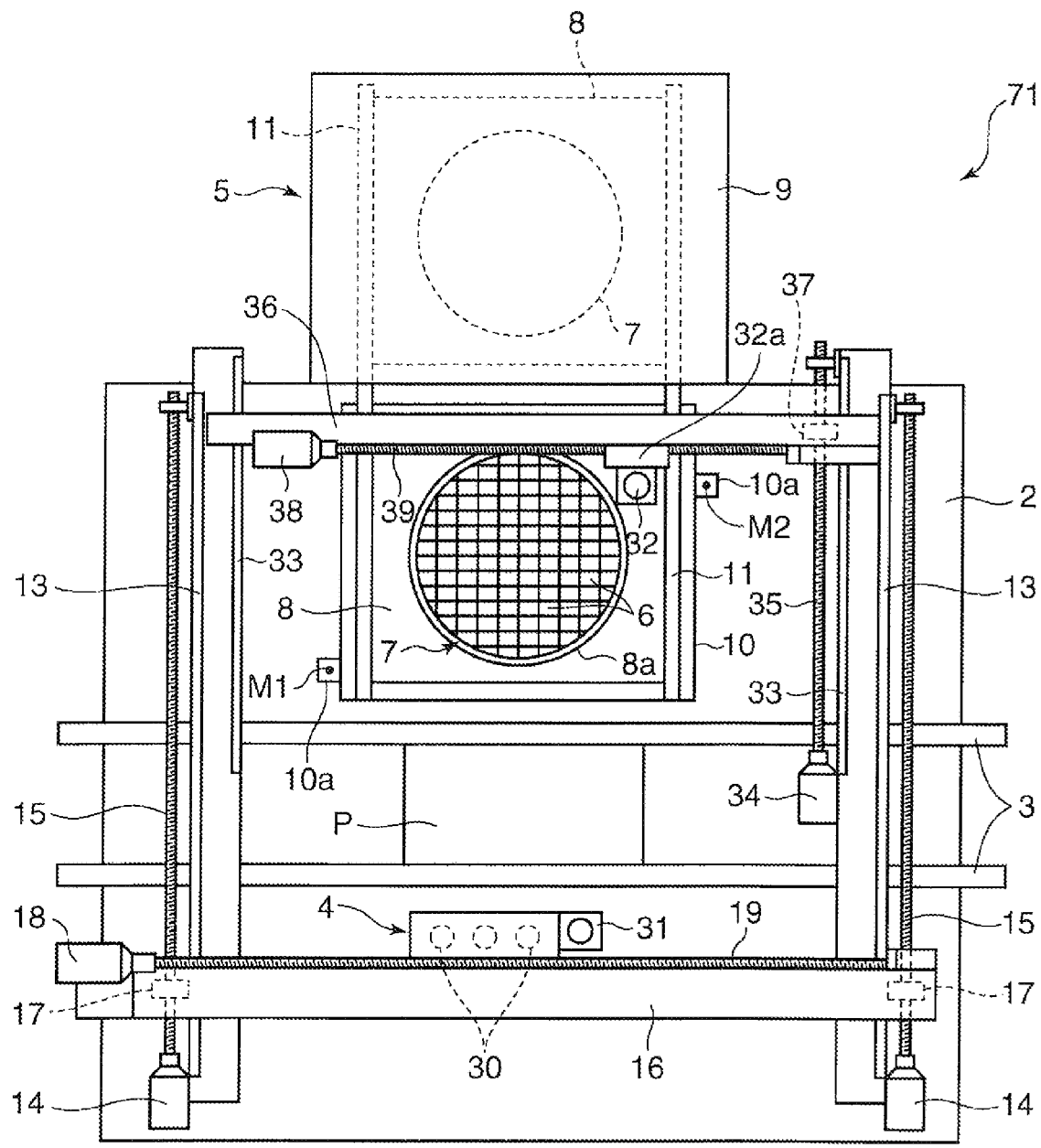
FIG. 9 is a plan view schematically showing a component mounting apparatus according to a second embodiment of the invention.

For example, as is shown in FIG. 9 (the drawing used to describe a second embodiment of the invention described below), in a case where two position recognition marks M1 and M2 are put on the periphery of the wafer stage 10 of the component supply portion 5, a displacement between the respective coordinate systems of the placing head 4 and the suction position recognition camera 32 is found in reference to each of the marks M1 and M2. In this case, it is possible to find a correction value of an amount of movement of the placing head 4 by interpolation on the basis two items of coordinate displacement data, that is, a displacement between the coordinate systems calculated in reference to one mark M1 and a displacement between the coordinate systems calculated in reference to the other mark M2. In this manner, in a case where an amount of movement of the placing head 4 is corrected on the basis of a plurality of items of coordinate displacement data, it becomes possible to calculate the correction value at a higher degree of accuracy. Hence, there is an advantage that the placing head 4 is enabled to perform a component suction operation more precisely.

Also, in a case where an amount of movement of the placing head 4 is corrected on the basis of a plurality of items of coordinate displacement data as described above, the number of the position recognition marks used as the reference when displacement data is obtained is not limited to two including the position recognition marks M1 and M2, and three or more position recognition marks may be provided. When three or more position recognition marks are provided, it becomes possible to further enhance the component suction accuracy by the placing head 4.

Figure 8:
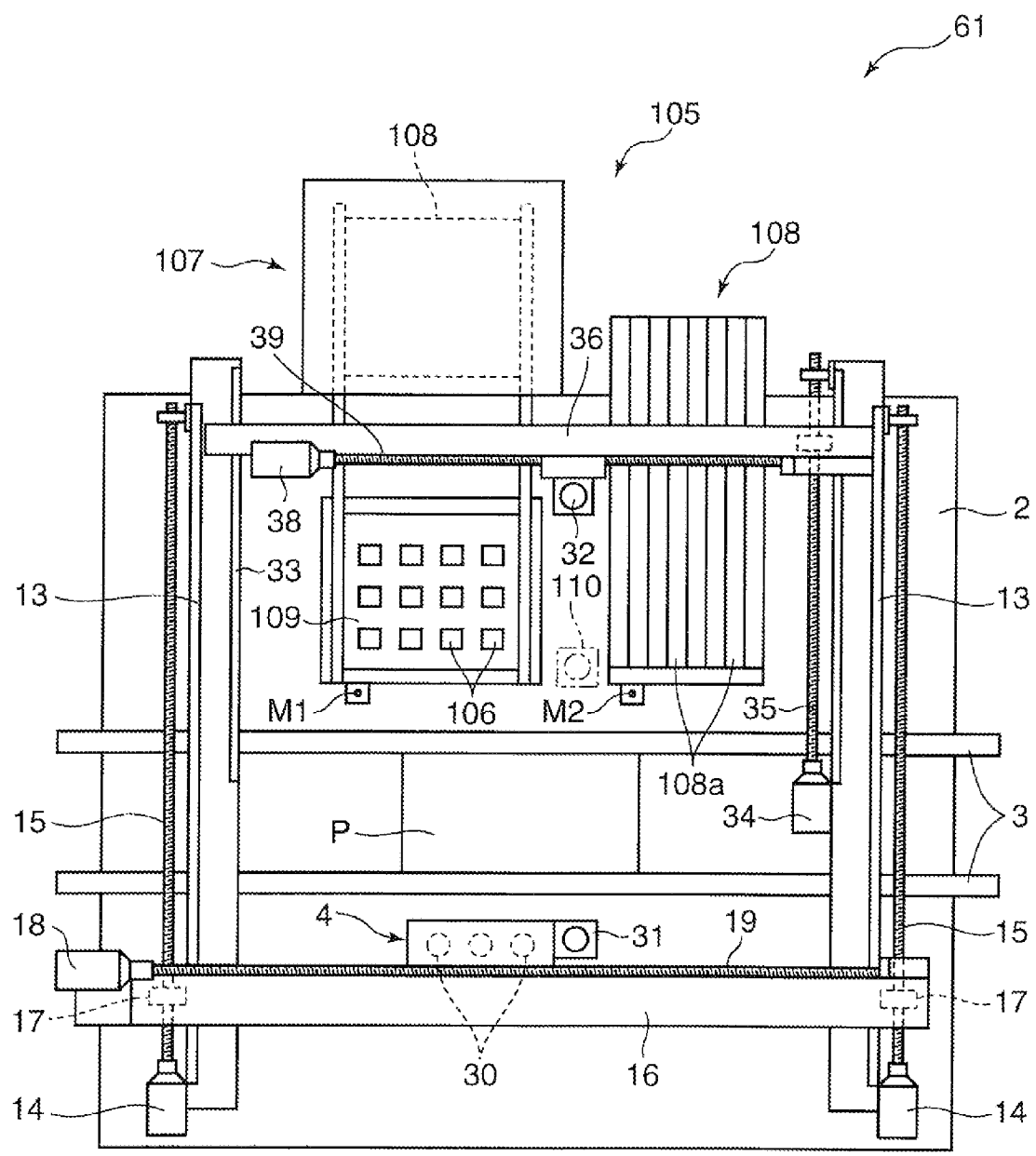
FIG. 8 is a view used to describe a modification of the component mounting apparatus.

The first embodiment has described a case where the component supply portion 5 that supplies components is formed as a wafer feeder configured to supply a plurality of chip components 6, 6, and so on cut out from the wafer 7 in a state where they are held by the wafer holding frame 8. However, the configuration of the invention is suitably applied also to a case where, for example, a component supply portion 105 is formed of a tray feeder 107 and a tape feeder 108 as a component mounting apparatus 61 shown in FIG. 8. To be more concrete, in the case of FIG. 8, the component supply portion 105 is formed of a tray feeder 107 that supplies a plurality of packaged electronic components 106 (for example, packaged integrated circuit components, transistors, capacitors, or the like accommodated in a ceramic casing) while they are placed on a tray 109, and a tape feeder 108 that supplies relatively small chip components or the like (not shown) while they are accommodated within tapes 108a in many lines provided so that they can be reeled out intermittently. In FIG. 8, configurations other than the component supply portion 105 formed of the tray feeder 107 and the tape feeder 108 are the same as the counterparts of the first embodiment above.

The component mounting apparatus 61 of FIG. 8 is configured in such a manner that the positions of the components supplied from the tray feeder 107 and from the tap feeder 108 are recognized by the suction position recognition camera 32 that is movable independently of the placing head 4 (and the substrate recognition camera 31) and the placing head 4 sucks the components from the respective feeders 107 and 108 on the basis of these positions. Also, as the reference mark with which to check a displacement between the respective coordinate systems of the placing head 4 and the suction position recognition camera 32, the position recognition marks M1 and M2 are put on the tray feeder 107 and the tape feeder 108, respectively.

According to the first embodiment, the substrate recognition camera 31 and the suction position recognition camera 32 are moved above the common position recognition mark M put on the wafer stage 10 of the component supply portion 5 and a displacement between the respective coordinate systems of the placing head 4 and the suction position recognition camera 32 is checked on the basis of the imaging data of the position recognition mark M obtained through imaging by the respective cameras 31 and 32. However, as is indicated by an alternate long and two short dashes line of FIG. 8, in a case where a component recognition camera 110 that takes an image of the component sucked by the placing head 4 from below to recognize a suction state is provided on the base stand 2, a displacement between the coordinate systems may be checked using the component recognition camera 110. More specifically, it may be configured in such a manner that marks are put on each of the bottom surface of the placing head 4 or the substrate recognition camera 31 and the bottom surface of the suction position recognition camera 32 and a displacement between the respective coordinate systems of the placing head 4 and the suction position recognition camera 32 is checked by taking images of these marks using the component recognition camera 110. In this case, too, a displacement between the both coordinate systems can be checked appropriately as with the first embodiment and it is therefore possible to perform a component suction operation precisely. In the configuration described above, images of the marks put on the respective cameras 31 and 32 are taken by using the component recognition camera 110 that checks a suction state of a component sucked by the placing head 4. Hence, the need to provide a new camera is eliminated, and an increase of the cost of the apparatus can be suppressed effectively.

According to the first embodiment, the substrate recognition camera 31 and the suction position recognition camera 32 are moved above the common position recognition mark M (see FIG. 1) put on the component supply portion 5 to take images of the mark M at predetermined timing and an amount of movement when the placing head 4 accesses the chip component 6 in the component supply portion 5 is corrected on the basis of a displacement between the respective coordinate systems of the placing head 4 and the suction position recognition camera 32 specified by a difference between two types of images thus taken. It should be appreciated, however, that a concrete configuration to achieve the object of the invention is not limited to this configuration. More specifically, in order to adjust a displacement between the respective coordinate systems of the placing head 4 and the suction position recognition camera 32, it is sufficient to find a correlation of some sort present between the respective coordinate systems and to correct an amount of movement when the placing head 4 accesses the chip component 6 in the component supply portion 5 on the basis of this correlation. Regarding a manner how to find the correlation, various schemes are applicable besides the one described in the first embodiment. A concrete example of such schemes will now be described in the following as a second embodiment of the invention.

Second Embodiment

FIG. 9 is a view showing a component mounting apparatus 71 according to a second embodiment of the invention. The component mounting apparatus 71 shown in the drawing is basically of the same structure as the component mounting apparatus 1 (FIG. 1) of the first embodiment above except that two position recognition marks M1 and M1 are provided as the reference mark for position recognition. Accordingly, like components are labeled with like reference numerals with respect to the first embodiment above in FIG. 9 and detailed descriptions are omitted herein.

Although it is not particularly described in the first embodiment above, there is a case where a displacement between the respective coordinate systems resulting from thermal influences of the respective drive mechanisms raises a problem in the component mounting apparatus 71 in which the placing head 4 and the suction position recognition camera 32 are driven by respective independent drive mechanisms. In other words, when heat associated with sliding friction or the like is generated in each of the drive mechanism (that is, the servo motors 14 and 18 and the ball screw shafts 15 and 19) driving the placing head 4 and the drive mechanism (that is, the servo motors 34 and 38 and the ball screw shafts 35 and 39) driving the suction position recognition camera 32 while the component mounting apparatus 71 is in operation, the ball screw shafts 15, 19, 35, and 39 in the respective drive mechanisms may possibly extend due to the generated heat. In a case where the ball screw shafts 15, 19, 35 and 39 extend, a displacement occurs between the respective coordinate systems of the placing head 4 and the suction position recognition camera 32 unless amounts of thermal extension of the ball screw shafts 15 and 19 for the placing head and the ball screw shafts 35 and 39 for the suction position recognition camera 32 coincide with each other. It thus becomes impossible to understand exactly the relative position of the chip component 6 in the component supply portion 5 with respect to the placing head 4 and a trouble occurs in an operation to suck the chip component 6 by the placing head 4.

Under these circumstances, the component mounting apparatus 71 of this embodiment is configured in such a manner that variances with time of the respective coordinate systems of the placing head 4 and the suction position recognition camera 32 are checked at predetermined timing at which it is anticipated that the coordinate systems have varied by a predetermined amount because of thermal influences (that is, influences of heat generated in the drive mechanisms as described above) of the respective drive mechanisms driving the placing head 4 and the suction position recognition camera 32, and an amount of movement when the placing head 4 accesses the chip component 6 in the component supply portion 5 is corrected on the basis of the correlation of the respective coordinate systems after the variances. As the reference mark with which to check variances of the coordinate systems as described above, two position recognition marks M1 and M2 are put on the wafer stage 10 of the component supply portion 5. To be more concrete, protrusion pieces 10a in a pair are provided to the edge portions on both the right and left sides of the wafer stage 10 and the marks M1 and M2 are put on the top surfaces of the respective protrusion pieces 10a.

In the first embodiment of the invention described above, it is assumed that the position recognition mark M is constantly present at the coordinate $(X_0, Y_0)$ on the X-Y plane and a displacement between the respective coordinate systems of the placing head 4 and the suction position recognition camera 32 is found on the basis of the coordinates (real coordinates) of the substrate recognition camera 31 and the suction position recognition camera 32 specified in reference to the fixed coordinate $(X_0, Y_0)$. In the second embodiment, however, there is no fixed coordinate of the position recognition mark as above and it is assumed that the positions of the position recognition marks M1 and M2 are specified on the basis of only the detection values of the position detection means (18a, 38a, and so forth) for the substrate recognition camera 31 and the suction position recognition camera 32. Hence, different from the case of the first embodiment above, the coordinates of the position recognition marks M1 and M2 vary apparently in the second embodiment.

Figure 10:
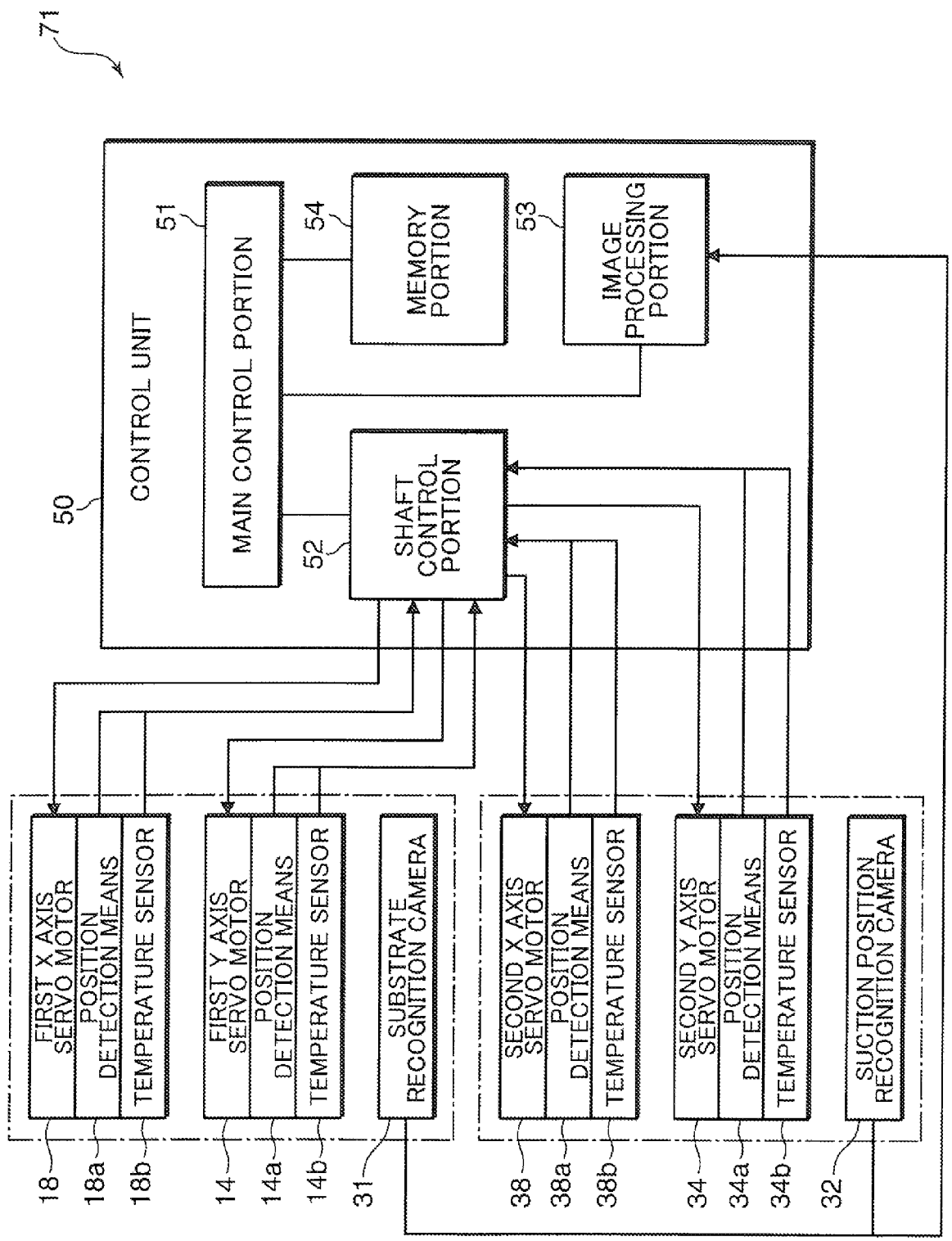
FIG. 10 is a block diagram showing a control system of the component mounting apparatus.

FIG. 10 is a block diagram showing the control system of the component mounting apparatus 71. As is shown in the drawing, temperature sensors 18b and 14b are provided, respectively, to the first X axis servo motor 18 and the first Y axis servo motors 14 driving the placing head 4 and the motor temperatures during operation are checked on the basis of the detection values in these temperature sensors 18b and 14b. Likewise, temperature sensors 38b and 34b that check the motor temperatures during operation are provided, respectively, to the second X axis servo motor 38 and the second Y axis servo motor 34 driving the suction position recognition camera 32. Other than the foregoing, the control system is the same as the counterpart in the component mounting apparatus 1 (see FIG. 2) of the first embodiment above.

In the second embodiment, the control unit 50 that controls operations of the respective portions of the component mounting apparatus 71 is configured in such a manner that it checks a temperature rise in each of the drive mechanisms driving the placing head 4 and the suction position recognition camera 32 on the basis of the detection values in the temperature sensors (18b, 38b, and so forth) attached to the respective servo motors (18, 38, and so forth) and checks variances of the respective coordinate systems at predetermined timing at which it is anticipated that the coordinate system of the placing head 4 or the suction position recognition camera 32 has varied by a predetermined amount on the basis of the checking result. To be more concrete, it is configured in such a manner that the control unit 50 confirms the positions of the position recognition marks M1 and M2 put on the wafer stage 10 of the component supply portion 5 by taking images thereof using the substrate recognition camera 31 attached to the placing head 4 and the component recognition camera 32 and checks variances of the coordinate systems of the placing head 4 and the suction position recognition camera 32. It is also configured in such a manner that an amount of movement when the placing head 4 accesses the chip component 6 in the component supply portion 5 is corrected on the basis of the correlation of the respective coordinates after the variances.

Herein, a concrete scheme to check variances of the respective coordinates of the placing head 4 and the suction position recognition camera 32 caused by a temperature rise in each drive mechanism will be described. It is a precondition of the description that the coordinates of the placing head 4 and the suction position recognition camera 32 for convenience of control detected by the position detection means (18a, 38a, and so forth) are set so that they coincide with each other when detection temperatures in the temperature sensors (18b, 38b, and so forth) are at a predetermined reference temperature.

When the temperatures of the drive mechanisms driving the placing head 4 and the suction position recognition camera 32 rise to some extent, the ball screw shafts (19, 39, and so forth) forming these drive mechanisms extend. Accordingly, the coordinates of the placing head 4 and the suction position recognition camera 32 for convenience of control detected by the position detection means (18a, 38a, and so forth) vary individually. When the positions of the position recognition marks M1 and M2 are recognized in this state by the substrate recognition camera 31 and the suction position recognition camera 32, the coordinates of the respective marks M1 and M2 are recognized as being present at positions different from the positions specified by the coordinates at the reference temperature.

Figure 11A:
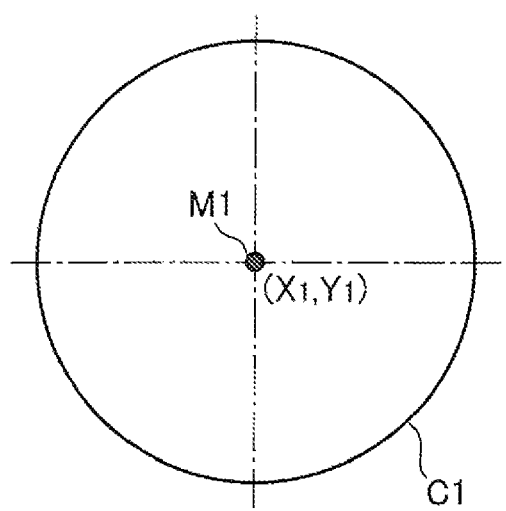
FIG. 11 is a view used to describe a case where one position recognition mark is recognized by the substrate recognition camera, FIG. 11A showing a state at a reference temperature and FIG. 11B showing a state during a warm time.

For example, in a case where the placing head 4 is moved to a position at which the substrate recognition camera 31 and the position recognition mark M1 coincide with each other when viewed in a plane at the reference temperature, $(X_1, Y_1)$ is given as the coordinate of the substrate recognition camera 31 for convenience of control in this instance, that is, the coordinate of the substrate recognition camera 31 on the basis of the detection values of the position detection means 34a and 38a. In this case, as is shown in FIG. 11A, the position recognition mark M1 is recognized at the center of the imaging field of view C1 of the substrate recognition camera 31 and the mark M1 is recognized as being present at the coordinate $(X_1, Y_1)$ of the substrate recognition camera 31 for convenience of control.

Figure 11B:
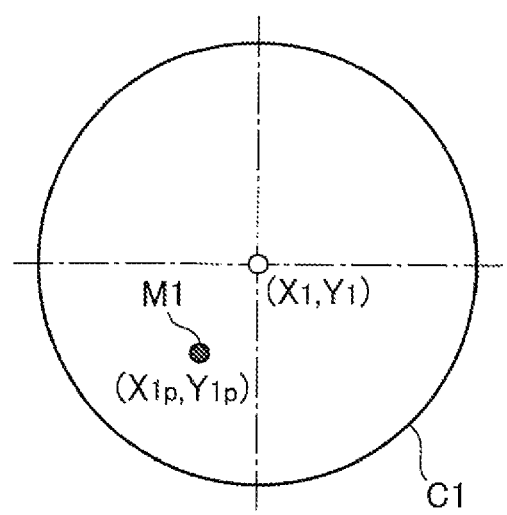

Meanwhile, assume that the substrate recognition camera 31 is moved to the same coordinate $(X_1, Y_1)$ while the position is being detected by the position detection means 34a and 38a in a state where the temperature of the drive mechanism is rising (warm time). In this state, however, because the coordinate of the substrate recognition camera 31 (and the placing head 4) for convenience of control has undergone displacement because of thermal extension of the ball screw shafts 15 and 19, the substrate recognition camera 31 actually moves to a position displaced from the position recognition mark M1 by a predetermined distance. Accordingly, as is shown in FIG. 11B, the position recognition mark M1 is recognized as being present at the coordinate $(X_{1P}, Y_{1P})$ displaced from the center of the imaging field of view C1 (herein, $(X_1, Y_1)$ in the coordinate for convenience of control) of the substrate recognition camera 31 by a certain distance.

Figure 12A:
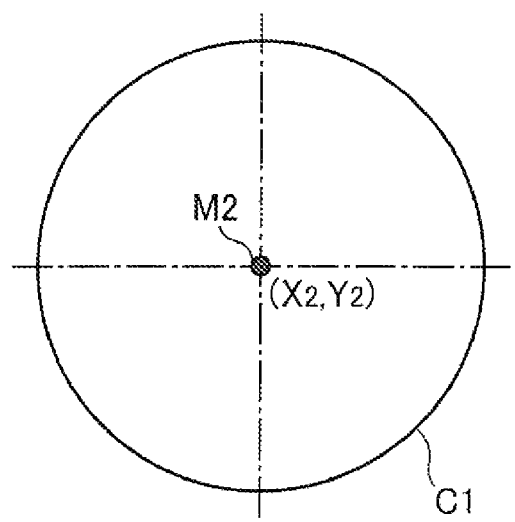
FIG. 12 is a view used to describe a case where the other position recognition mark is recognized by the substrate recognition camera, FIG. 12A showing a state at the reference temperature and FIG. 12B showing a state during the warm time.
Figure 12B:
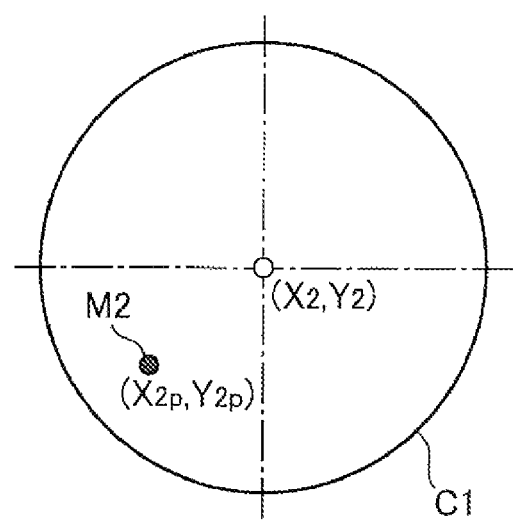

FIGS. 12A and 12B show a case where the other position recognition mark M2 is recognized by the substrate recognition camera 31 in the same manner as above. As are shown in the drawings, the position recognition mark M2 is recognized as being present at the coordinate $(X_2, Y_2)$ at the reference temperature. However, during the warm time over which the temperature of the drive mechanism is rising, the position recognition mark M2 is recognized as being present at $(X_{2P}, Y_{2P})$ spaced apart from the coordinate $(X_2, Y_2)$ by a predetermined distance.

In this manner, when the positions of the position recognition marks M1 and M2 are recognized by the substrate recognition camera 31 in a state where the coordinate system of the placing head 4 has undergone displacement because of a temperature rise in the drive mechanism, the respective marks M1 and M2 are recognized as being present at the coordinates $(X_{1P}, Y_{1P})$ and $(X_{2P}, Y_{2P})$ displaced, respectively, from the coordinates $(X_1, Y_1)$ and $(X_2, Y_2)$ at the reference temperature. The control unit 50 is configured in such a manner that it checks a variance of the coordinate system of the placing head 4 by exploiting this phenomenon described above. More specifically, it is configured in such a manner that when a range of temperature rise in the drive mechanism has increased to some extent, the control unit 50 recognizes the coordinates $(X_{1P}, Y_{1P})$ and $(X_{2P}, Y_{2P})$ of the position recognition marks M1 and M2, respectively, during the warm time using the substrate recognition camera 31 and checks a variance of the coordinate system of the placing head 4 on the basis of displacements between these coordinates and the coordinates $(X_1, Y_1)$ and $(X_2, Y_2)$ of the position recognition marks M1 and M2, respectively, at the reference temperature.

Figure 14A:
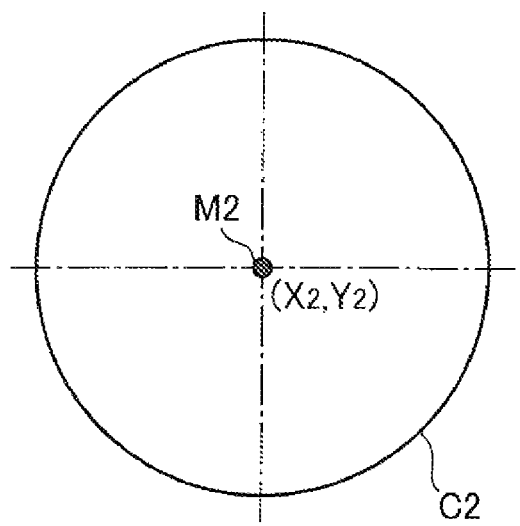
FIG. 14 is a view used to describe a case where the other position recognition mark is recognized by the suction position recognition camera, FIG. 14A showing a state at the reference temperature and FIG. 14B showing a state during the warm time.
Figure 14B:
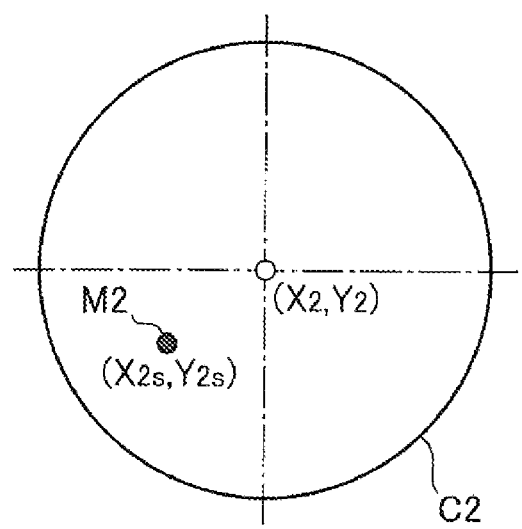

The same can be said with a case where a variance of the coordinate system of the suction position recognition camera 32 is checked. More specifically, as are shown in FIG. 13 and FIG. 14, a variance of the coordinate system of the suction position recognition camera 32 can be checked on the basis of displacements between the coordinates $(X_{1S}, Y_{1S})$ and $(X_{2S}, Y_{2S})$ of the position recognition marks M1 and M2, respectively, during the warm time recognized by the camera 32 and the coordinates $(X_1, Y_1)$ and $(X_2, Y_2)$ of these marks at the reference temperature. As has been described, because the coordinate system of the suction position recognition camera 32 and the coordinate system of the placing head 4 (and the substrate recognition camera 31) coincide with each other at the reference temperature, as are shown in FIG. 13A and FIG. 14A, the coordinates of the position recognition marks M1 and M2 at the reference temperature recognized by the suction position recognition camera 32 are the same as the coordinates $(X_1, Y_1)$ and $(X_2, Y_2)$ in a case where they are recognized by the substrate recognition camera 31. In FIG. 13 and FIG. 14, C2 denotes the imaging field of view of the suction position recognition camera 32.

A concrete content of a mounting operation performed by the component mounting apparatus 71 under the control of the control unit 50 will now be described according to the flowcharts of FIG. 15 and FIG. 16.

Figure 15:
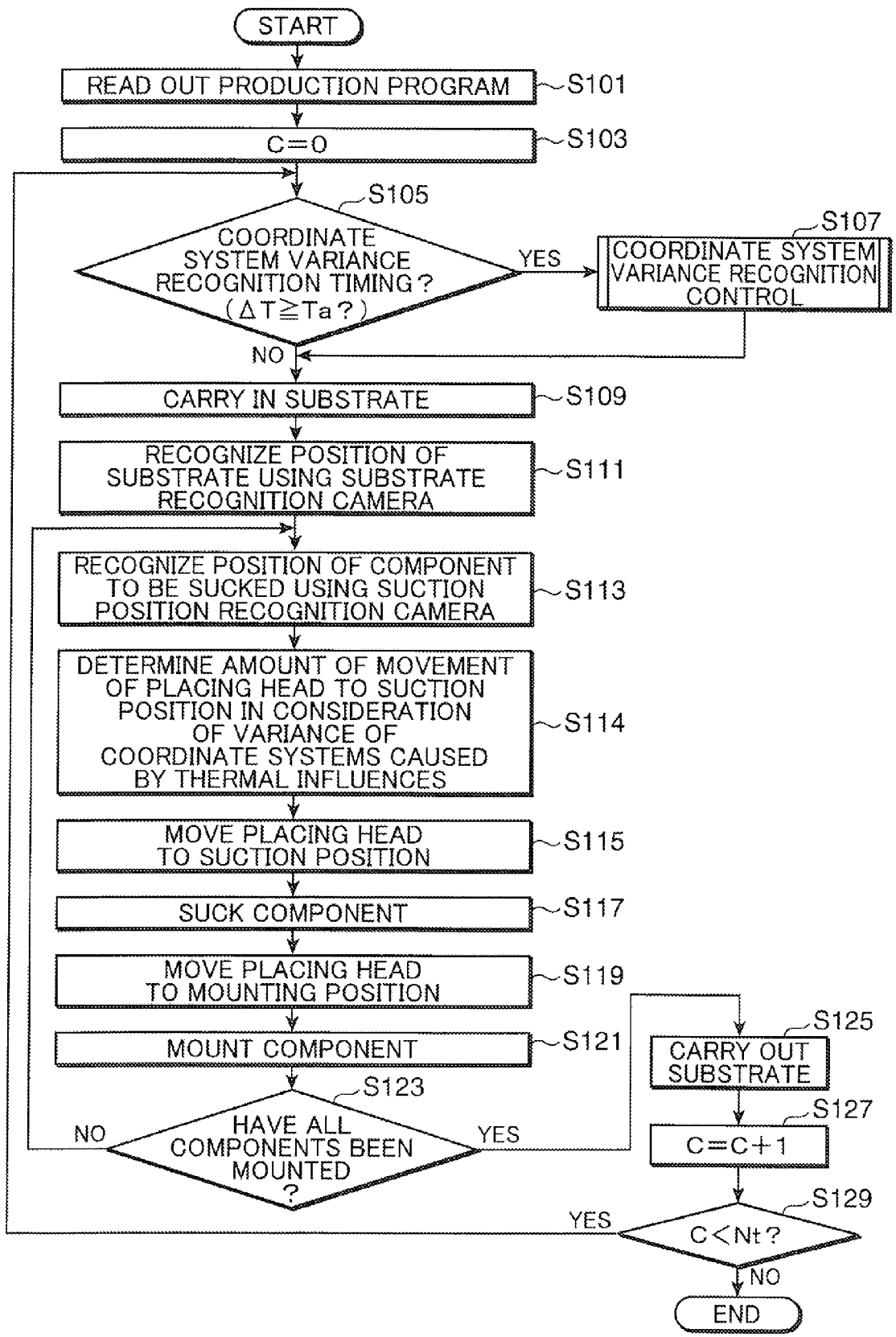
FIG. 15 is a flowchart depicting a content of a control operation performed by the component mounting apparatus.

As is shown in FIG. 15, when the mounting on the substrate P is started, the control unit 50 executes control to read out an appropriate production program from the memory portion 54 (Step S101) and to reset the count value C (C=0) of the counter that stores the number of produced substrates P (Step S103).

Subsequently, the control unit 50 determines whether the current time point is the timing (coordinate variance recognition timing) at which the coordinate variance recognition control executed in Step S107 described below should be executed (Step S105). To be more concrete, in the flowchart of FIG. 15, when variances of the detection temperatures of the respective servo motors (18, 38, and so forth) in the temperature sensors (18b, 38b, and so forth), that is, a temperature variance ΔT of each servo motor in comparison with the temperature at the start-up of the apparatus or at the execution of the coordinate variance recognition control performed last has reached a predetermined threshold value Ta, it is determined that the current time point falls on the coordinate variance recognition timing. In this embodiment, assume that it is determined that the current time point falls on the coordinate variance recognition timing when the temperature variance as described above is found in any one of a plurality of the servo motors 14, 18, 34, and 38.

In a case where the determination result in Step S105 is YES and it is confirmed that the current time point is the coordinate variance recognition timing, the control unit 50 proceeds to following Step S107 to execute the coordinate variance recognition control by which variances of the coordinate systems of the placing head 4 and the suction position recognition camera 32 are recognized.

Figure 16:
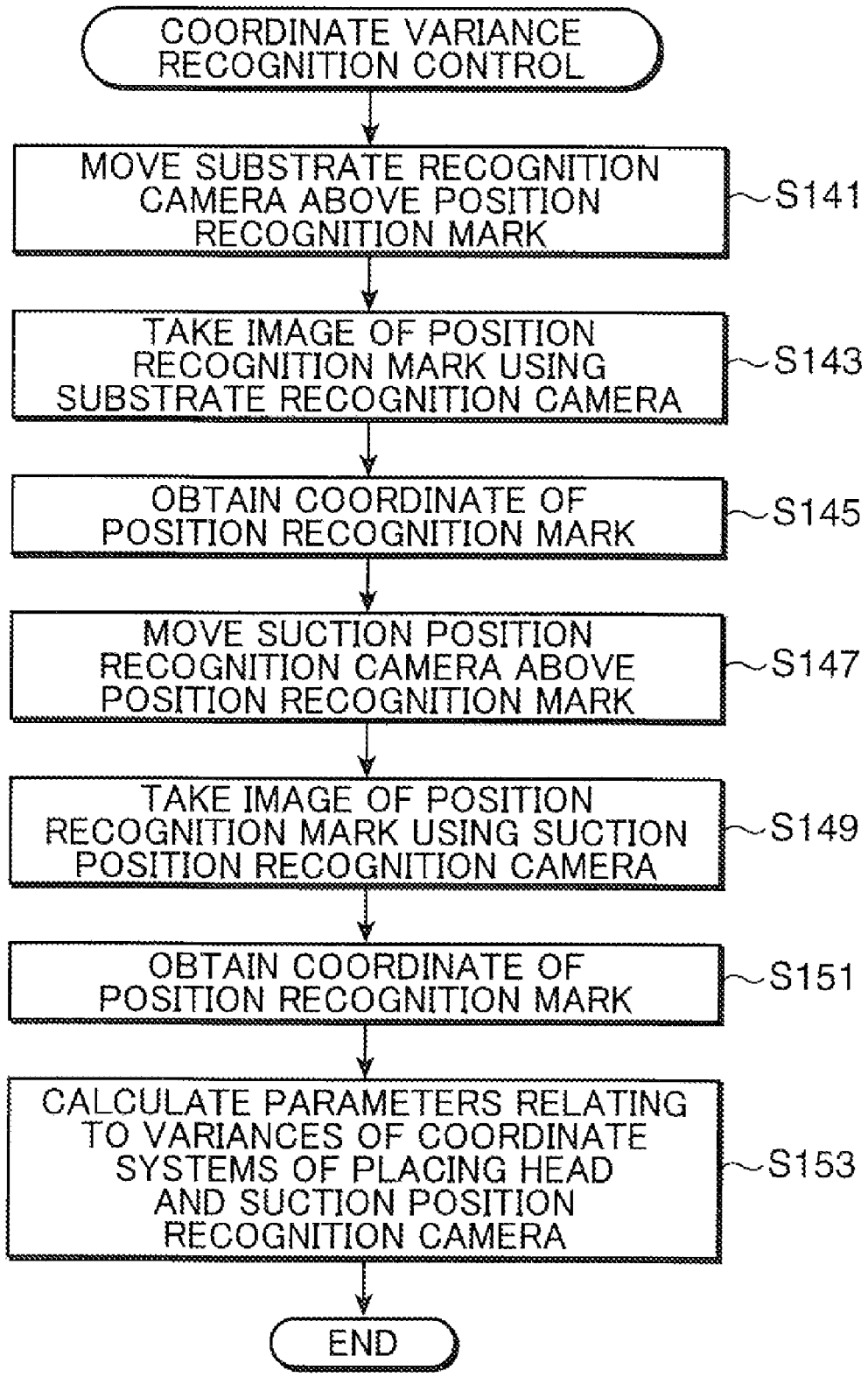
FIG. 16 is a sub-routine depicting a concrete content of coordinate variance recognition control performed in the flowchart of FIG. 15.

FIG. 16 is a sub-routine to depict the concrete content of the coordinate variance recognition control. When this sub-routine is started, the control unit 50 initially executes control to move the substrate recognition camera 31 sequentially above the position recognition marks M1 and M2 put on the wafer stage 10 of the component supply portion 5 (Step S141) and to take images of the respective marks M1 and M2 using the substrate recognition camera 31 (Step S143). To be more concrete, the control unit 50 moves the substrate recognition camera 31 together with the placing head 4 in the respective directions of the X and Y axes by actuating the first X axis servo motor 18 and the first Y axis servo motors 14, and detects an amount of movement on the basis of the detection values 18a and 14a provided to the servo motors 18 and 14, respectively, so that it moves the substrate recognition camera 31 aimed to the position recognition marks M1 and M2, respectively, at the coordinates $(X_1, Y_1)$ and $(X_2, Y_2)$ at the reference temperature to take images of the respective marks M1 and M2 at the moved positions.

Subsequently, the control unit 50 executes control to obtain the coordinates of the respective marks M1 and M2 from the imaging data of the position recognition marks M1 and M2 obtained through imaging by the substrate recognition camera 31 in Step S143 and then to store these coordinates into the memory portion 54 (Step S145). For example, as are shown in FIG. 11 and FIG. 12, in a case where the substrate recognition camera 31 moves above the position recognition marks M1 and M2, respectively, at the coordinates $(X_1, Y_1)$ and $(X_2, Y_2)$ at the reference temperature, when the substrate recognition camera 31 has moved to positions displaced from the coordinates of the respective marks M1 and M2 because of the thermal extension of the ball screw shafts 15 and 19, the marks M1 and M2 are recognized as being apparently present at the coordinates $(X_{1P}, Y_{1P})$ and $(X_{2P}, Y_{2P})$, respectively, and these coordinates $(X_{1P}, Y_{1P})$ and $(X_{2P}, Y_{2P})$ are obtained as the coordinates of the marks M1 and M2, respectively.

When the processing to obtain the coordinates of the position recognition marks M1 and M2 by the substrate recognition camera 31 in this manner is completed, in order to perform the same processing for the suction position recognition camera 32, the control unit 50 executes control to move the suction position recognition camera 32 sequentially above the position recognition marks M1 and M2 same as those described above (Step S147) and to take images of the respective marks M1 and M2 by the suction position recognition camera 32 (Step S149). To be more concrete, the control unit 50 moves the suction position recognition camera 32 in the respective directions of the X and Y axes by actuating the second X axis servo motor 38 and the second Y axis servo motor 34, so that it moves the suction position recognition camera 32 aimed to the position recognition marks M1 and M2 by detecting an amount of movement on the basis of the detection values of the position detection means 38a and 34a provided to the motors 38 and 34, respectively, to take images of the respective marks M1 and M2 at the moved positions.

Subsequently, the control unit 50 executes control to obtain the coordinates (apparent coordinates) of the respective marks M1 and M2 from the imaging data of the position recognition marks M1 and M2 obtained through imaging by the suction position recognition camera 32 in Step S149 and to store these coordinates into the memory portion 54 (Step S151). For example, as are shown in FIG. 13 and FIG. 14, in a case where the suction position recognition camera 32 moves above the position recognition marks M1 and M2, respectively, at the coordinates $(X_1, Y_1)$ and $(X_2, Y_2)$ at the reference temperature, when the suction position recognition camera 32 has moved to positions displaced from the coordinates of the respective marks M1 and M2 due to thermal extension of the ball screw shafts 35 and 39, the respective marks M1 and M2 are recognized as being apparently present at the coordinates $(X_{1S}, Y_{1S})$ and $(X_{2S}, Y_{2S})$, respectively, and these coordinates $(X_{1S}, Y_{1S})$ and $(X_{2S}, Y_{2S})$ are obtained as the coordinates of the marks M1 and M2, respectively.

When the processing to obtain the coordinates of the respective position recognition marks M1 and M2 by the substrate recognition camera 31 and the suction position recognition camera 32 is completed as has been described, the control unit 50 executes control to calculate various parameters relating to variances of the respective coordinate systems of the placing head 4 and the suction position recognition camera 32 and to store these parameters into the memory portion 54 (Step S153). A concrete procedure when these parameters are computed will now be described in order of [1] through [4] below.

Figure 17:
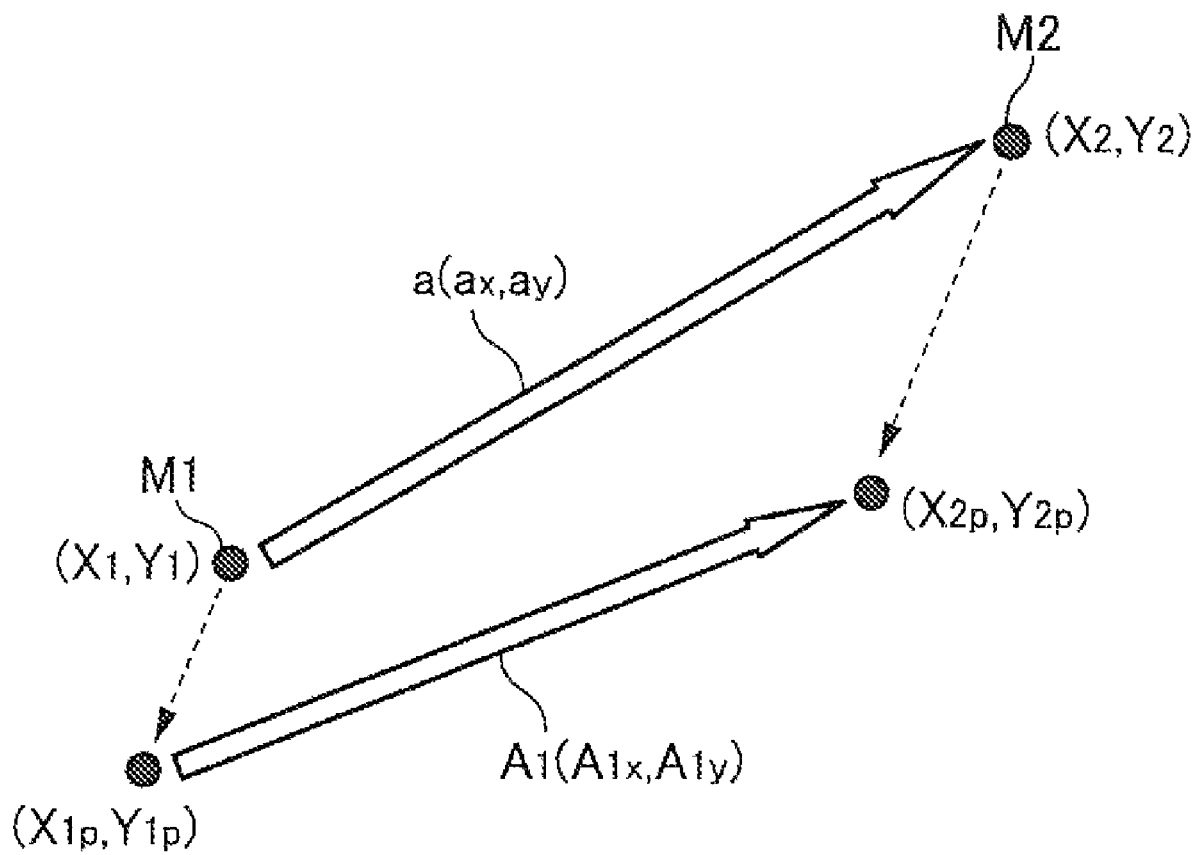
FIG. 17 is a view used to describe the procedure to find a parameter relating to a variance of the coordinate system of the placing head.

[1] Initially, as a preliminarily calculation to find parameters relating to a variance of the coordinate system of the placing head 4, vectors a and $A_1$ described below are calculated. In other words, as is shown in FIG. 17, a mark-to-mark vector a $(a_x, a_y)$ linking the coordinates $(X_1, Y_1)$ and $(X_2, Y_2)$ of the position recognition marks M1 and M2, respectively, at the reference temperature is calculated while a mark-to-mark vector $A_1$ $(A_{1x}, A_{1y})$ linking the coordinates of the position recognition marks M1 and M2 obtained in Step S145, that is, the coordinates $(X_{1P}, Y_{1P})$ and $(X_{2P}, Y_{2P})$ of the marks M1 and M2, respectively, on the basis of the coordinate system of the placing head 4 during the warm time, is calculated using the both coordinates. Herein, vector a $(a_x, a_y)=(X_2-X_1, Y_2-Y_1)$ and vector $A_1$ $(A_{1x}, A_{1y})=(X_{2P}-X_{1P}, Y_{2P}-Y_{1P})$.

[2] A scaling constant $\alpha_1$ and a coordinate rotation angle $\theta_1$ relating to the coordinate system of the placing head 4 are calculated in accordance with Equations (1) and (2) below using the respective vectors $a(a_x, a_y)$ and $A_1(A_{1x}, A_{1y})$ found in [1] above.

$$\alpha_1 = \frac{\sqrt{|A_{1x}|^2 + |A_{1y}|^2}}{\sqrt{|a_x|^2 + |a_y|^2}} \quad (1)$$

$$\theta_1 = \cos^{-1}\left[\frac{a_x A_{1x} + a_y A_{1y}}{\sqrt{|a_x|^2 + |a_y|^2} + \sqrt{|A_{1x}|^2 + |A_{1y}|^2}}\right] \quad (2)$$

The scaling constant $\alpha_1$ indicates a degree of variance of the mark-to-mark distance on the basis of the coordinate system of the placing head 4 during the warm time in comparison with the distance at the reference temperature and it represents the rate of scale change of the coordinate system during the warm time. The coordinate rotation angle $\theta_1$ indicates an angular variance of the coordinate system during the warm time.

Figure 18:
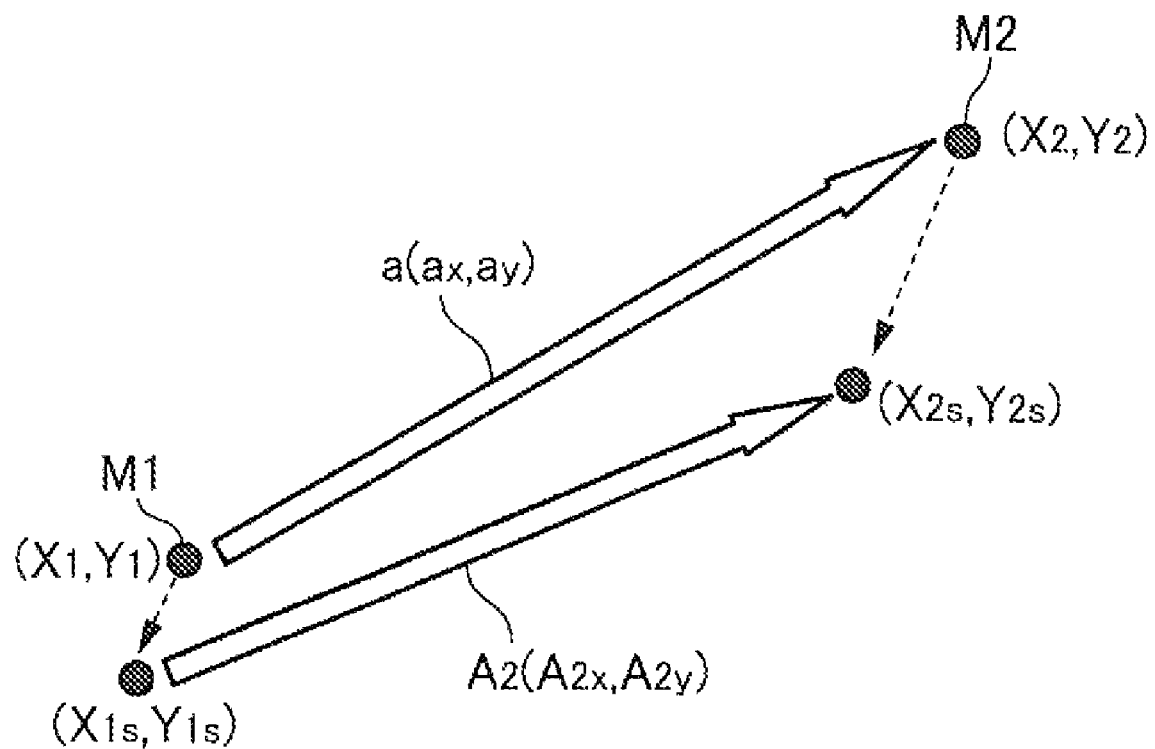
FIG. 18 is a view used to describe the procedure to find a parameter relating to a variance of the coordinate system of the suction position recognition camera.

[3] A parameter relating to a variance of the coordinate system of the suction position recognition camera 32 is found next. To this end, as is shown in FIG. 18, a vector $A_2$ described below together with the mark-to-mark vector $a(a_x, a_y)$ at the reference temperature calculated in [1] above is calculated first. More specifically, a mark-to-mark vector $A_2(A_{2x}, A_{2y})$ linking the coordinates of the position recognition marks M1 and M2 obtained in Step S151, that is, the coordinates $(X_{1S}, Y_{1S})$ and $(X_{2S}, Y_{2S})$ of the marks M1 and M2, respectively, on the basis of the coordinate system of the suction position recognition camera 32 during the warm time, is calculate using the both coordinates. Herein, vector $A_2(A_{2x}, A_{2y}) = (X_{2S}-X_{1S}, Y_{2S}-Y_{1S})$.

[4] A scaling constant $\alpha_2$ and a coordinate rotation angle $\theta_2$ relating to the coordinate system of the suction position recognition camera 32 are calculated in accordance with Equations (3) and (4) using the respective vectors $a(a_x, a_y)$ and $A_2(A_{2x}, A_{1y})$ found in [3] above.

$$\alpha_2 = \frac{\sqrt{|A_{2x}|^2 + |A_{2y}|^2}}{\sqrt{|a_x|^2 + |a_y|^2}} \quad (3)$$

$$\theta_2 = \cos^{-1}\left[\frac{a_x A_{2x} + a_y A_{2y}}{\sqrt{|a_x|^2 + |a_y|^2} \cdot \sqrt{|A_{2x}|^2 + |A_{2y}|^2}}\right] \quad (4)$$

Descriptions will continue with reference to the main flowchart of FIG. 15 again. In a case where the determination result in Step S105 is NO and it is confirmed that the current time point is not the coordinate variance recognition timing, or in a case where the determination result in Step S105 is YES and the coordinate variance recognition control in following Step S107 is completed, the control unit 50 executes control to carry in the substrate P to the mounting work position shown in FIG. 9 by actuating the conveyor 3 (Step S109).

Subsequently, the control unit 50 executes control to recognize the position of the substrate P placed in position at the mounting work position by moving the substrate recognition camera 31 together with the placing head 4 above the substrate P and taking an image of the fiducial mark for position recognition put on the top surface of the substrate P using the substrate recognition camera 31 (Step S111).

Subsequently, the control unit 50 executes control to recognize the position of a chip component 6 to be sucked among many chip components 6, 6, and so on contained in the wafer 7 on the wafer stage 10 by moving the suction position recognition camera 32 above the wafer stage 10 of the component supply portion 5 and taking an image of this chip component 6 using the suction position recognition camera 32 (Step S113). More specifically, in Step S113, an image of the chip component 6 to be sucked is taken by the suction position recognition camera 32 and the position of the chip component 6 specified on the basis of the imaging data is recognized as the movement target point of the placing head 4 that is to suck this chip component 6.

When the position of the chip component 6 to be sucked is recognized in this manner, the control unit 50 executes control to determined an amount of movement necessary for the placing head 4 to move above this chip component 6 in consideration of variances of the coordinate systems of the placing head 4 and the suction position recognition camera 32 caused by thermal extension, that is, variances of the respective coordinate systems indicated by the various parameters ($\alpha_1$, $\theta_1$, and so forth) calculated in Step S153 (Step S114) and to move the placing head 4 above the chip component 6 according to the determined amount of movement (Step S115).

More specifically, according to the component mounting apparatus 71 of this embodiment, the position of the chip component 6 is recognized by the suction position recognition camera 32 that is movable independently of the placing head 4 (and the substrate recognition camera 31). Hence, the nozzle units 30 of the placing head 4 may possibly fail to reach exactly above the chip components 6 unless the placing head 4 is moved in consideration of variances of the coordinate systems of the placing head 4 and the suction position recognition camera 32 caused by thermal extension. To avoid such an inconvenience, when the placing head 4 is moved above the chip component 6, an amount of movement is determined in consideration of variances of the coordinate systems described above. To be more concrete, an amount of movement of the placing head 4 is determined by the following procedures [a] through [c].

[a] Given that $(X_{t2}, Y_{t2})$ is the coordinate of the chip component 6 recognized by the suction position recognition camera 32, that is, the coordinate of the chip component 6 on the basis of the coordinate system of the camera 32 during the warm time, then this component coordinate $(X_{t2}, Y_{t2})$ is converted to the coordinate $(X_{t0}, Y_{t0})$ on the basis of the coordinate system at the reference temperature in accordance with Equation (5) below using the scaling constant $\alpha_2$ and the coordinate rotation angle $\theta_2$ relating to the coordinate system of the suction position recognition camera 32.

$$\begin{pmatrix} X_{t0} \\ Y_{t0} \end{pmatrix} = \frac{1}{\alpha_2}\begin{pmatrix} \cos\theta_2 & -\sin\theta_2 \\ \sin\theta_2 & \cos\theta_2 \end{pmatrix}^{-1}\begin{pmatrix} X_{t2} \\ Y_{t2} \end{pmatrix} \quad (5)$$

[b] The component coordinate $(X_{t0}, Y_{t0})$ on the basis of the coordinate system at the reference temperature found in [a] above is then converted to the component coordinate $(X_{t1}, Y_{t1})$ on the basis of the coordinate system of the placing head 4 during the warm time in accordance with Equation (6) below using the scaling constant $\alpha_1$ and the coordinate rotation angle $\theta_1$ relating to the coordinate system of the placing head 4.

$$\begin{pmatrix} X_{t1} \\ Y_{t1} \end{pmatrix} = \alpha_1 \begin{pmatrix} \cos\theta_1 & -\sin\theta_1 \\ \sin\theta_1 & \cos\theta_1 \end{pmatrix}^{-1}\begin{pmatrix} X_{t0} \\ Y_{t0} \end{pmatrix} \quad (6)$$

[c] Then, the component coordinate $(X_{t1}, Y_{t1})$ on the basis of the coordinate system of the placing head 4 during the warm time found in [b] above is set again as the movement target point of the placing head 4 and an amount of movement is corrected for the placing head 4 to reach the target point, after which the placing head 4 is moved.

As has been described, according to the processing in [a] through [c] above, it is configured in such a manner that the component coordinate recognized by the suction position recognition camera 32 during the warm time is converted to the component coordinate on the basis of the coordinate system of the placing head 4 during the warm time on the basis of the correlation of the coordinate systems of the suction position recognition camera 32 and the placing head 4, and an amount of movement of the placing head 4 is corrected for the placing head 4 to reach the converted component coordinate. This configuration enables the nozzle units 30 of the placing head 4 to move exactly above the chip components 6 to be sucked regardless of variances of the coordinate systems caused by thermal extension.

When the placing head 4 has moved to the suction position as described above, the control unit 50 executes control to suck the chip components 6 by the nozzle units 30 of the placing head 4 and mount the sucked components on the substrate P (S117 through S129). Because the contents thereof are the same as those in Step S17 through S29 (FIG. 3) in the first embodiment above, detailed descriptions are omitted herein.

As has been described, the second embodiment is configured in such a manner that variances of the both coordinate systems of the placing head 4 and the suction position recognition camera 32 caused by thermal influences in the drive mechanisms driving the placing head 4 and the suction position recognition camera 32 are checked at predetermined timing and an amount of movement when the placing head 4 accesses the chip component 6 in the component supply portion 5 is corrected on the basis of the correlation of the respective coordinate systems after the variances. Hence, even in a case where the respective coordinate systems of the placing head 4 and the suction position recognition camera 32 vary because of thermal influences and undergo mutual displacement, it is possible to understand the exact relative position of the chip component 6 with respect to the placing head 4 and thereby to move the placing head 4 exactly to the position of the chip component 6. The placing head 4 is thus enabled to perform an operation to suck the component 6 appropriately in a reliable manner. Hence, there is an advantage that the occurrence of a suction error of the chip component 6 can be prevented effectively by appropriately adjusting a displacement caused by thermal influences on the respective coordinate systems of the placing head 4 and the suction position recognition camera 32 while efficiently performing the suction position recognition using the suction position recognition camera 32 that is independent of the placing head 4.

In particular, according to the second embodiment, besides providing the substrate recognition camera 31 that recognizes the position of the substrate P integrally with the placing head 4, the substrate recognition camera 31 and the suction position recognition camera 32 are moved above the common position recognition marks M1 and M2 put on the component supply portion 5 at predetermined timing at which it is anticipated that the respective coordinate systems of the placing head 4 and the suction position recognition camera 32 have varied by a predetermined amount because of thermal influences, so that variances of the respective coordinate systems of the placing head 4 and the suction position recognition camera 32 are checked on the basis of imaging data of the position recognition marks M1 and M2 obtained through imaging by the respective cameras 31 and 32. Hence, there is an advantage that variances of the respective coordinate systems caused by thermal influences can be checked efficiently by a configuration as simple as taking images of the common position recognition marks M1 and M2 by the respective cameras 31 and 32.

Also, the second embodiment is configured in such a manner that the parameters ($\alpha_1$, $\theta_1$, and so forth) relating to the variances of the respective coordinate systems of the placing head 4 and the suction position recognition camera 32 are calculated and the component coordinate recognized by the suction position recognition camera 32 is converted to the component coordinate on the basis of the coordinate system of the placing head 4 after the variance through the coordinate conversion using the parameters so as to set again the converted component coordinate as the target point when the placing head 4 accesses the chip component 6 in the component supply portion 5. It thus becomes possible to exactly specify the position of the chip component 6 to be sucked with respect to the placing head 4 by the coordinate conversion using the parameters. Hence, there is an advantage that the suction accuracy of the chip component 6 by the placing head 4 can be enhanced more effectively.

The first embodiment above is configured in such a manner that the respective servo motors (18, 38, and so forth) driving the placing head 4 and the suction position recognition camera 32 are provided with the temperature sensors (18b, 38b, and so forth) that detect temperatures of the corresponding motors and variances of the respective coordinate systems of the placing head 4 and the suction position recognition camera 32 are checked when a range of rise of the detection temperatures in the temperature sensors (18b, 38b, and so forth) reaches a predetermined value. It thus becomes possible to detect variances of the respective coordinate systems of the placing head 4 and the suction position camera 32 because of thermal influences appropriately on the basis of the temperatures of the servomotors (18, 38, and so forth). Hence, there is an advantage that the processing to check variances of the respective coordinate systems can be performed appropriately on the basis of the detection result.

Third Embodiment

Figure 19:
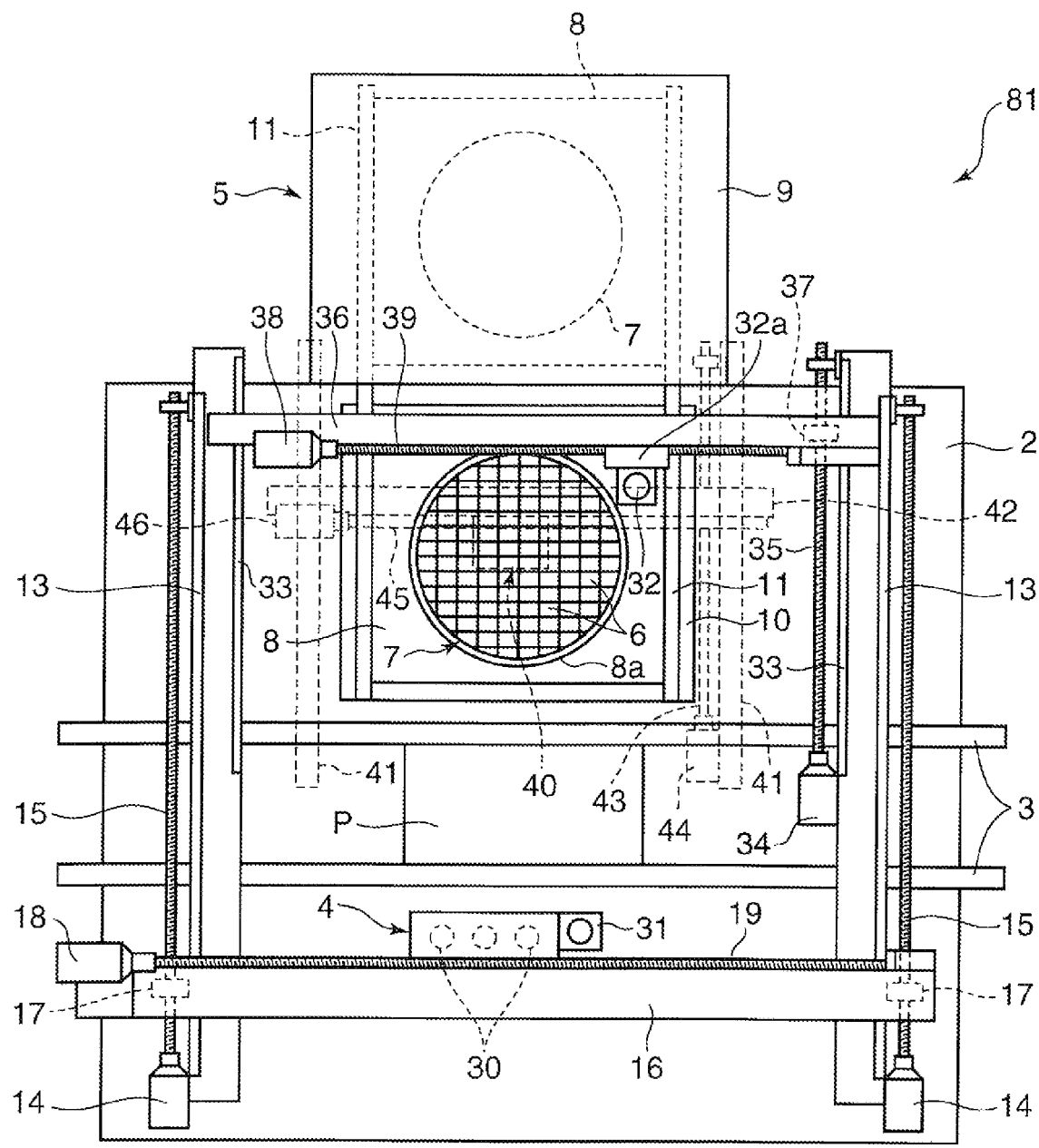
FIG. 19 is a plan view schematically showing a component mounting apparatus according to a third embodiment of the invention.

A third embodiment of the invention will now be described. FIG. 19 is a view showing a component mounting apparatus 81 according to the third embodiment. The component mounting apparatus 81 shown in the drawing is provided with a push-up unit 40 that pushes up a chip component 6 to be sucked from below during component suction by the placing head 4 below the wafer stage 10 of the component supply portion 5. The other fundamental structures are the same as those of the component mounting apparatuses 1 and 71 in the first and second embodiments above, respectively.

The push-up unit 40 is supported on the base stand 2 to be movable in the X axis direction and the Y axis direction, and is configured to move across a range corresponding to the wafer stage 10 of the component supply portion 5 when driven by a drive mechanism formed of a third X axis serve motor 46, a third Y axis servo motor 44, ball screw shafts 45 and 43, and so forth described below.

Figure 20:
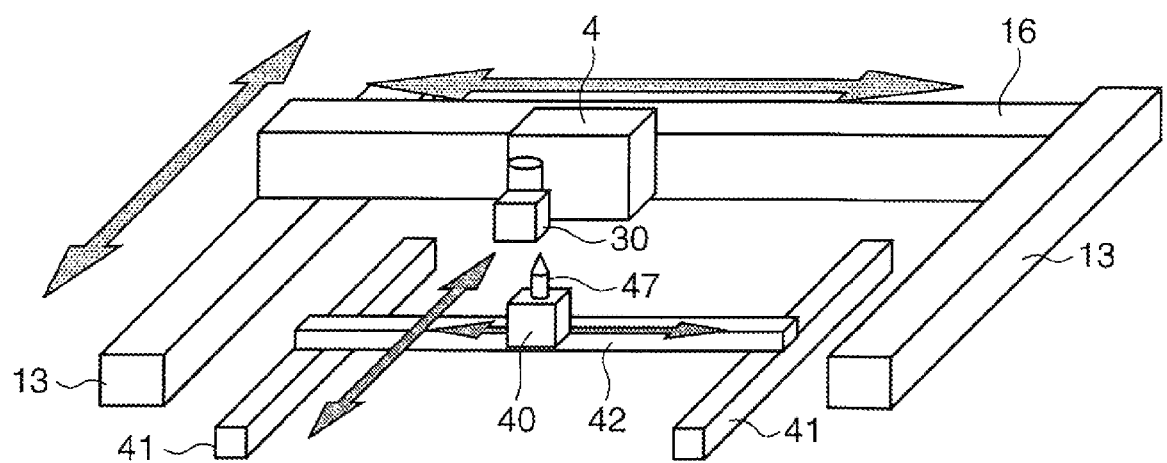
FIG. 20 is a perspective view schematically showing the configurations of respective drive mechanisms of the placing head and a push-up unit.

More specifically, as is indicated by a broken line in FIG. 19 and a schematic perspective view of FIG. 20, the push-up unit 40 is supported on a supporting frame 42 movable along a pair of guide rails 41 extending in the Y axis direction in a movable manner in the X axis direction. As the ball screw shaft 43 threaded into an unillustrated nut portion provided inside the supporting frame 42 is driven to rotate by the third Y axis servo motor 44, the push-up unit 40 together with the supporting frame 42 moves in the Y axis direction. Also, the ball screw shaft 45 threaded into an unillustrated nut portion provided inside the push-up unit 40 is provided to the supporting frame 42. It is configured in such a manner that the push-up unit 40 moves in the X axis direction when the ball screw shaft 45 is driven to rotate by the third X axis servo motor 46.

The push-up unit 40 has a push-up pin 47 and an unillustrated pin elevation mechanism that moves up and down the push-up pin 47. During the component suction by the placing head 4, the push-up unit 40 driven on the X-Y plane by the drive mechanism formed of the servo motor 46 and 44, the ball screw shafts 45 and 43, and so forth moves to a position corresponding to the placing head 4, and the push-up pin 47 moves up by the driving of the pin elevation mechanism so as to push up the chip component 6 via the wafer sheet 8a.

Figure 21:
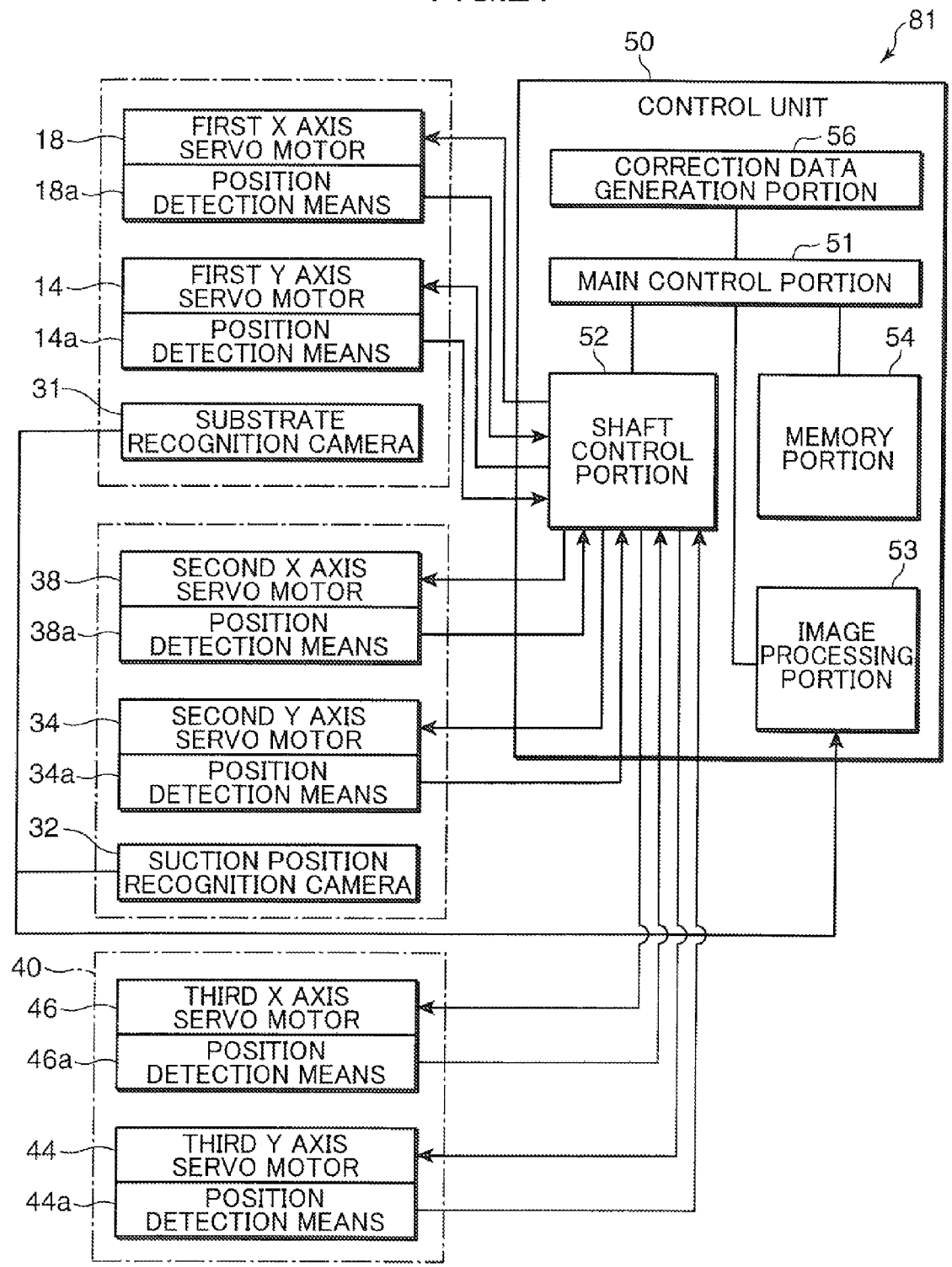
FIG. 21 is a block diagram showing a control system of the component mounting apparatus.

As is shown in the block diagram of FIG. 21, position detection means 46a and 44a formed of an encoder or the like are provided to the third X axis servo motor 46 and the third Y axis servo motor 44, respectively, and it is configured in such a manner that the logical position of the push-up unit 40 is recognized on the basis of the detection values of these means 46a and 44a.

Also, as is shown in FIG. 21, the control unit 50 of the third embodiment has a main control portion 51, a shaft control portion 52, an image processing portion 53, a memory portion 54, and a correction data generation portion 56 as the functional elements. Of these elements, the main control portion 51 has a function of systematically controlling the driving of the suction position recognition camera 32, the placing head 4, and the push-up unit 40. The correction data generation portion 56 generates data to correct the control by the main control portion 51. Functions of the other functional elements (the shaft control portion 52, the image processing portion 53, and the memory portion 54) are the same as those of the counterparts in the first and second embodiments above.

For example, when the placing head 4 sucks the chip component 6 from the component supply portion 5, the main control portion 51 controls the driving of the three elements, including the suction position recognition camera 32, the placing head 4, and the push-up unit 40, in such a manner that both the placing head 4 and the push-up unit 40 are moved to the component position detected on the basis of the imaging by the suction position recognition camera 32 and the placing head 4 sucks the chip component 6 while the chip component 6 is being pushed up by the push-up unit 40. In this instance, the main control portion 51 corrects the control on the respective drive mechanisms driving these three elements on the basis of the correction data generated in the correction data generation portion 56.

A concrete content of the processing by the main control portion 51 and the correction data generation portion 56 will now be described with reference to FIG. 22 through FIG. 25.

Figure 22:
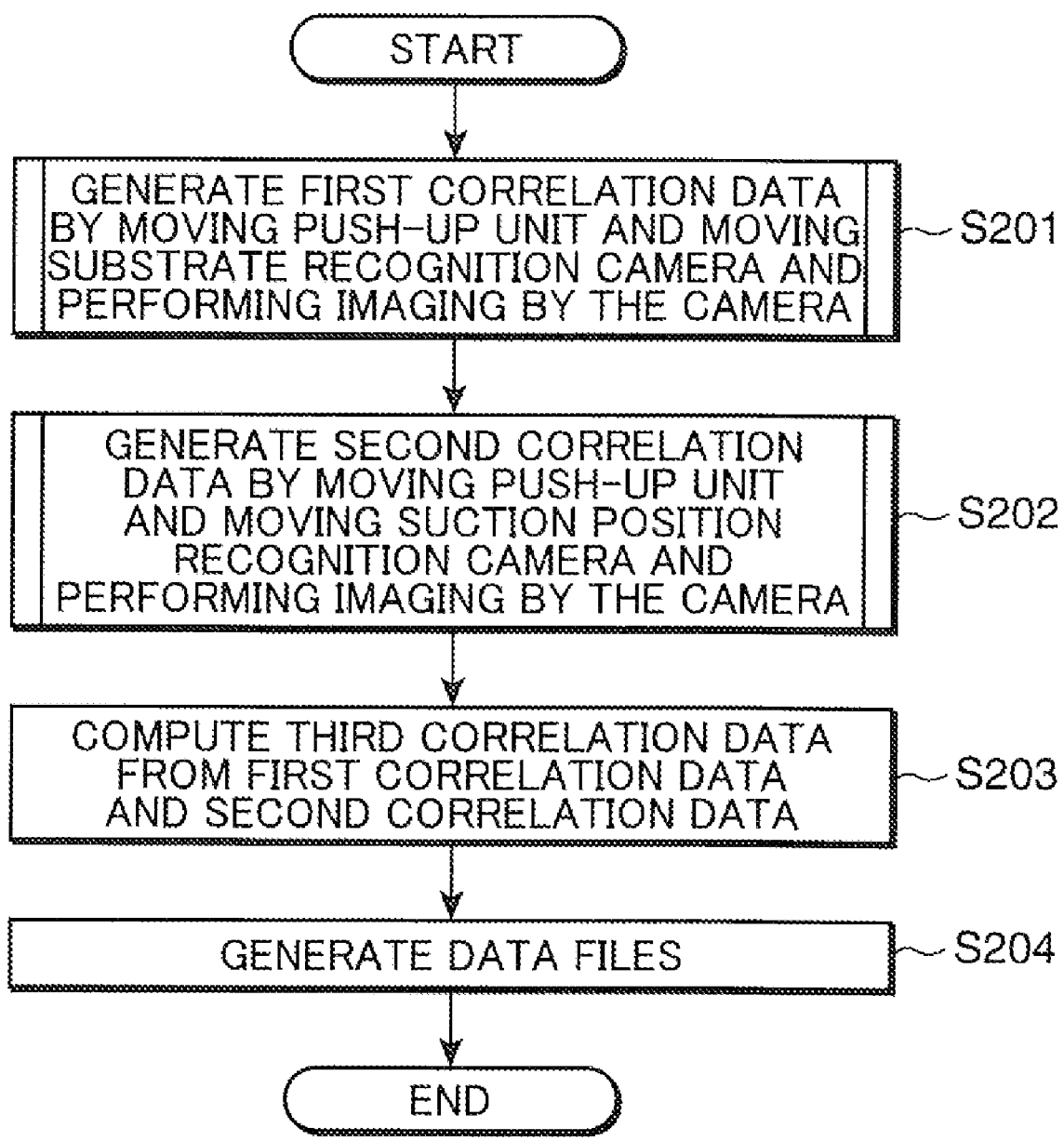
FIG. 22 is a flowchart schematically depicting control on correction data generation performed in the component mounting apparatus.

FIG. 22 is a flowchart schematically depicting the processing by the correction data generation portion 56. This processing is performed before the component mounting, such as when the operation of the mounting apparatus 81 is started. When this processing is performed, the mounting apparatus 81 is in a state where the wafer holding frame 8 is not set on the wafer stage 10.

When this processing is started, the control unit 50 initially generates first correlation data indicating a correlation of the respective coordinate systems of the placing head 4 and the push-up unit 40, that is, a correlation of the coordinate system on the basis of the detection values of the position detection means 18a and 14a provided to the drive mechanism for the placing head 4 and the coordinate system on the basis of the detection values of the position detection means 46a and 44a provided to the drive mechanism for the push-up unit 40, by moving the push-up unit 40 and by moving the substrate recognition camera 31 and performing imaging by the camera 31 in Step S201.

Figure 23:
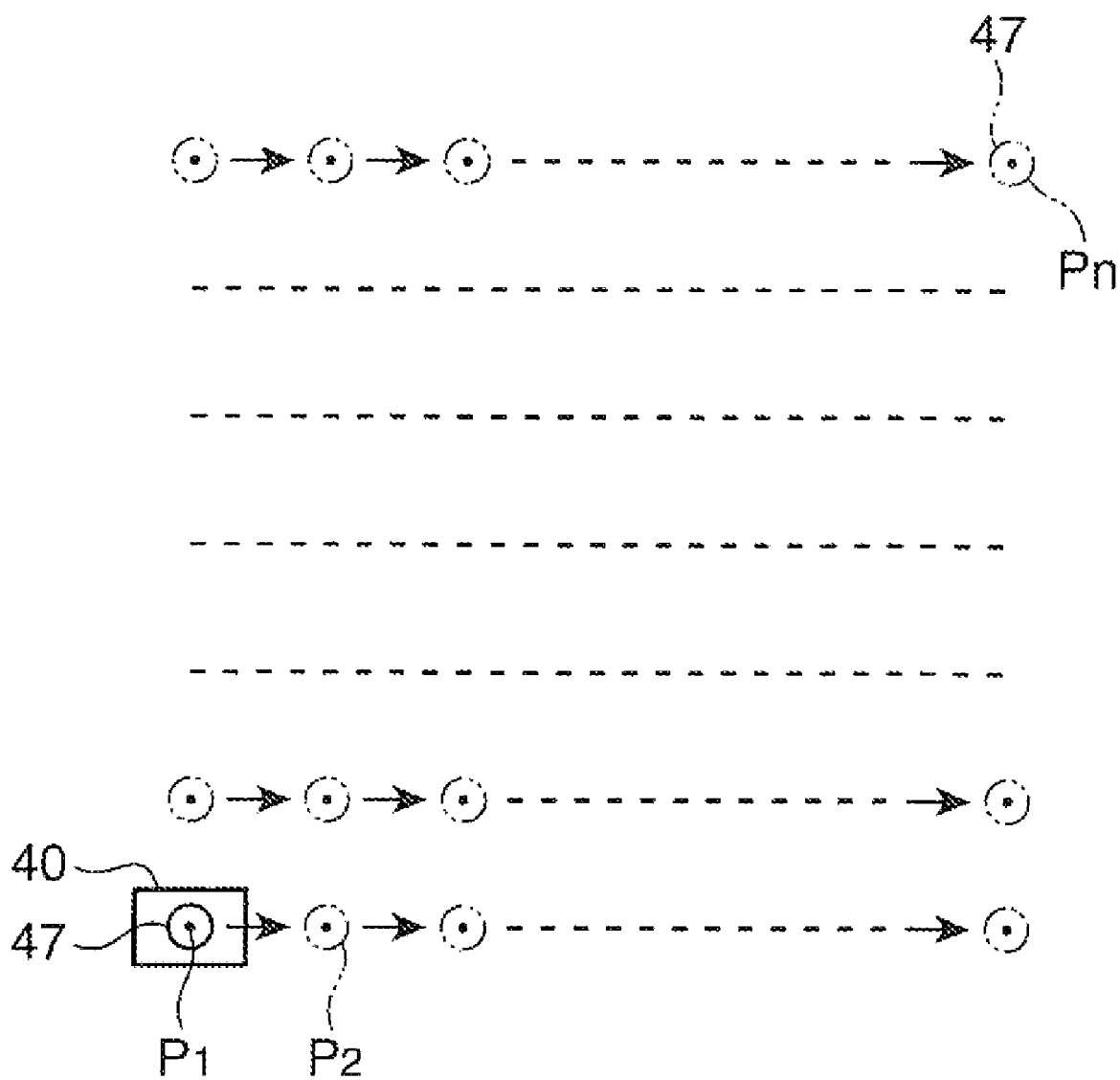
FIG. 23 is a view used to describe an operation to move the push-up unit to a plurality of points during the control on correction data generation.

As is shown in the explanatory view of FIG. 23, by the processing in Step S1, both the substrate recognition camera 31 and the push-up unit 40 are moved to a plurality of points (P1, P2, . . . , and Pn) set in a matrix fashion, and an image of the specific point of the push-up unit 40 is taken by the substrate recognizing camera 31 at each point. In this embodiment, an image of the tip end of the push-up pin 47 is taken as the specific point. A displacement between the respective coordinate systems of the placing head 4 and the push-up unit 40 is checked on the basis of the imaging and the first correlation data is generated from the displacement at each point.

Figure 24:
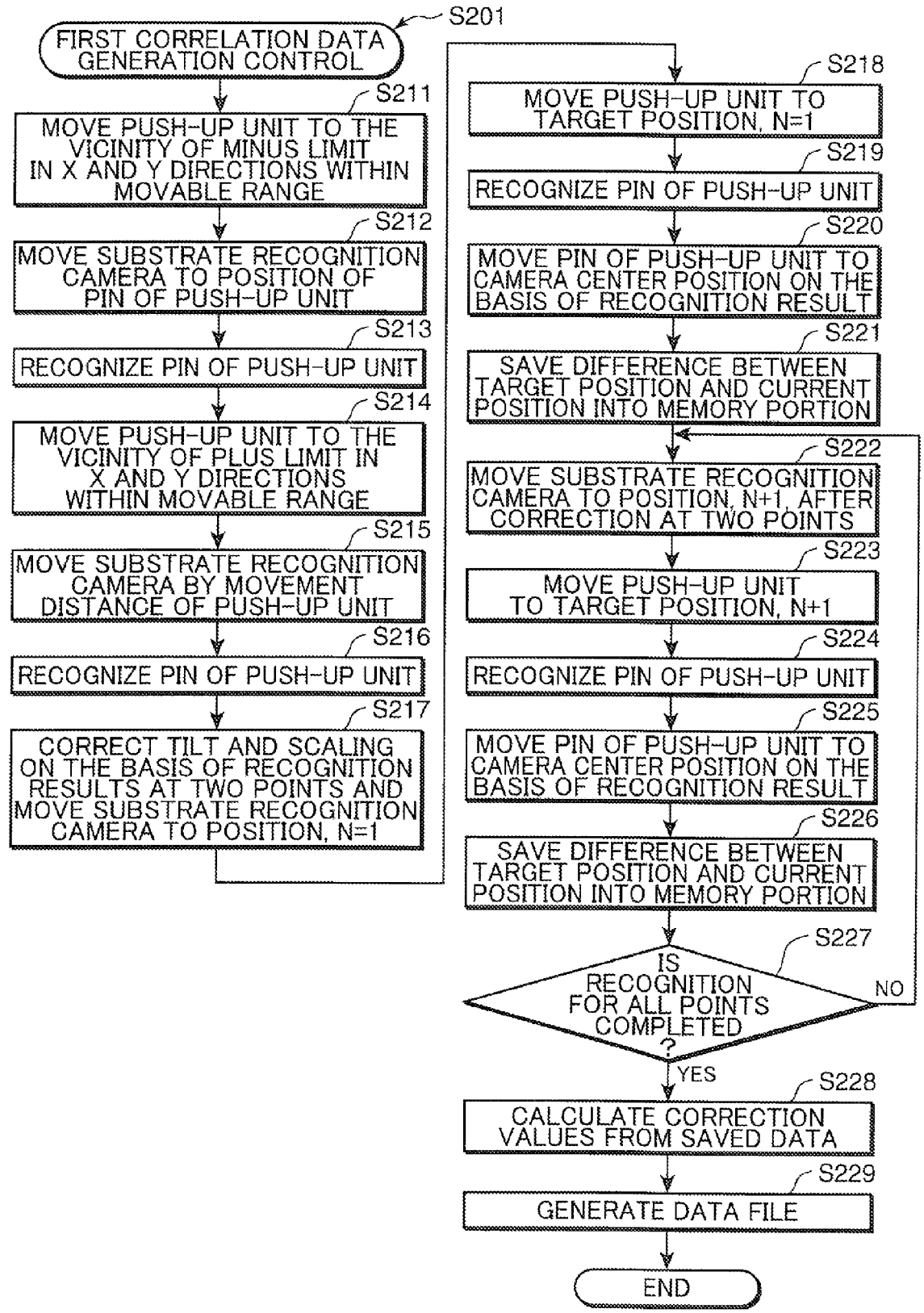
FIG. 24 is a sub-routine depicting a concrete content of processing performed in Step S201 of FIG. 22.

To be more concrete, control to generate the first correlation data as is shown in FIG. 24 is executed in Step S201.

That is, the control unit 50 initially moves the push-up unit 40 to the vicinity of the minus limit (the terminal ends on the minus side in the X direction and on the minus side in the Y direction) within a movable range of the push-up unit 40 (Step S211). Subsequently, the control unit 50 controls the driving of the placing head 4 so that the substrate recognition camera 31 provided to the placing head 4 is moved to the position of the push-up pin 47 and teaches this position (Step S212). The control unit 50 then performs the imaging and the recognition of the push-pin 47 at this position using the substrate recognition camera 31 (Step S213).

Subsequently, the control unit 50 moves the push-up unit 40 to the vicinity of the plus limit (the terminal ends on the plus side in the X direction and on the plus side in the Y direction) within a movable range of the push-up unit 40 (Step S214). The control unit 50 then moves the substrate recognition camera 31 by a movement distance of the push-up unit 40 (Step S215) and performs the imaging and the recognition of the push-up pin 47 at this point using the substrate recognition camera 31 (Step S216).

Subsequently, the control unit 50 corrects the tilt and the scaling of the coordinate system of the placing head 4 on the basis of the recognition results at the two points and then moves the substrate recognition camera 31 to the position, N=1 (first point) (Step S217). Subsequently, the control unit 50 moves the push-up unit 40 to the target position, N=1 (Step S218). The control unit 50 performs the imaging and the recognition of the push-up pin 47 at this point using the substrate recognition camera 31 (Step S219).

In a case where there is a displacement between the coordinate system of the placing head 4 and the coordinate system of the push-up unit 40, the push-up pin 47 is displaced from the center of the substrate recognition camera 31 (that is, the center of the imaging field of view of the camera 31), the control unit 50 moves the push-up pin 47 to the position of the camera center on the basis of the recognition result (Step S220). The control unit 50 then finds a difference between the target position and the current position and saves the difference into the memory portion 54 (Step S221).

This difference between the target position and the current position corresponds to a positional displacement between the push-up pin 47 and the substrate recognition camera 31 caused by a displacement between the both coordinate systems when the drive mechanisms of the push-up pin 47 and the substrate recognition camera 31 are controlled so as to move the push-up pin 47 and the substrate recognition camera 31 to the same point.

Thereafter, the control unit 50 moves the substrate recognition camera 31 to the position, N+1 (Step S222), and then moves the push-up unit 40 to the target position, N+1 (Step S223). The control unit 50 then performs the imaging and the recognition of the push-up pin 47 at this position using the substrate recognition camera 31 (Step S224). Further, the control unit 50 moves the push-up pin 47 to the position of the camera center on the basis of the recognition result (Step S225). The control unit 50 then finds a difference between the target position and the current position and saves this difference into the memory portion 54 (Step S226).

Subsequently, the control unit 50 determines whether the recognition is completed for all the points (all of the points P1, P2, ..., and Pn shown in FIG. 23) (Step S227). In a case where the recognition has not been completed, the control unit 50 repeats the processing in Steps S222 through S226 until the recognition is completed for all the points.

When the recognition has been completed for all the points, the control unit 50 calculates a correction value corresponding to the displacement between the coordinate system of the placing head 4 and the coordinate system of the push-up unit 40 from the data saved in the memory portion (Step S228). In this case, a difference between the target position and the current position is defined as the correction value at the respective points P1, P2, ..., and Pn and a correction value is found by an interpolation operation for other portions.

In this manner, by mapping correction values at many points corresponding to the chip components 6 of the wafer 7, the control unit 50 generates a data file of the correction values corresponding to the first correlation data (Step S229).

The processing in Steps S211 through S229 is performed in Step S201 of FIG. 22.

Subsequently, the control unit 50 generates second correlation data indicating a correlation of the coordinate system of the suction position recognition camera 32 and the coordinate system of the push-up unit 40 by moving the push-up unit 40 and by moving the suction position recognition camera 32 and performing imaging by the camera 32 in Step S202 of FIG. 22. In Step S202, the control unit 50 performs the same processing as in Step S211 through S229 of FIG. 24 except that the substrate recognition camera 31 is replaced with the suction position recognition camera 32.

Further, in Step S203, the control unit 50 finds third correlation data indicating a correction of the coordinate system of the placing head 4 and the coordinate system of the suction position recognition camera 32 from the first correlation data and the second correlation data through an operation. In this case, let $\Delta X1$ and $\Delta Y1$ be correction values comparable to a displacement between the coordinate systems of the placing head 4 and the push-up unit 40 and $\Delta X2$ and $\Delta Y2$ be correction values comparable to a displacement between the respective coordinate systems of the suction position recognition camera 32 and the push-up unit 40, then a correction value comparable to a displacement between the respective coordinate systems of the placing head 4 and the suction position recognition camera 32 is found to be $\Delta X3=\Delta X1-\Delta X2$ and $\Delta Y3=\Delta Y2-\Delta Y1$. By finding correction values at the respective points by an operation as above, the control unit 50 generates a data file of correction values corresponding to the third correlation data (Step S204).

Figure 25:
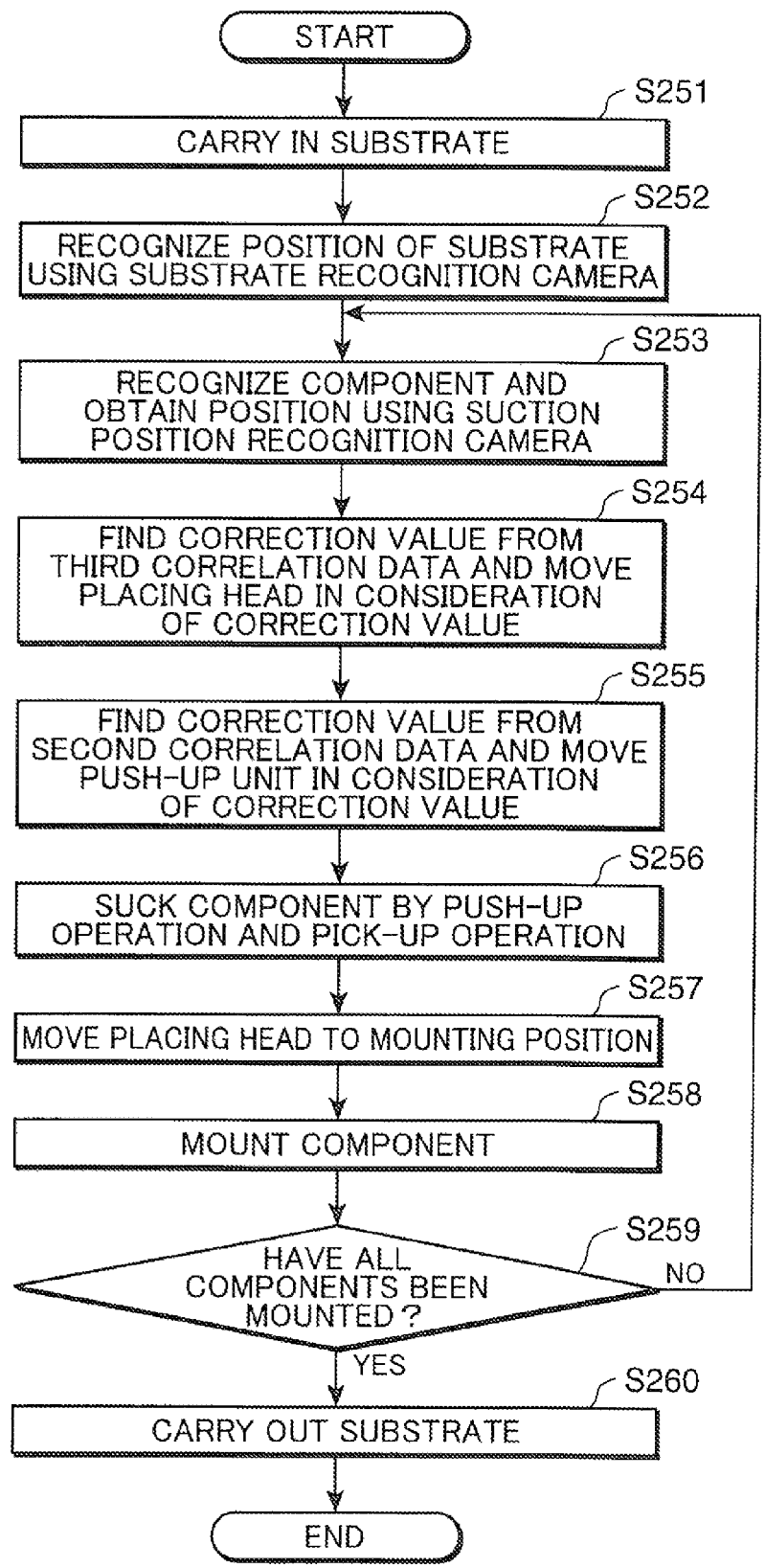
FIG. 25 is a flowchart depicting control on component suction and mounting performed in the component mounting apparatus.

FIG. 25 is a flowchart depicting the content of the processing by the main control portion 51. When this processing is performed, the wafer holding frame 8 holding the wafer sheet 8a attached with the wafer 7 is set on the wafer stage 10 and the mounting apparatus 81 is therefore in a state where the chip components 6 are extractable.

When this processing is started, the control unit 50 initially executes control to carry in the substrate P to the mounting work position shown in FIG. 19 by actuating the conveyor 3 (Step S251). Subsequently, the control unit 50 executes control to recognize the position of the substrate P placed in position at the mounting work position by moving the substrate recognition camera 31 together with the placing head 4 above the substrate P and taking an image of the fiducial mark for position recognition put on the top surface of the substrate P using the substrate recognition camera 31 (Step S252).

Subsequently, the control unit 50 executes control to recognize the position of a component 6 to be sucked among many chip components 6, 6, and so on contained in the wafer 7 on the wafer stage 10 by moving the suction position recognition camera 32 above the wafer stage 10 of the component supply portion 5 and by taking an image of this component to be sucked using the suction position recognition camera 32 (Step S253).

When the position of the component to be sucked is recognized, the control unit 50 finds a correction value at the position of the component to be sucked from the data file of the correction values corresponding to the third correlation data generated in Step S204 described above and moves the placing head 4 to the position of the component to be sucked in consideration of this correction value (Step S254).

Also, the control unit 50 finds a correction value at the position of the component to be sucked from the data file of correction values corresponding to the second correlation data generated in Step S202 described above and moves the push-up unit 40 to the position of the component to be sucked in consideration of this correction value (Step S255).

When the placing head 4 and the push-up unit 40 have moved to the suction position in this manner, the control unit 50 executes control to push up the chip component 6 by moving up the push-up pin 47 of the push-up unit 40 and to let the chip component 6 be sucked by the corresponding nozzle unit 30 of the placing head 4 by moving down the nozzle unit 30 (Step S256).

Subsequently, the control unit 50 executes control to move the placing head 4 above the mounting point on the substrate P (Step S257) and to mount the chip component 6 sucked at the lower end portion of the nozzle unit 30 of the placing head 4 on the substrate P by moving down the nozzle unit 30 (Step S258). It should be noted that the exact position of the mounting point on the substrate P is determined on the basis of the position of the substrate P recognized by the substrate recognition camera 31 in Step S252 above.

When the mounting operation of the chip component 6 by the placing head 4 is completed, the control unit 50 determines whether all the chip components 6 to be mounted on the substrate P have been mounted (Step S259). In a case where the determination result is NO and the presence of a chip component 6 to be mounted is confirmed, the control unit 50 returns to Step S253 to repeat the processing thereafter in order to mount this chip component 6 on the substrate P.

Meanwhile, in a case where the determination result in Step S259 is YES and it is confirmed that all the chip components 6 to be mounted on the substrate P have been mounted, the control unit 50 carries out the substrate P to the outside of the apparatus by actuating the conveyor 3 (Step S260).

As has been described, according to the third embodiment, in the component mounting apparatus 81 that sucks and transports a chip component 6 supplied from the component supply portion 5 using the movable placing head 4 and mounts (places) the chip component 6 on a substrate P spaced apart by a predetermined distance, it becomes possible to suck the chip component 6 appropriately by moving the placing head 4 and the push-up unit 40 exactly to the recognized suction position while efficiently performing the suction position recognition by the suction position recognition camera 32 that is movable independently of the placing head 4.

In particular, by the processing (FIG. 22 and FIG. 24) performed by the correction data generation portion 56, the data file (first correlation data) of correction values comparable to a displacement between the respective coordinate systems of the placing head 4 and the push-up head 40, the data file (second correlation data) of correction values comparable to a displacement between the respective coordinate systems of the suction position recognition camera 32 and the push-up unit 40, and the data file (third correlation data) of correction values comparable to a displacement between the respective coordinate systems of the placing head 4 and the suction position recognition camera 32 are generated in advance. During component suction, an amount of movement of the placing head 4 and an amount of movement of the push-up unit 40 to the recognized suction position are corrected with the correction value found from the second correlation data and the correction value found from the third correlation data in Steps S254 and S255 of FIG. 25. Hence, even in a case where there are mutual displacements among the coordinate systems of the placing head 4, the push-up unit 40, and the suction position recognition camera 32, the placing head 4 and the push-up 40 are placed in position correctly with respect to a chip component 6 to be sucked. It thus becomes possible to perform the pushing-up of the chip component 6 by the push-up pin 47 and the suction of the chip component 6 by the placing head 4 precisely.

Fourth Embodiment

Figure 26:
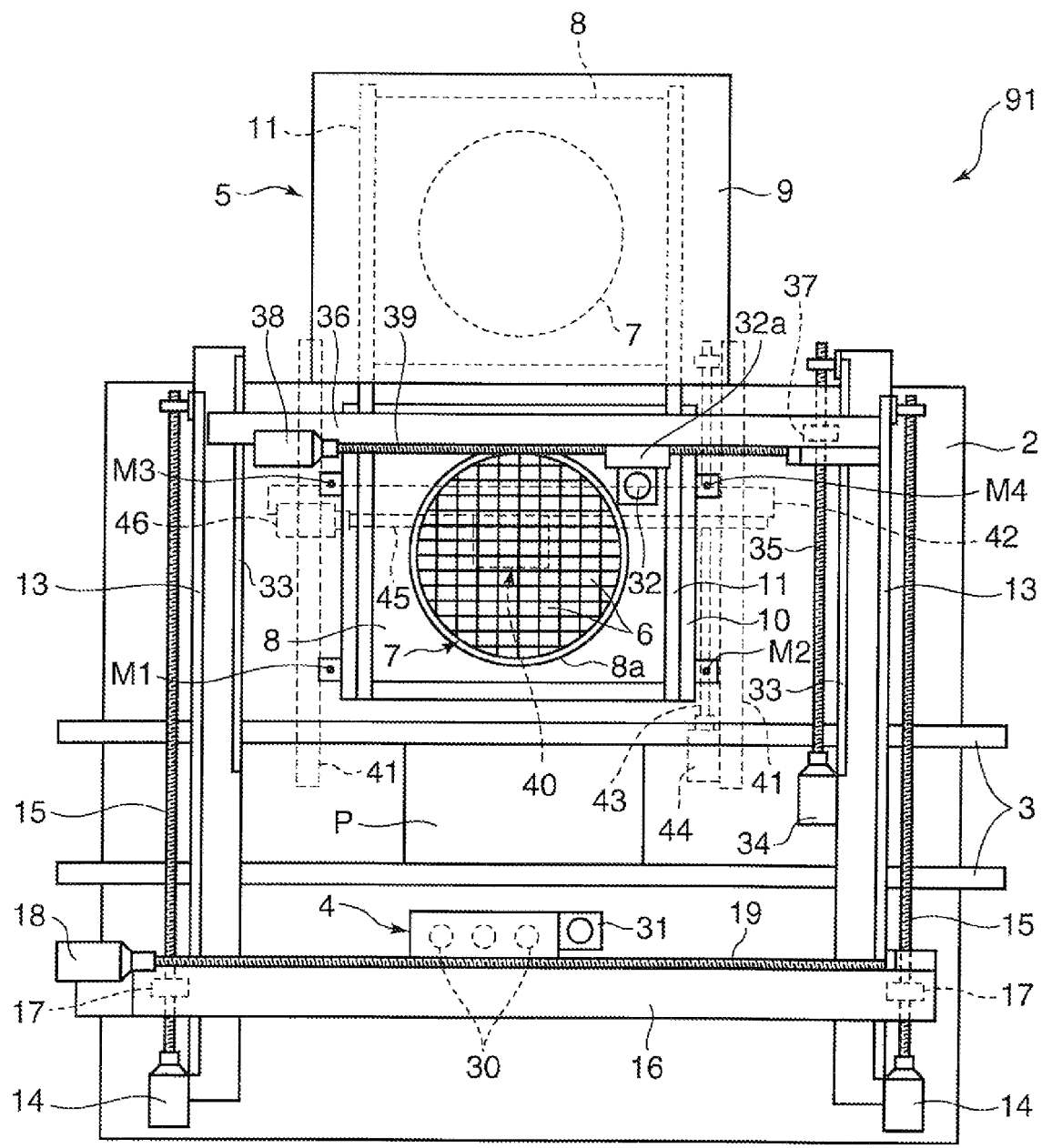
FIG. 26 is a plan view schematically showing a component mounting apparatus according to a fourth embodiment of the invention.
Figure 26:
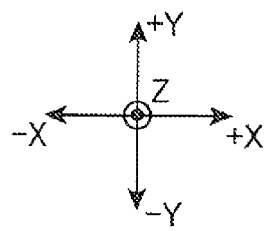
Figure 27:
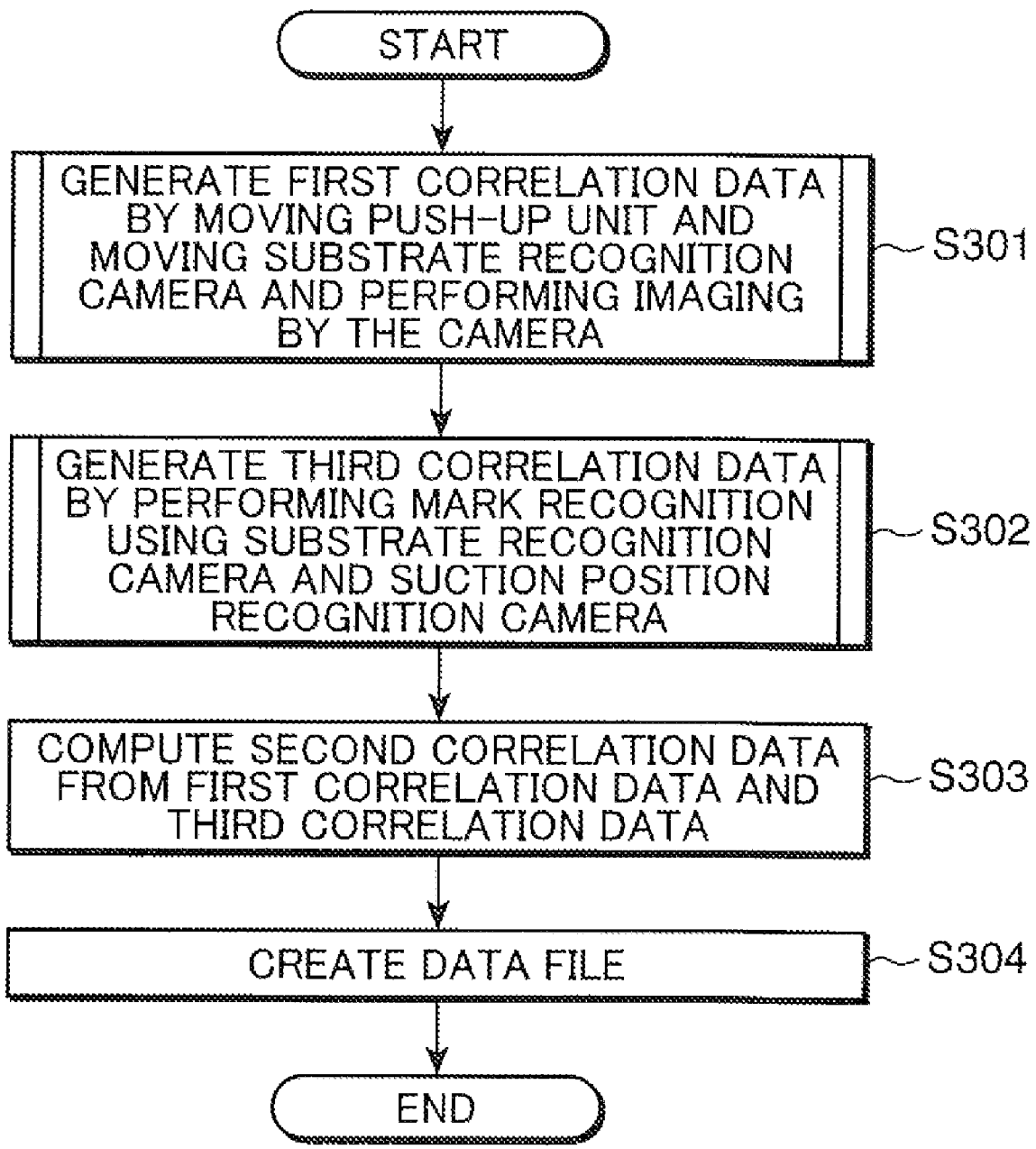
FIG. 27 is a flowchart schematically depicting control on correction data generation in the fourth embodiment.
Figure 28:
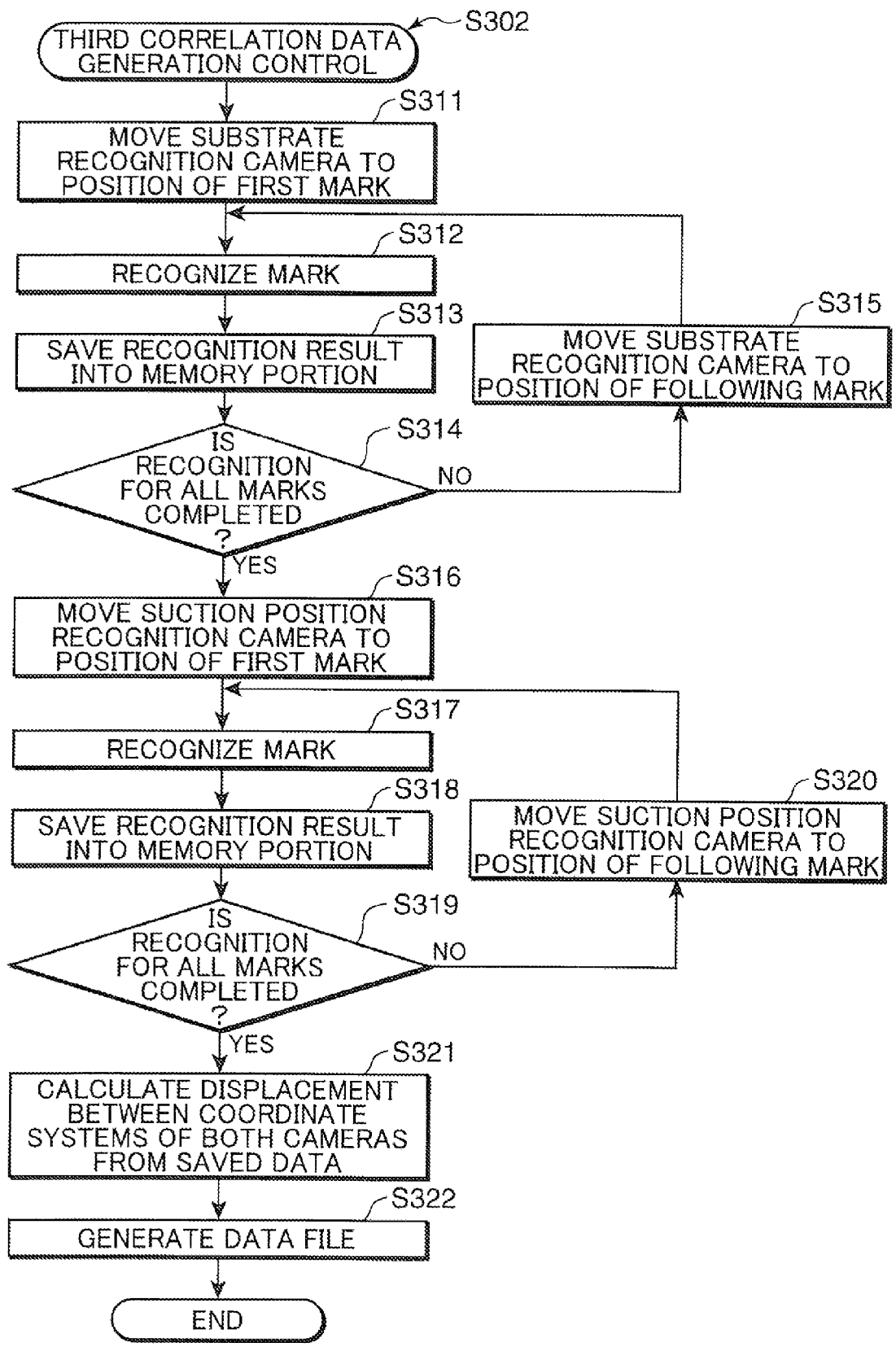
FIG. 28 is a sub-routine depicting a concrete content of processing performed in Step S302 of FIG. 27.

FIG. 26 through FIG. 28 show a fourth embodiment of the invention. As is shown in FIG. 26, in a component mounting apparatus 91 of this embodiment, marks are preliminarily put to a plurality of fixed points in the component supply portion 5. For example, marks M1, M2, M3, and M4 are put to particular four points on the right, left, front, and rear of the wafer stage 10.

The summary of the processing by the correction data generation portion 56 (FIG. 21) is carried out as depicted in the flowchart of FIG. 27. When this processing is started, in Step S301, the control unit 50 initially generates the first correlation data indicating the correlation of the coordinate system of the placing head 4 and the coordinate system of the push-up unit 40 by moving the push-up unit 40 and by moving the substrate recognition camera 31 and performing imaging by the camera 31. This processing is carried out as depicted in the flowchart of FIG. 24 described above.

Subsequently, in Step S302, the control unit 50 generates the third correlation data by performing mark recognition using both the substrate recognition camera 31 and the suction position recognition camera 32.

To be more concrete, the control of the third correlation data generation is performed as depicted in FIG. 28.

That is, the control unit 50 initially moves the substrate recognition camera 31 to the position of the first mark M1 (Step S311) so that the mark M1 is recognized (Step S312). The control unit 50 then saves the recognition result, that is, the mark position recognized on the basis of the imaging by the substrate recognition camera 31, into the memory portion 54 (Step S313). Subsequently, the control unit 50 determines whether the recognition of all the marks (M1 through M4) is completed (Step S314). In a case where the recognition has not been completed, the control unit 50 moves the substrate recognition camera 31 to the position of the following mark (Step S315) and repeats the processing in Steps S312 and S313 until the recognition of all the marks is completed.

When the recognition of all the marks by the substrate recognition camera 31 is completed, the control unit 50 subsequently moves the suction position recognition camera 32 to the position of the first mark M1 (Step S316). The control unit 50 then has this mark M1 be recognized (Step S317) and saves the recognition result (the mark position recognized on the basis of the imaging by the suction position recognition camera) into the memory portion 54 (Step S318). In a case where the recognition of all the marks (M1 through M4) has not been completed, the control unit 50 moves the suction position recognition camera 32 to the position of the following mark (Step S319 and Step S320) and repeats the processing in Steps S317 and S318 until the recognition of all the marks is completed.

When the recognition of all the marks by the suction position recognition camera 32 is also completed, the control unit 50 calculates a displacement between the coordinate systems of the both cameras (that is, the respective coordinate systems of the placing head 4 and the suction position recognition camera 32) on the basis of differences between the recognized positions by the substrate recognition camera 31 and the recognized positions by the suction position recognition camera 32 regarding the respective marks M1 through M4 from the saved data (Step S321) and generates a data file of the correction values corresponding to the respective displacements (Step S322). Correction values at the respective points within the wafer placement region other than the mark positions specified above are found by an interpolation operation using the correction values at the mark positions.

The processing in Step S311 through S322 as has been described is performed in Step S302 of FIG. 27.

Subsequently, in Step S303 of FIG. 27, the control unit 50 finds the second correlation data indicating the correlation of the coordinate system of the suction position recognition camera 32 and the coordinate system of the push-up unit 40 from the first correlation data and the third correlation data. In other words, the control unit 50 computes a correction value comparable to a displacement between the coordinate system of the suction position recognition camera 32 and the coordinate system of the push-up unit 40 from the correction values in the data file generated in Step S301 and the correction values in the data file generated in Step S302 and generates a data file corresponding to the second correlation data (Step S304).

In the fourth embodiment as described above, too, the control on the component suction by the main control portion 51 (FIG. 21) is executed as is depicted in FIG. 25 in the same manner as the third embodiment above. Accordingly, the placing head 4 and the push-up head 40 are placed in position correctly with respect to a chip component 6 to be sucked. It thus becomes possible to perform the pushing-up of the chip component 6 by the push-up pin 47 and the suction of the chip component 6 by the placing head 4 precisely.

Fifth Embodiment

Figure 29:
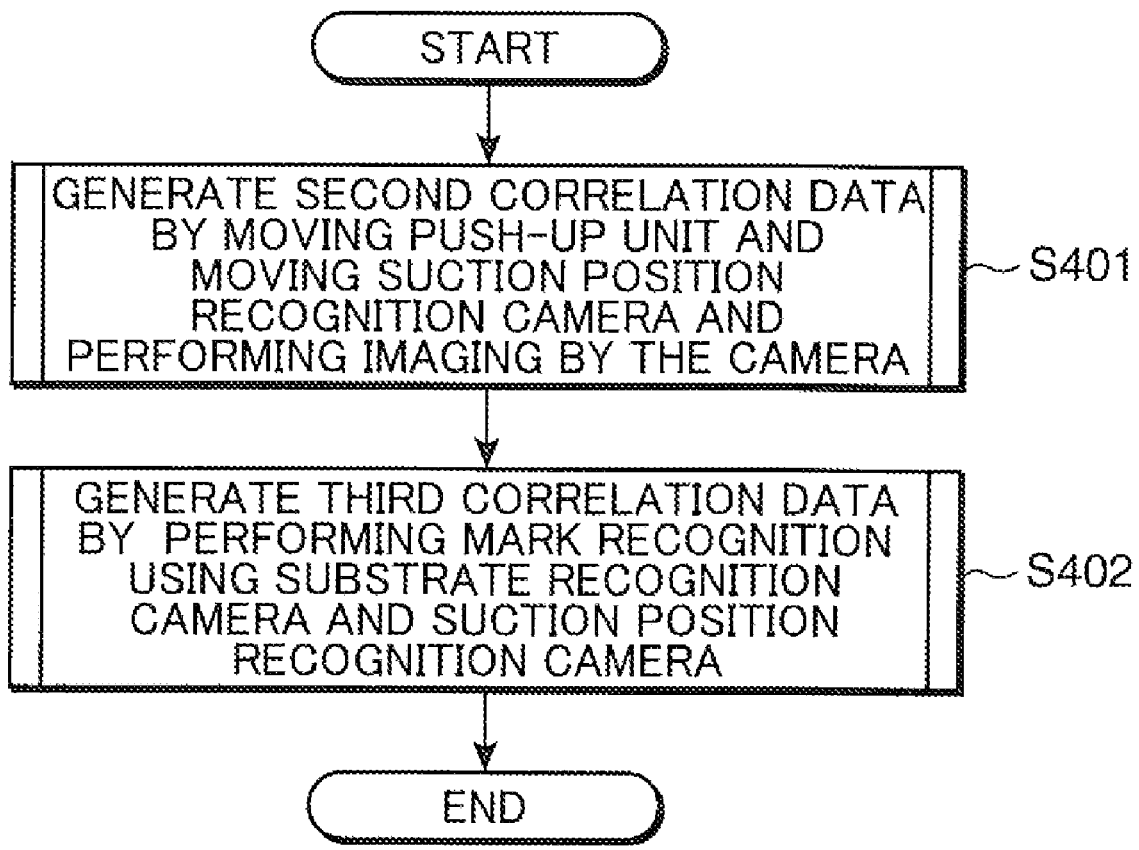
FIG. 29 is a flowchart schematically depicting control on correction data generation according to a fifth embodiment of the invention.

FIG. 29 is a view used to describe a fifth embodiment of the invention and it shows a flowchart depicting the content of the processing by the correction data generation portion 56. When this flowchart is started, in Step S401, the control unit 50 initially generates the second correlation data indicating the correlation of the coordinate system of the suction position recognition camera 32 and the coordinate system of the push-up unit 40 by moving the push-up unit 40 and moving the suction position recognition camera 32 and performing imaging by the camera 32. This processing is the same as the processing in Step S202 of FIG. 22 described above.

Subsequently, the control unit 50 generates the third correlation data by performing mark recognition using both the substrate recognition camera 31 and the suction position recognition camera 32 in Step S402. This processing is the same as the processing in S302 of FIG. 27 described above and the concrete content is depicted in FIG. 28.

In this manner, in the third embodiment, the data file (second correction data) of the correction values corresponding to a displacement between the respective coordinate systems of the suction position recognition camera 32 and the push-up unit 40 and the date file (third correlation data) of the correction values corresponding to a displacement between the respective coordinate systems of the placing head 4 and the suction position recognition camera 32 are generated on the basis of recognition by the cameras.

In this case, too, the control on the component suction by the main control portion 51 is carried out as is depicted in FIG. 25 described above. Accordingly, the placing head 4 and the push-up head 40 are placed in position correctly with respect to a chip component 6 to be sucked. It thus become possible to perform the pushing-up of the chip component 6 by the push-up pin 47 and the suction of the chip component 6 by the placing head 4 precisely.

It is possible to correct an amount of movement of the placing head 4 and an amount of movement of the push-up unit 40 by the control depicted in FIG. 25 when at least the correction value found from the third correlation data and the correction value found from the second correlation data are known. Hence, in a case where the second correlation data and the third correlation data are generated on the basis of the recognition by the cameras as in the fifth embodiment, there is no need to find the first correlation data.

Sixth Embodiment

Figure 30:
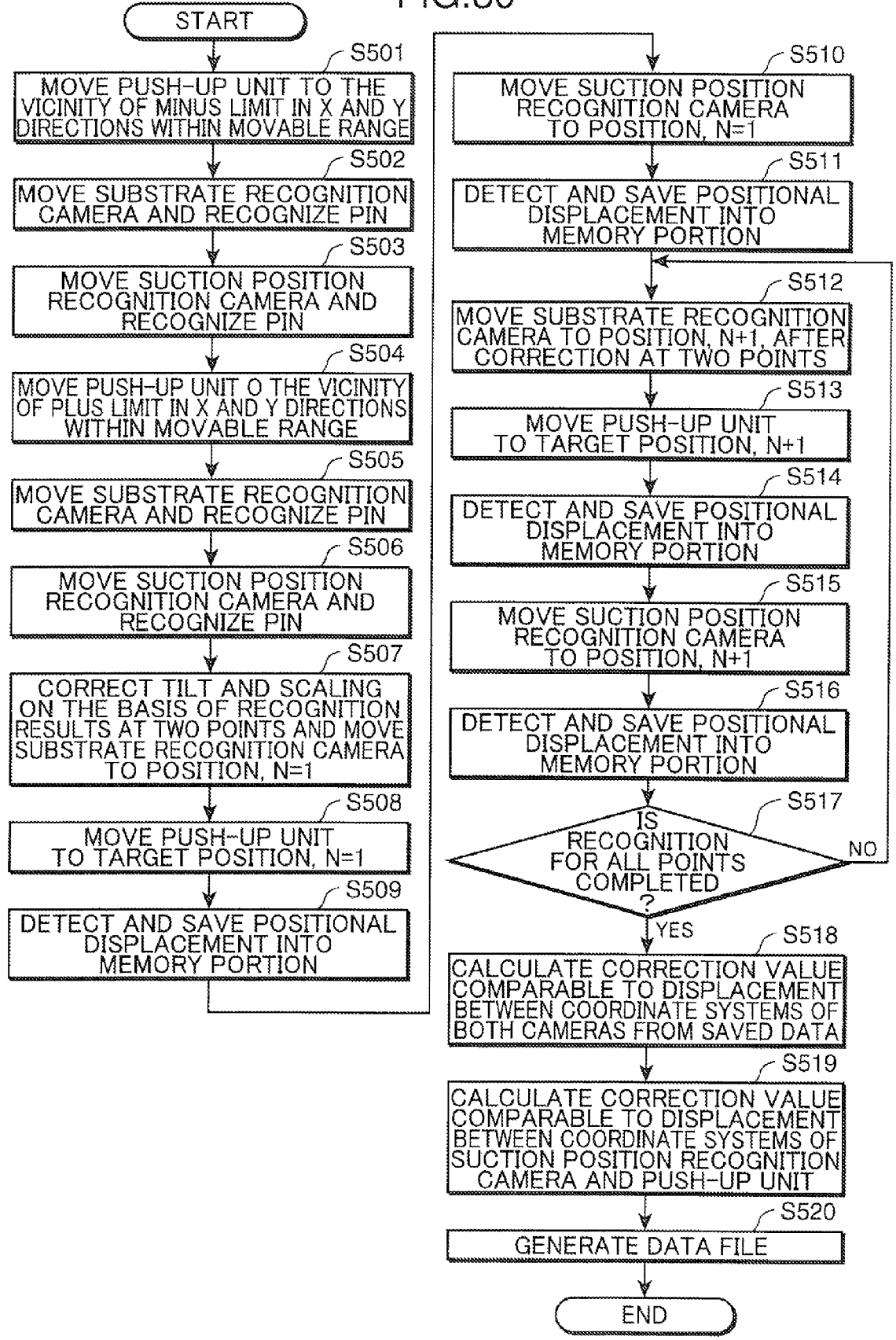
FIG. 30 is a flowchart depicting control on correction data generation according to a sixth embodiment of the invention.

FIG. 30 is a view used to describe a sixth embodiment of the invention and it shows a flowchart depicting the content of the processing by the correction data generation portion 56. When this flowchart is started, the control unit 50 initially moves the push-up unit 40 to the vicinity of the minus limit within a movable range thereof (Step S501). Subsequently, the control unit 50 moves the substrate recognition camera 31 provided to the placing head 4 to the position of the push-up pin 47 and performs imaging and recognition of the push-up pin 47 (Step S502). Subsequently, the control unit 50 evacuates the substrate recognition camera 31 and moves the suction position recognition camera 32 to the position of the push-up pin 47 and performs imaging and recognition of the push-up pin 47 (Step S503).

Subsequently, the control unit 50 moves the push-up unit 40 to the vicinity of the plus limit within a movable range thereof (Step S504). Subsequently, the control unit 50 moves the substrate recognition camera 31 to the position of the push-up pin 47 and performs imaging and recognition of the push-up pin 47 (Step S505). Subsequently, the control unit 50 evacuates the substrate recognition camera 31 and moves the suction position recognition camera 32 to the position of the push-up pin 47 and performs imaging and recognition of the push-up pin 47 (Step S506).

Subsequently, the control unit 50 corrects the tilt and the scaling of the coordinate system of the placing head 4 on the basis of the recognition results at the two points specified above. The control unit 50 then moves the substrate recognition camera 31 to the position, N=1 (Step S507) and subsequently moves the push-up unit 40 to the target position, N=1 (Step S508). Subsequently, the control unit 50 detects a positional displacement (a difference between the target position and the actual position) of the push-up pin 47 with respect to the substrate recognition camera 31 by the processing same as the processing in Steps S219 through S221 of FIG. 24 described above and saves the positional displacement into the memory portion 54 (Step S509).

Subsequently, the control unit 50 evacuates the substrate recognition camera 31 and moves the suction position recognition camera 32 to the position, N=1 (Step S510). The control unit 50 then detects a positional displacement of the push-up pin with respect to the suction position recognition camera 32 and saves the positional displacement into the memory portion 54 by the processing same as the processing in Step S509 (Steps S219 through S212 of FIG. 24) except that the substrate recognition camera 31 is replaced with the suction position recognition camera 32 (Step S511).

Thereafter, the control unit 50 moves the substrate recognition camera 31 to the position, N+1 (Step S512) and then moves the push-up unit 40 to the target position, N+1 (Step S513). The control unit 50 then detects a positional displacement of the push-up pin 47 with respect to the substrate recognition camera 31 and saves the positional displacement into the memory portion 54 (Step S514).

Subsequently, the control unit 50 evacuates the substrate recognition camera 31 and moves the suction position recognition camera 32 to the following position, N+1, (Step S515) and detects a positional displacement of the push-up pin 47 with respect to the suction position recognition camera 32 and saves the positional displacement into the memory portion 54 (Step S516).

Subsequently, the control unit 50 determines whether the recognition is completed for all the points (P1, P2, . . . and Pn) (Step S517). In a case where the recognition has not been completed, the control unit 50 repeats the processing in Step S512 through S516 until the recognition for all the points is completed.

When the recognition for all the points is completed, the control unit 50 calculates a correction value comparable to a displacement between the coordinate systems of the both cameras (that is, the respective coordinate systems of the placing head 4 and the suction position recognition camera 32) on the basis of the positional displacement of the push-up pin 47 with respect to the substrate recognition camera 31 and the positional displacement of the push-up pin 47 with respect to the suction position recognition camera 32 from the data saved in the storage portion 54 (Step S 518). Further, the control unit 50 calculates a correction value comparable to a displacement between the respective coordinate systems of the suction position recognition camera 32 and the push-up unit 40 (Step S519).

The control unit 50 then generates a data file (corresponding to the third correlation data) of the correction values found in Step S518 and a data file (corresponding to the second correlation data) of correction values found in Step S519 (Step S520).

As has been described, in the sixth embodiment, the recognition of the push-up pin 47 by the substrate recognition camera 31 and the recognition of the push-up pin 47 by the suction position recognition camera 32 are performed continuously at a plurality of points, and the data file (second correlation data) of correction values corresponding to a displacement between the respective coordinate systems of the suction position recognition camera 32 and the push-up unit 40 and the data file (third correlation data) of correction values corresponding to a displacement between the respective coordinates of the placing head 4 and the suction position recognition camera 32 are generated.

In this case, too, the control on the component suction by the main control portion 51 is executed as is depicted in FIG. 25 described above. Accordingly, the placing head 4 and the push-up head 40 are placed in position correctly with respect to a chip component 6 to be sucked. It thus becomes possible to perform the pushing-up of the chip component 6 by the push-up pin 47 and the suction of the chip component 6 by the placing head 4 precisely.

The third through sixth embodiments are configured in such a manner that the push-up pin 47 is recognized when imaging and recognition of a specific point of the push-up unit 40 are performed by the cameras (the substrate recognition camera 31 and the suction position recognition camera 32) according to the processing by the correction data generation portion 56. It should be appreciated, however, that a specific point other than the push-up pin 47, for example, a mark put on the push-up unit 40, may be recognized.

Figure 31:
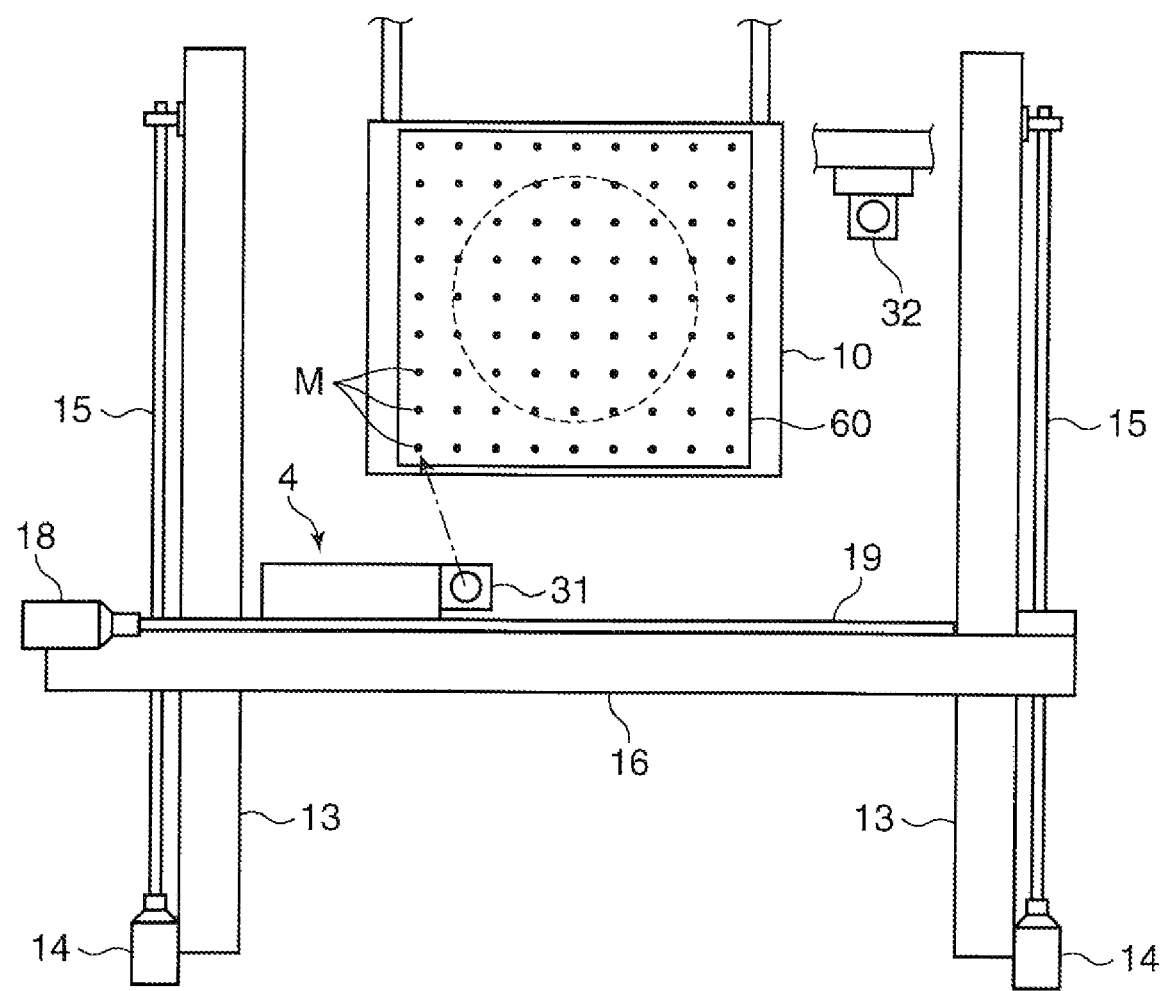
FIG. 31 is a plan view schematically showing a major portion of the component mounting apparatus in a state where a jig used in another example of the control on correction data generation is set.

Also, the fourth and fifth embodiments above are configured in such a manner that imaging and recognition of the marks fixedly provided inside the component supply portion 5 are performed by the substrate recognition camera 31 and the suction position recognition camera 32. However, instead of this configuration, a jig 60 set onto the wafer stage 10 in an attachable and detachable manner as shown in FIG. 31 may be used. The jig 60 is a square plate-like glass plate provided with many marks M at regular intervals in the X and Y directions. The jig 60 is set on the wafer stage 10 when processing by the correction data generation portion 56 is performed so that imaging and recognition of the respective marks M of the jig 60 are performed by both the cameras 31 and 32. When configured in this manner, by using the jig 60 preliminarily provided with many marks M exactly at regular intervals and by recognizing the positions of the marks M by both the cameras 31 and 32 in a state where the respective marks M are scattered across the entire wafer placement region on the wafer stage 10, it becomes possible to calibrate (that is, to calculate the third correlation data) of the coordinate systems of both the cameras 31 and 32 accurately.

Seventh Embodiment

The first through sixth embodiments above described a case where the configuration of the invention to correct an amount of movement of the placing head 4 on the basis of the correlation of the respective coordinate systems of the placing head 4 and the suction position recognition camera 32 is applied to the component mounting apparatuses 1, 71, and the like that transport a component (chip component 6) supplied from the component supply portion 5 and mount the component on a substrate P using the placing head 4. It should be appreciated, however, that applications of the configuration of the invention are not limited to the component mounting apparatus as above and the configuration of the invention is applicable extensively to a component placing apparatus of a type that transports a component by extracting the component from the component supply portion. For example, the configuration of the invention can be suitably applied to a component testing apparatus 200 shown in FIG. 32. Hereinafter, the component testing apparatus 200 will be described briefly.

Figure 32:
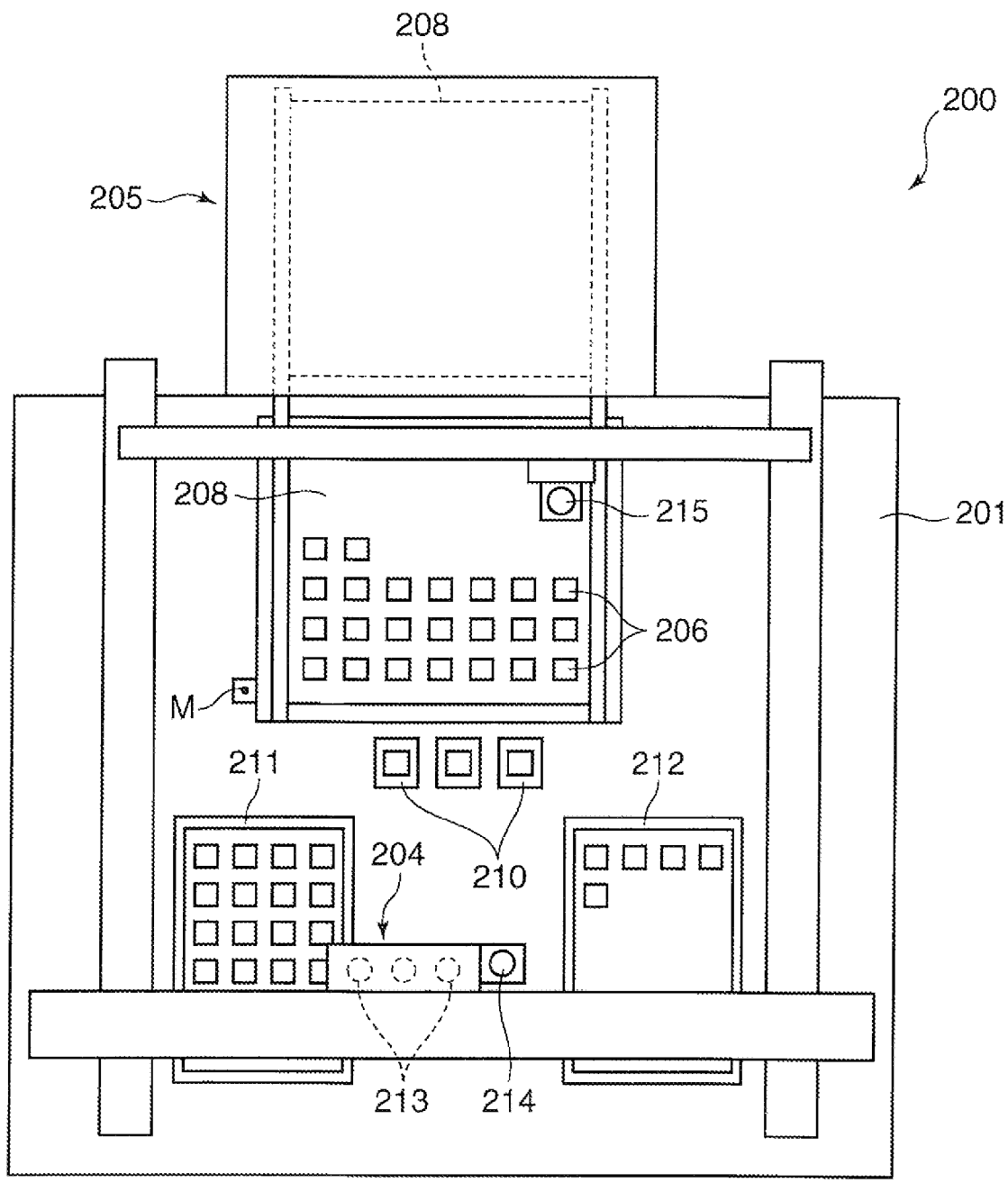
FIG. 32 is a plan view schematically showing a component testing apparatus according to a seventh embodiment of the invention.

As is shown in FIG. 32, on a base stand 201 of the component testing apparatus 200 are provided a component supply portion 205 formed of a tray feeder that supplies a plurality of components 206 subject to inspection in a state where they are placed on a tray 208, a plurality (three in the example of the drawing) of inspection sockets 210 (corresponding to a placement portion of the invention) that apply predetermined inspection processing, such as a conduction test, on a component 206 transported from the component supply portion 205, a conforming article tray 211 that accommodates a component 206 whose inspection result by the corresponding inspection socket 210 is satisfactory, and an inferior article tray 212 that accommodates a component 206 whose inspection result is poor.

Also, on the base stand 201 is provided a placing head 204 movable in the respective directions of the X and Y axes above the component supply portion 5, the conforming and inferior article trays 211 and 212, and the inspection sockets 210. It is configured in such a manner that the placing head 204 sucks components 206 supplied from the component supply portion 205 at the lower end portions of three nozzle units 213 and transports the components 206 to the respective inspection sockets 210, and holds the respective components 206 in a state where they are attached to the inspection sockets 210 while predetermined inspection processing is applied to the respective components 206 by the corresponding inspection sockets 210, after which it transports the respective components 206 from the inspection sockets 210 to either the conforming article tray 211 or the inferior article tray 212 depending on the inspection results. As with the placing head 4 of the first embodiment above, the placing head 204 is driven by a drive mechanism formed of servo motors, ball screw shafts, and so forth. However, the illustration of the drive mechanism is omitted in FIG. 32.

To the placing head 204 is attached an inspection socket camera 214 (corresponding to the head-side imaging device of the invention) that takes images of the inspection sockets 210. It is configured in such a manner that the inspection socket camera 214 specifies exact positions of the three inspection sockets 210 by moving above the respective inspection sockets 210 together with the placing head 204 as one piece at predetermined timing, such as the start-up of the component testing apparatus 200, and taking an images of the respective inspection sockets 210

Meanwhile, a suction position recognition camera 215 (corresponding to the suction position imaging device of the invention) that takes images of the respective components 206 placed on the tray 208 is provided above the component supply portion 205. It is configured in such a manner that the suction position recognition camera 215 is allowed to move in the respective directions of the X and Y axes independently of the placing head 204 when driven by a drive mechanism different from the drive mechanism of the placing head 204. It is configured in such a manner that the suction position recognition camera 215 as above takes images of the components 206 in the component supply portion 205 at predetermined timing before the components 206 in the component supply portion 205 are sucked by the placing head 204 so as to specify exact positions of the components 206.

Also, the position recognition mark M same as the one in the first embodiment above (see FIG. 1) is put on the side edge portion of the component supply portion 5.

According to the component testing apparatus 200 configured as above, under the control by an unillustrated control unit that systematically controls operations of the respective portions, both the inspection socket camera 214 and the suction position recognition camera 215 are moved above the position recognition mark M to take images thereof at predetermined timing, such as the start-up of the component testing apparatus 200 and when the number of inspected components 206 has reached a predetermined number, and a displacement between the coordinate systems of the placing head 204 and the suction position recognition camera 215 is checked on the basis of the imaging data. It is also configured in such a manner that an amount of movement when the placing head 204 accesses the components 206 in the component supply portion 205 is corrected on the basis of the correlation of the respective coordinate systems in this manner. Because a concrete content of the processing described above is the same as that in the first embodiment above, detailed descriptions are omitted herein.

As has been described above, the component testing apparatus 200 of the seventh embodiment is configured in such a manner that components 206 supplied from the component supply portion 205 are sucked and transported by the movable placing head 204 and attached to the inspection sockets 210 spaced apart by a predetermined distance and includes, as a component element, the suction position recognition camera 215 that is movable independently of the placing head 204 and takes images of the components 206 before the placing head 204 sucks the components 206 from the component supply portion 205. It is configured in such a manner that, under the control of the control unit that controls operations of the respective portions, such as the placing head 204 and the suction position recognition camera 215, the correlation of the respective coordinate systems of the placing head 204 and the suction position recognition camera 215 is checked at the predetermined timing and an amount of movement when the placing head 204 accesses the components 206 in the component supply portion 205 is corrected on the basis of this correlation. When configured in this manner, there is an advantage that the occurrence of a suction error of the components 206 can be prevented effectively by appropriately adjusting a displacement between the respective coordinate systems of the placing head 204 and the suction position recognition camera 215 while efficiently performing the suction position recognition by the suction position recognition camera 215 that is movable independently of the placing head 204.

More specifically, according to the configuration above, images of components 206 to be sucked by the placing head 204 from the component supply portion 205 are taken by the suction position recognition camera 215 that is movable independently of the placing head 204. It thus becomes possible to perform an operation to take images of the components 206 (components to be sucked) and to recognize the positions thereof efficiently while the components 206 sucked earlier are transported to the inspection sockets 210 and the conforming and inferior trays 211 and 212 by the placing head 204. The inspection efficiency of the components 206 can be therefore enhanced effectively by making the takt time shorter.

Moreover, it is configured in such a manner that the correlation of the respective coordinate systems of the placing head 204 and the suction position recognition camera 215 is checked at the predetermined timing and an amount of movement when the placing head 204 accesses the components 206 in the component supply portion 205 is corrected on the basis of this correlation. Hence, even in a case where there is a mutual displacement between the respective coordinate systems of the placing head 204 and the suction recognition camera 215, it becomes possible to understand the relative positions of the components 206 with respect to the placing head 204 precisely and thereby to move the placing head 204 exactly to the position of the components 206. The placing head 204 is thus enabled to perform an operation to suck the components 206 appropriately in a reliable manner. Hence, there is an advantage that the occurrence of a suction error of the components 206 can be prevented effectively by appropriately adjusting a displacement between the respective coordinate systems of the placing head 204 and the suction position recognition camera 215 while efficiently performing the suction position recognition using the suction position recognition camera 215 that is independent of the placing head 204.

The seventh embodiment described a case where the component supply portion 205 is a tray feeder that supplies a plurality of components 206 in a state where they are placed on the tray 208. It should be appreciated, however, that the configuration of the invention can be suitably applied to a case where the component supply portion 205 is a wafer feeder as in the first through sixth embodiments above.

Also, the first through seventh embodiments above described a case where the configuration of the invention is applied to the component mounting apparatus 1, 71, and the like and the component testing apparatus 200 as one type of component placing apparatus. It should be appreciated, however, that the configuration of the present invention is further applicable to other types of component placing apparatus. Examples of other types of the component placing apparatus include but not limited to a component sorting apparatus that transfers a component supplied from the component supply portion formed of a tray feeder or the like onto a different tray by sucking and transporting the component using the placing head.

In the last place, features and advantages of the invention disclosed based on the above embodiments will be summarized as follows.

The invention provides a component placing apparatus configured to transport a component, supplied from a component supply portion, by sucking the component using a movable placing head and to place the component onto a placement portion spaced apart by a predetermined distance, characterized by including: a suction position imaging device provided to be movable independently of the placing head for taking an image of the component before the placing head sucks the component from the component supply portion; and a controller for systematically controlling operations of the placing head and the suction position imaging device and for moving the placing head to a position of the component during the component suction on the basis of imaging data of the component obtained in advance through imaging by the suction position imaging device, wherein the controller checks a correlation of respective coordinate systems of the placing head and the suction position imaging device at predetermined timing and corrects an amount of movement when the placing head accesses the component in the component supply portion on the basis of the correlation.

According to the invention, by providing the suction position imaging device that is movable independently of the placing head and sucks and transports a component, it becomes possible to efficiently perform an operation to recognize the position of a component in the component supply portion by taking an image thereof while a component sucked earlier is being transported to the placement portion. The efficiency of a component placing work can be therefore enhanced effectively by shortening a takt time. Moreover, it is configured in such a manner that a correlation of the respective coordinate systems of the placing head and the suction position imaging device is checked at predetermined timing and an amount of movement when the placing head accesses the component in the component supply portion is corrected on the basis of this correlation. Accordingly, even in a case where there is a mutual displacement between the respective coordinate systems of the placing head and the suction position imaging device, it is possible to move the placing head exactly to the position of the component to be sucked. Hence, the occurrence of a suction error of the component can be effectively prevented by appropriately adjusting a displacement between the coordinate systems as above.

In a case where the component placing apparatus of the invention includes head-side imaging device attached to the placing head and moving integrally with the placing head, it is preferable that the controller moves the suction position imaging device and the head-side imaging device above a common position recognition mark put on the component supply portion or on a periphery thereof and takes images of the mark at predetermined timing, and corrects the amount of movement when the placing head accesses the component in the component supply portion on the basis of a displacement between the respective coordinate systems of the placing head and the suction position imaging device specified by a difference between the images of two types.

According to this configuration, there is an advantage that a displacement between the respective coordinate systems of the placing head and the suction position imaging device can be adjusted appropriately by checking the displacement efficiently with a configuration as simple as taking images of the common position recognition mark put on the component supply portion or the like using the suction position imaging device and the head-side imaging device.

In a case where the position recognition mark is provided in a plural form and the position recognition marks are put on points spaced apart from each other, it is preferable that the controller checks displacements between the respective coordinate systems of the placing head and the suction position imaging device in reference to the plurality of position recognition marks and corrects the amount of movement when the placing head accesses the component in the component supply portion on the basis of a plurality of items of coordinate displacement data.

In a case where an amount of movement of the placing head is corrected on the basis of a plurality of items of coordinate displacement data found in reference to a plurality of position recognition marks, there is an advantage that the placing head is enabled to perform an operation to suck components more precisely.

In the invention, it is also preferable that the controller checks variances of the respective coordinate systems of the placing head and the suction position imaging device at predetermined timing at which it is anticipated that the coordinate systems have varied by a predetermined amount because of thermal influences of drive mechanisms respectively driving the placing head and the suction position imaging device, and corrects the amount of movement when the placing head accesses the component in the component supply portion on the basis of a correlation of the respective coordinate systems after the variances.

According to this configuration, even in a case where the respective coordinate systems of the placing head and the suction position imaging device vary because of thermal influences and undergo mutual displacement, it is possible to move the placing head exactly to the position of the component to be sucked. Hence, the occurrence of a suction error of the component can be effectively prevented by appropriately adjusting a displacement between the coordinate systems caused by the variances because of thermal influences as described above.

With the configurations described above, in a case where the component placing apparatus includes head-side imaging device attached to the placing head and moving integrally with the placing head, it is preferable that the controller moves the suction position imaging device and the head-side imaging device above a common position recognition mark put on the component supply portion or on a periphery thereof at predetermined timing at which it is anticipated that the respective coordinate systems of the placing head and the suction position imaging device have varied by a predetermined amount because of the thermal influences, and checks variances of the coordinate systems of the placing head and the suction position imaging device on the basis of imaging data of the position recognition mark obtained through imaging by the respective imaging device.

According to this configuration, there is an advantage that variances of the respective coordinate systems of the placing head and the suction position imaging device due to thermal influences can be checked efficiently with a configuration as simple as taking images of the common position recognition mark put on the component supply portion or the like by the suction position imaging device and the head-side imaging device.

Further, it is preferable that the controller calculates parameters relating to the variances of the respective coordinate systems of the placing head and the suction position imaging device and coverts a component coordinate recognized by the suction position imaging device to a component coordinate on the basis of the coordinate system of the placing head after the variances through coordinate conversion using the parameters, so that the converted component coordinate is set again as a target point when the placing head accesses the component in the component supply portion.

According to this configuration, it becomes possible to exactly specify the position of the component with respect to be sucked to the placing head through coordinate conversion using parameters relating to variances of the respective coordinate systems of the placing head and the suction position imaging device. Hence, there is an advantage that suction accuracy of components by the placing head can be enhanced more effectively.

With the configurations described above, in a case where the component placing apparatus includes a temperature sensor that detects a temperature of the driving mechanisms driving the placing head and the suction position imaging device, it is preferable that the controller checks variances of the respective coordinate systems of the placing head and the suction position imaging device in a case where a range of rise of a detection temperature in the temperature sensor has reached a predetermined value.

According to this configuration, it becomes possible to appropriately detect variances of the respective coordinate systems of the placing head and the suction position imaging device because of thermal influences on the basis temperatures of the corresponding drive mechanisms. Hence, there is an advantage that the processing to check variances of the respective coordinate systems can be performed appropriately according to the detection result.

It should be noted that the configurations of the invention are particularly suitable to a case where the component supply portion is a wafer feeder that supplies a plurality of chip-like components cut out from a wafer in a state where the components are held by a wafer holding device.

More specifically, in a case where the component supply portion is a wafer feeder, high suction accuracy is required to extract a desired chip component among a plurality of closely-spaced chip-like components. Hence, the configurations of the invention to suck a component in consideration of a displacement between the respective coordinate systems of the placing head and the suction position imaging device is particularly useful under the circumstances where high suction accuracy is required as above.

Also, with the invention, in a case where the component supply portion is a wafer feeder that supplies a plurality of chip-like components cut out from a wafer in a state where the components are held by a wafer holding device and a movable push-up device for pushing up the component to be sucked by the placing head from below is provided below the component supply portion, it is preferable that the controller includes a main control portion that controls driving of three elements including the suction position imaging device, the placing head, the push-up device during the component suction by moving each of the placing head and the push-up device to the position of the component detected on the basis of imaging by the suction position imaging device so that the component is sucked by the placing head while the component is being pushed up by the push-up device, and a correction data generation portion that generates data to correct control by the main control portion, so that the correction data generation portion finds a correlation of the coordinate systems of the placing head, the push-up device, and the suction position imaging device by checking relative positions of the three elements while moving the three elements and generates data indicating the correlation and the main control portion corrects amounts of movement when the placing head and the push-up device are moved to the position of the component, detected on the basis of the imaging by the suction position imaging device, on the basis of the data generated by the correction data generation portion.

According to this configuration, when a component is extracted from the component supply portion, the position of a component to be sucked is confirmed first by taking an image thereof by the suction position imaging device and then the placing head and the push-up device are moved to the position of component. It thus becomes possible to perform an operation to push up a component by the push-up device and an operation to suck a component by the placing head precisely.

In particular, data indicating correlations among the coordinate systems of the three elements, including the placing head, the push-up device, and the suction position imaging device, is generated in advance by the correction data generation portion and amounts of movement of the respective elements when the placing head and the push-up device are moved to the position of the component during the component extraction are corrected by the main control portion on the basis of the data. Hence, even when there are displacements among the coordinate systems of the three elements, it is possible to move the placing head and the push-up device correctly to the position of the component detected on the basis of the imaging by the suction position imaging device. Hence, the occurrence of a suction error of components can be prevented effectively.

With the configurations described above, in a case where the component placing apparatus includes head-side imaging device attached to the placing head and moving integrally with the placing head, it is preferable that the correction data generation portion finds at least second and third correlation data among first correlation data indicating a correlation of the coordinate systems of the placing head and the push-up device, the second correlation data indicating a correlation of the coordinate systems of the suction position imaging device and the push-up device, and the third correlation data indicating a correlation of the coordinate systems of the placing head and the suction position imaging device on the basis of at least two processing operations among processing to take images of a specific point of the push-up device using the head-side imaging device at a plurality of predetermined positions in the component supply portion, processing to take images of the specific point of the push-up device using the suction position imaging device at a plurality of predetermined positions in the component supply portion, and processing to take images of a plurality of fixed points in the component supply portion using both the head-side imaging device and the suction position imaging device, and that the main control portion corrects the amount of movement of the placing head on the basis of the third correlation data and corrects an amount of movement of the push-up device on the basis of the second correlation data when the placing head and the push-up device are moved to the position of the component detected on the basis of the imaging by the suction position imaging device.

According to this configuration, the head-side imaging device attached to the placing head and moving integrally with the placing head and the suction position imaging device provided to be movable independently of the placing head are employed, and data indicating correlations among the coordinate systems of the three elements, including the placing head, the push-up device, and the suction position imaging device, can be generated on the basis of imaging of a specific point of the push-up device at a plurality of predetermined positions in the component supply portion and imaging of a plurality of fixed points in the component supply portion by one or both of the imaging device employed. It thus becomes possible to correct amounts of movement of the placing head and the push-up device appropriately on the basis of the data.

With the configurations described above, it is preferable that the correction data generation portion takes images of the specific point of the push-up device at a plurality of predetermined positions in the component supply portion using the head-side imaging device to find the first correlation data on the basis of a relation of an imaging position by the head-side imaging device and a position of the specific point on the basis of the coordinate system of the push-up device, and takes images of the specific point of the push-up device at a plurality of predetermined positions in the component supply portion using the suction position imaging device to find the second correlation data on the basis of a relation of an imaging position by the suction position imaging device and a position of the specific point on the basis of the coordinate system of the push-up device, and further finds the third correlation date through an operation using the first and second correlation data.

Alternatively, it is preferable that the correction data generation portion takes images of the specific point of the push-up device at a plurality of predetermined positions in the component supply portion using the head-side imaging device to find the first correlation data on the basis of a relation of an imaging position by the head-side imaging device and a position of the specific point on the basis of the coordinate system of the push-up device, and takes images of marks put on a plurality of fixed points in the component supply portion using both the head-side imaging device and the suction position imaging device to find the third correlation on the basis of a relation of an imaging result by the head-side imaging device and an imaging result by the suction position imaging device, and further finds the second correlation data through an operation using the first and third correlation data.

Further, it is preferable that the correction data generation portion takes images of the specific point of the push-up device at a plurality of predetermined positions in the component supply portion using the suction position imaging device to find the second correlation data on the basis of a relation of an imaging position by the suction position imaging device and a position of the specific point on the basis of the coordinate system of the push-up device, and takes images of marks put on a plurality of fixed points in the component supply portion using both the head-side imaging device and the suction position imaging device to find the third correlation data on the basis of a relation of an imaging result by the head-side imaging device and an imaging result by the suction position imaging device.

Furthermore, it is preferable that the correction data generation portion performs processing to take images of the specific point of the push-up device in a state where the push-up device is positioned at a predetermined position in the component supply portion using each of the head-side imaging device and the suction position imaging device at a plurality of predetermined positions in the component supply portion, finds the second correlation data on the basis of a relation of an imaging position by the suction position imaging device and a position of the specific point on the basis of the coordinate system of the push-up device, and finds the third correlation data on the basis of a relation of an imaging result by the head-side imaging device and an imaging result by the suction position imaging device.

The correction data generation portion having any one of the configurations described above is able to appropriately obtain data necessary to correct amounts of movement of the placing head and the push-up device during component extraction.

Also, the configurations of the invention are suitably applied to a case where the component placing apparatus is a component mounting apparatus that transports a component supplied from the component supply portion and mounts the component on a substrate using the placing head or in a case where the component placing apparatus is a component testing apparatus that transports a component supplied from the component supply portion and attaches the component to an inspection socket for examination using the placing head.

The invention claimed is:

1. A component placing apparatus configured to transport a component, supplied from a component supply portion, by sucking the component using a movable placing head and to place the component onto a placement portion spaced apart by a predetermined distance, characterized by comprising:
   a suction position imaging device provided to be movable independently of the placing head for taking an image of the component before the placing head sucks the component from the component supply portion; and
   a controller for systematically controlling operations of the placing head and the suction position imaging device and for moving the placing head to a position of the component during the component suction on the basis of imaging data of the component obtained in advance through imaging by the suction position imaging device,
   wherein the controller checks a correlation of respective coordinate systems of the placing head and the suction position imaging device at predetermined timing and corrects an amount of movement when the placing head accesses the component in the component supply portion on the basis of the correlation; and
   the component placing apparatus is a component mounting apparatus that transports a component supplied from the component supply portion and mounts the component on a substrate using the placing head.

2. The component placing apparatus according to claim 1, further comprising:
   a head-side imaging device attached to the placing head and moving integrally with the placing head,
   wherein the controller moves the suction position imaging device and the head-side imaging device above a common position recognition mark put on the component supply portion or on a periphery thereof and takes images of the mark at predetermined timing, and corrects the amount of movement when the placing head accesses the component in the component supply portion on the basis of a displacement between the respective coordinate systems of the placing head and the suction position imaging device specified by a difference between the images of two types.

3. The component placing apparatus according to claim 2, wherein:
   the position recognition mark is provided in a plural form and the position recognition marks are put on points spaced apart from each other; and
   the controller checks displacements between the respective coordinate systems of the placing head and the suction position imaging device in reference to the plurality of position recognition marks and corrects the amount of movement when the placing head accesses the component in the component supply portion on the basis of a plurality of items of coordinate displacement data.

4. The component placing apparatus according to claim 1, wherein:
   the controller checks variances of the respective coordinate systems of the placing head and the suction position imaging device at predetermined timing at which it is anticipated that the coordinate systems have varied by a predetermined amount because of thermal influences of drive mechanisms respectively driving the placing head and the suction position imaging device, and corrects the amount of movement when the placing head accesses the component in the component supply portion on the basis of a correlation of the respective coordinate systems after the variances.

5. The component placing apparatus according to claim 4, further comprising:
   a head-side imaging device attached to the placing head and moving integrally with the placing head,
   wherein the controller moves the suction position imaging device and the head-side imaging device above a common position recognition mark put on the component supply portion or on a periphery thereof at predetermined timing at which it is anticipated that the respective coordinate systems of the placing head and the suction position imaging device have varied by a predetermined amount because of the thermal influences, and checks variances of the coordinate systems of the placing head and the suction position imaging device on the basis of imaging data of the position recognition mark obtained through imaging by the respective imaging device.

6. The component placing apparatus according to claim 4, wherein:
   the controller calculates parameters relating to the variances of the respective coordinate systems of the placing head and the suction position imaging device and coverts a component coordinate recognized by the suction position imaging device to a component coordinate on the basis of the coordinate system of the placing head after the variances through coordinate conversion using the parameters, so that the converted component coordinate is set again as a target point when the placing head accesses the component in the component supply portion.

7. The component placing apparatus according to claim 4, further comprising:
   a temperature sensor that detects a temperature of the driving mechanisms driving the placing head and the suction position imaging device,
   wherein the controller checks variances of the respective coordinate systems of the placing head and the suction position imaging device in a case where a range of rise of a detection temperature in the temperature sensor has reached a predetermined value.

8. The component placing apparatus according to claim 1, wherein:
   the component supply portion is a wafer feeder that supplies a plurality of chip-like components cut out from a wafer in a state where the components are held by a wafer holding device.

9. The component placing apparatus according to claim 1, wherein:
the component supply portion is a wafer feeder that supplies a plurality of chip-like components cut out from a wafer in a state where the components are held by a wafer holding device;
a movable push-up device for pushing up the component to be sucked by the placing head from below is provided below the component supply portion;
the controller includes
a main control portion that controls driving of three elements including the suction position imaging device, the placing head, and the push-up device during the component suction by moving each of the placing head and the push-up device to the position of the component detected on the basis of imaging by the suction position imaging device so that the component is sucked by the placing head while the component is being pushed up by the push-up device, and
a correction data generation portion that generates data to correct control by the main control portion;
the correction data generation portion finds a correlation of the coordinate systems of the placing head, the push-up device, and the suction position imaging device by checking relative positions of the three elements while moving the three elements and generates data indicating the correlation; and
the main control portion corrects amounts of movement when the placing head and the push-up device are moved to the position of the component, detected on the basis of the imaging by the suction position imaging device, on the basis of the data generated by the correction data generation portion.

10. The component placing apparatus according to claim 9, further comprising:
head-side imaging device attached to the placing head and moving integrally with the placing head, wherein:
the correction data generation portion finds at least second and third correlation data among first correlation data indicating a correlation of the coordinate systems of the placing head and the push-up device, the second correlation data indicating a correlation of the coordinate systems of the suction position imaging device and the push-up device, and the third correlation data indicating a correlation of the coordinate systems of the placing head and the suction position imaging device on the basis of at least two processing operations among processing to take images of a specific point of the push-up device using the head-side imaging device at a plurality of predetermined positions in the component supply portion, processing to take images of the specific point of the push-up device using the suction position imaging device at a plurality of predetermined positions in the component supply portion, and processing to take images of a plurality of fixed points in the component supply portion using both the head-side imaging device and the suction position imaging device; and
the main control portion corrects the amount of movement of the placing head on the basis of the third correlation data and corrects an amount of movement of the push-up device on the basis of the second correlation data when the placing head and the push-up device are moved to the position of the component detected on the basis of the imaging by the suction position imaging device.

11. The component placing apparatus according to claim 10, wherein:
the correction data generation portion takes images of the specific point of the push-up device at a plurality of predetermined positions in the component supply portion using the head-side imaging device to find the first correlation data on the basis of a relation of an imaging position by the head-side imaging device and a position of the specific point on the basis of the coordinate system of the push-up device, and takes images of the specific point of the push-up device at a plurality of predetermined positions in the component supply portion using the suction position imaging device to find the second correlation data on the basis of a relation of an imaging position by the suction position imaging device and a position of the specific point on the basis of the coordinate system of the push-up device, and further finds the third correlation date through an operation using the first and second correlation data.

12. The component placing apparatus according to claim 10, wherein:
the correction data generation portion takes images of the specific point of the push-up device at a plurality of predetermined positions in the component supply portion using the head-side imaging device to find the first correlation data on the basis of a relation of an imaging position by the head-side imaging device and a position of the specific point on the basis of the coordinate system of the push-up device, and takes images of marks put on a plurality of fixed points in the component supply portion using both the head-side imaging device and the suction position imaging device to find the third correlation on the basis of a relation of an imaging result by the head-side imaging device and an imaging result by the suction position imaging device, and further finds the second correlation data through an operation using the first and third correlation data.

13. The component placing apparatus according to claim 10, wherein:
the correction data generation portion takes images of the specific point of the push-up device at a plurality of predetermined positions in the component supply portion using the suction position imaging device to find the second correlation data on the basis of a relation of an imaging position by the suction position imaging device and a position of the specific point on the basis of the coordinate system of the push-up device, and takes images of marks put on a plurality of fixed points in the component supply portion using both the head-side imaging device and the suction position imaging device to find the third correlation data on the basis of a relation of an imaging result by the head-side imaging device and an imaging result by the suction position imaging device.

14. The component placing apparatus according to claim 10, wherein:
the correction data generation portion performs processing to take images of the specific point of the push-up device in a state where the push-up device is positioned at a predetermined position in the component supply portion using each of the head-side imaging device and the suction position imaging device at a plurality of predetermined positions in the component supply portion, finds the second correlation data on the basis of a relation of an imaging position by the suction position imaging device and a position of the specific point on the basis of the coordinate system of the push-up device, and finds the third correlation data on the basis of a relation of an imaging result by the head-side imaging device and an imaging result by the suction position imaging device.

15. A component placing apparatus configured to transport a component, supplied from a component supply portion, by sucking the component using a movable placing head and to place the component onto a placement portion spaced apart by a predetermined distance, characterized by comprising:

a suction position imaging device provided to be movable independently of the placing head for taking an image of the component before the placing head sucks the component from the component supply portion; and a controller for systematically controlling operations of the placing head and the suction position imaging device and for moving the placing head to a position of the component during the component suction on the basis of imaging data of the component obtained in advance through imaging by the suction position imaging device, wherein the controller checks a correlation of respective coordinate systems of the placing head and the suction position imaging device at predetermined timing and corrects an amount of movement when the placing head accesses the component in the component supply portion on the basis of the correlation; and the component placing apparatus is a component testing apparatus that transports a component supplied from the component supply portion and attaches the component to an inspection socket for examination using the placing head.

* * * * *